(12) United States Patent
Takeuchi

(10) Patent No.: US 7,411,819 B2
(45) Date of Patent: Aug. 12, 2008

(54) SEMICONDUCTOR INTEGRATED CIRCUIT DEVICE

(75) Inventor: Ken Takeuchi, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/533,638

(22) Filed: Sep. 20, 2006

(65) Prior Publication Data

US 2007/0064482 A1    Mar. 22, 2007

(30) Foreign Application Priority Data

Sep. 22, 2005   (JP) .................... 2005-276570

(51) Int. Cl.
*G11C 11/34*    (2006.01)
(52) U.S. Cl. .................. 365/185.03; 365/185.17
(58) Field of Classification Search ............ 365/185.17, 365/230.03, 185.03
See application file for complete search history.

(56) References Cited

U.S. PATENT DOCUMENTS

| | | | |
|---|---|---|---|
| 6,373,746 B1 | 4/2002 | Takeuchi et al. | |
| 6,490,219 B2 | 12/2002 | Yoneya et al. | |
| 6,862,213 B2* | 3/2005 | Hamaguchi | 365/158 |
| 7,057,922 B2* | 6/2006 | Fukumoto | 365/158 |
| 2002/0114207 A1 | 8/2002 | Takeuchi et al. | |
| 2004/0114429 A1* | 6/2004 | Ehiro et al. | 365/158 |
| 2004/0130938 A1* | 7/2004 | Hamaguchi | 365/158 |
| 2004/0193864 A1* | 9/2004 | Tsai et al. | 713/1 |
| 2004/0218420 A1* | 11/2004 | Aakjer | 365/185.02 |
| 2004/0264244 A1* | 12/2004 | Morimoto | 365/180 |
| 2005/0122768 A1* | 6/2005 | Fukumoto | 365/158 |
| 2005/0207220 A1* | 9/2005 | Takeuchi | 365/185.03 |

* cited by examiner

*Primary Examiner*—Michael T Tran
(74) *Attorney, Agent, or Firm*—Oblon, Spivak, McClelland, Maier & Neustadt, P.C.

(57) ABSTRACT

A semiconductor integrated circuit device has a first memory cell group including a plurality of rewritable nonvolatile memory cells arranged on a semiconductor chip and a second memory cell group including a plurality of rewritable nonvolatile memory cells arranged on the semiconductor chip. Setting of the write threshold voltage of the memory cell of the first memory cell group and setting of the write threshold voltage of the memory cell of the second memory cell group are variable.

27 Claims, 39 Drawing Sheets

Setting example 4

Cross section in row direction (memory cell)

Cross section in row direction (selection transistor)

Before writing for odd-numbered bit line

After writing for odd-numbered bit line

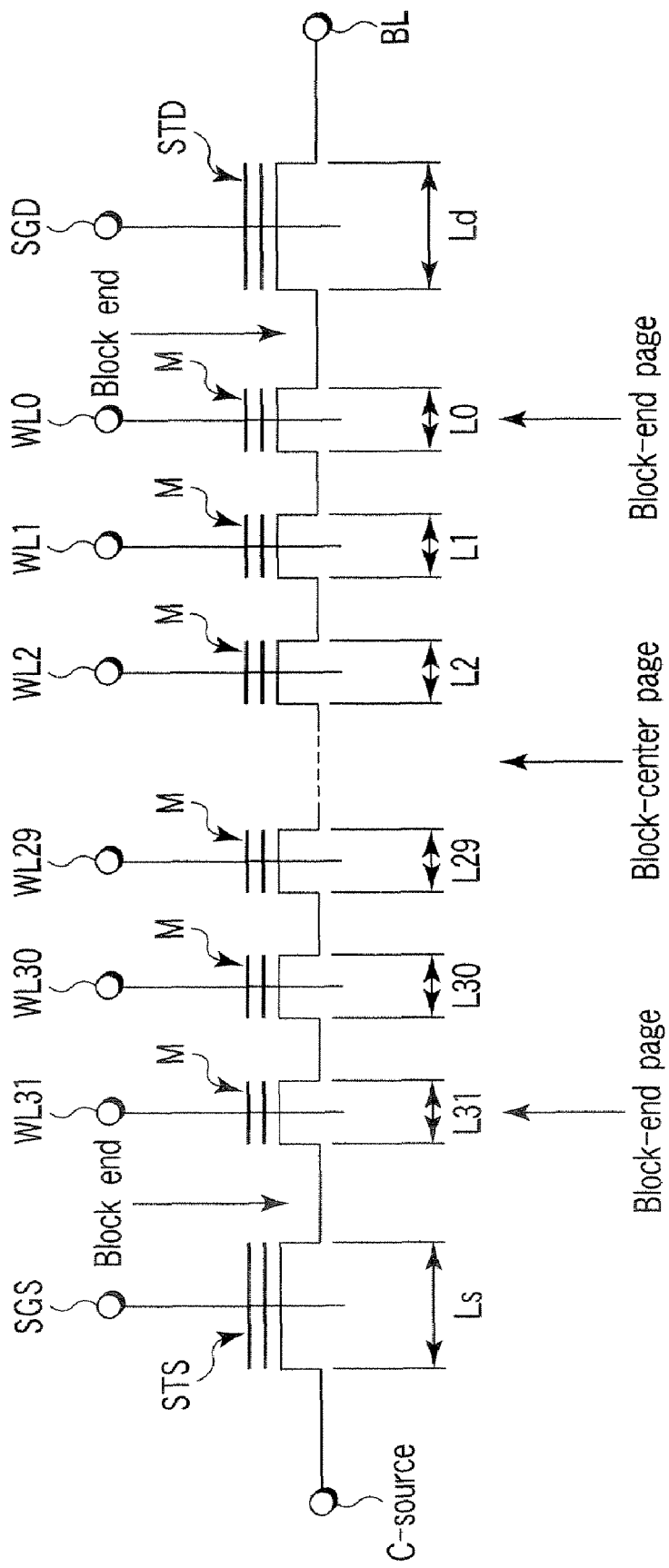
F I G. 21

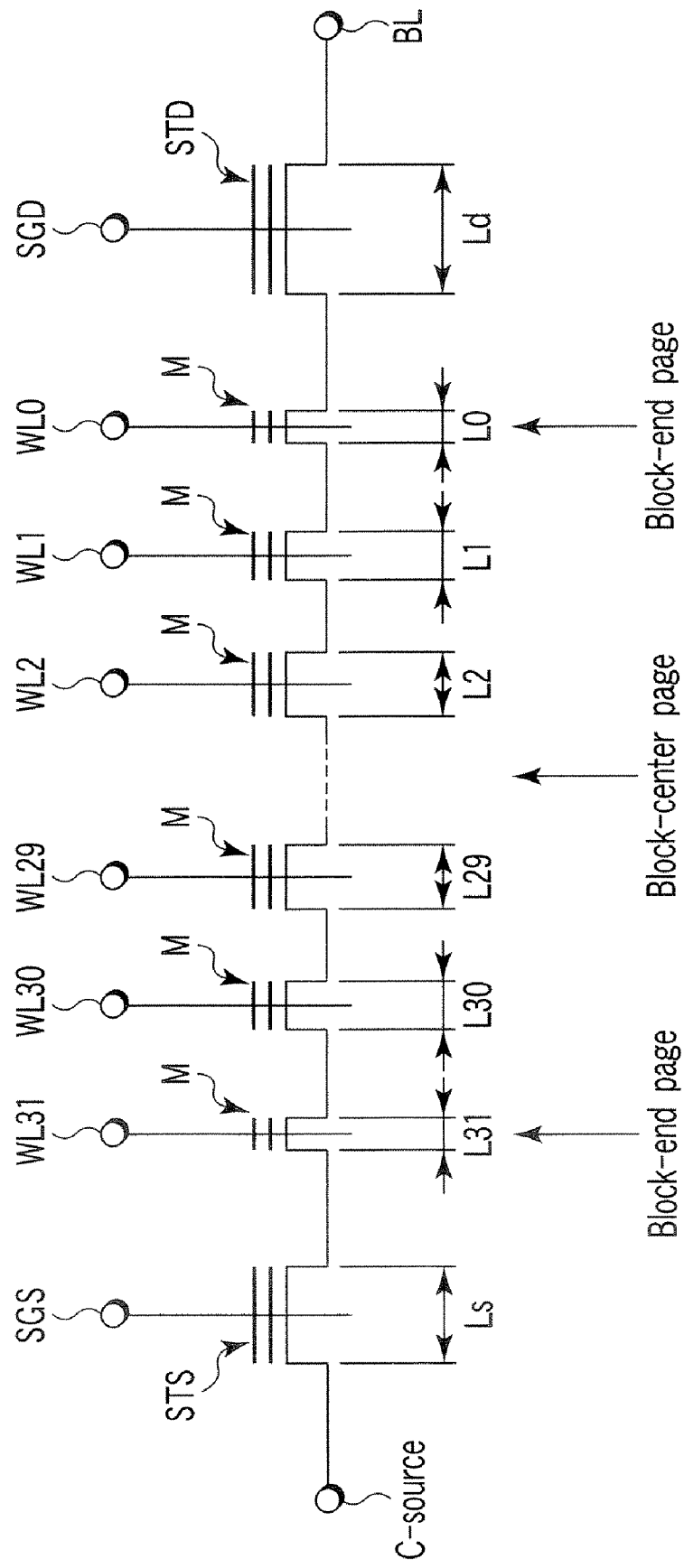
F I G. 24

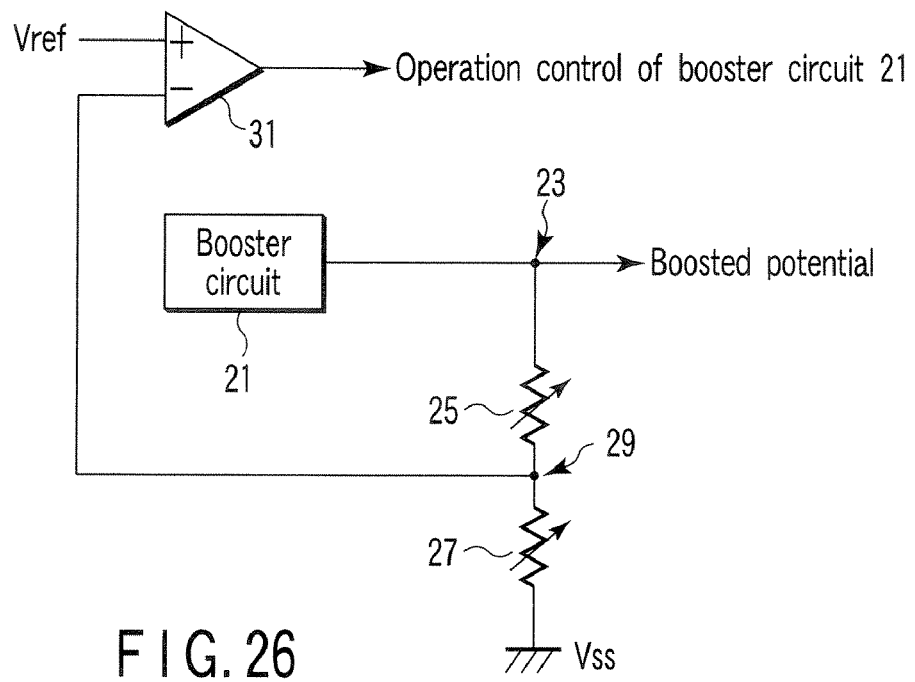
F I G. 26
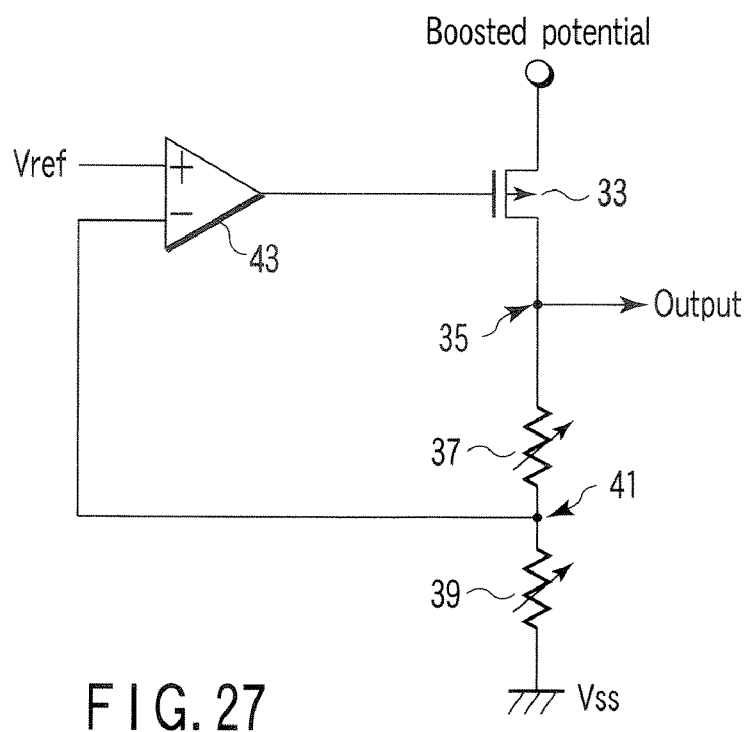
F I G. 27

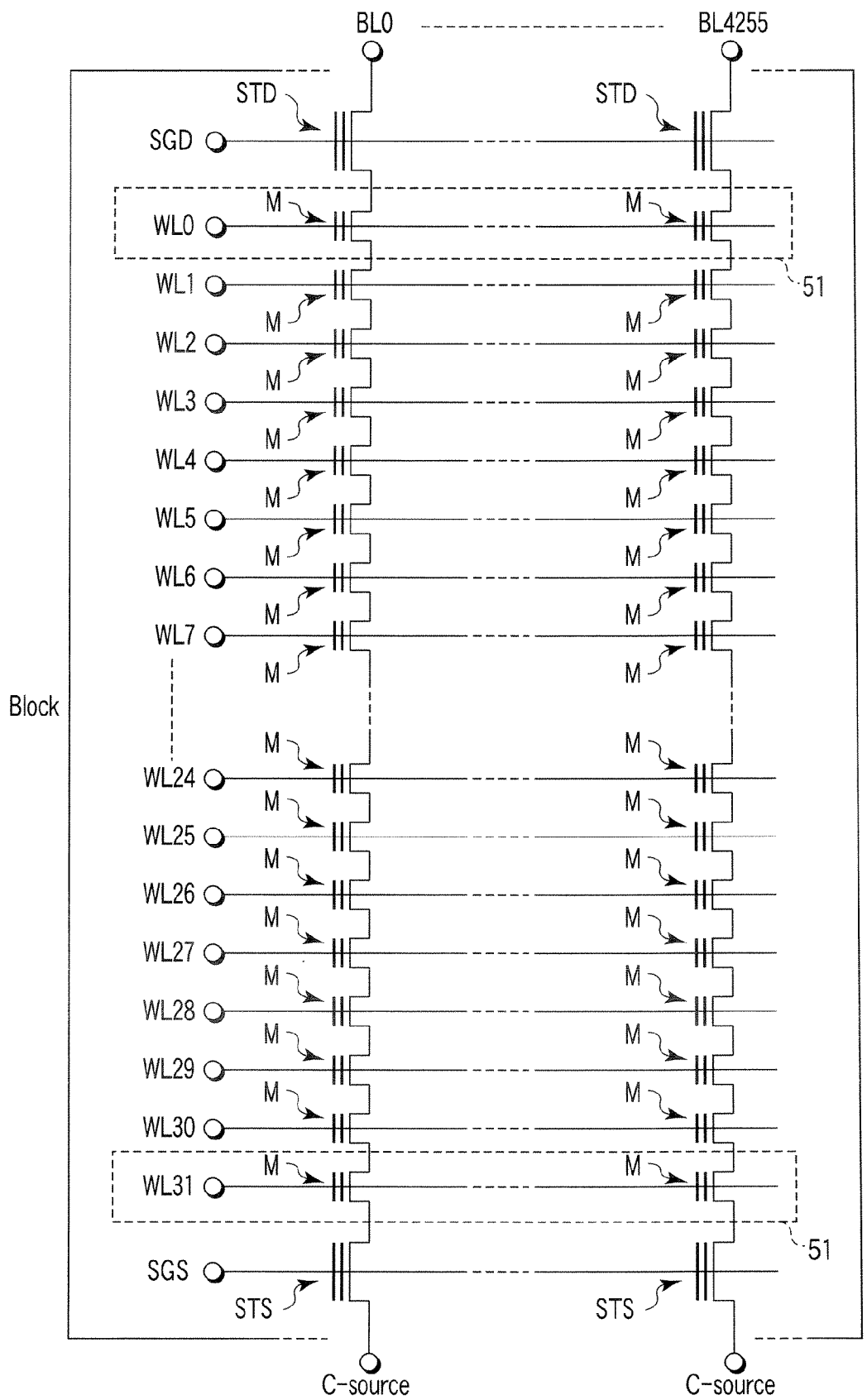
F I G. 30

FIG. 31  First modification

FIG. 32  Second modification

FIG. 33  Third modification

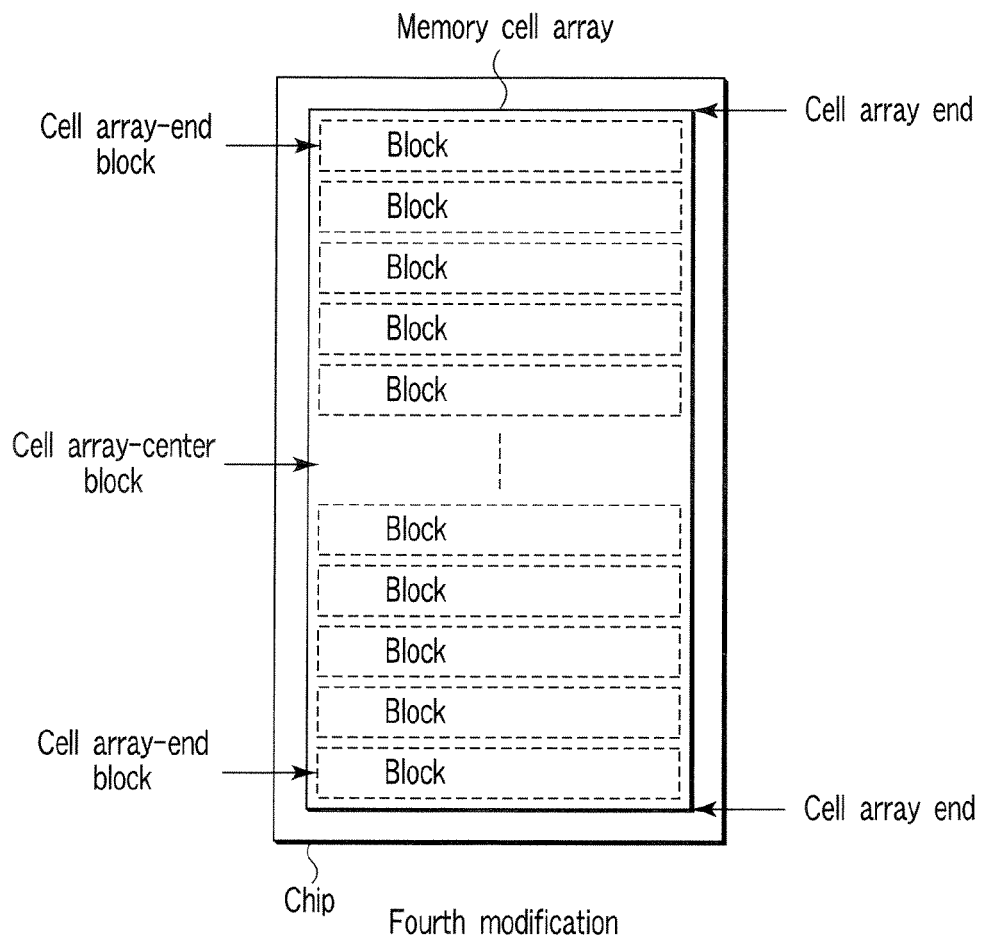
F I G. 34
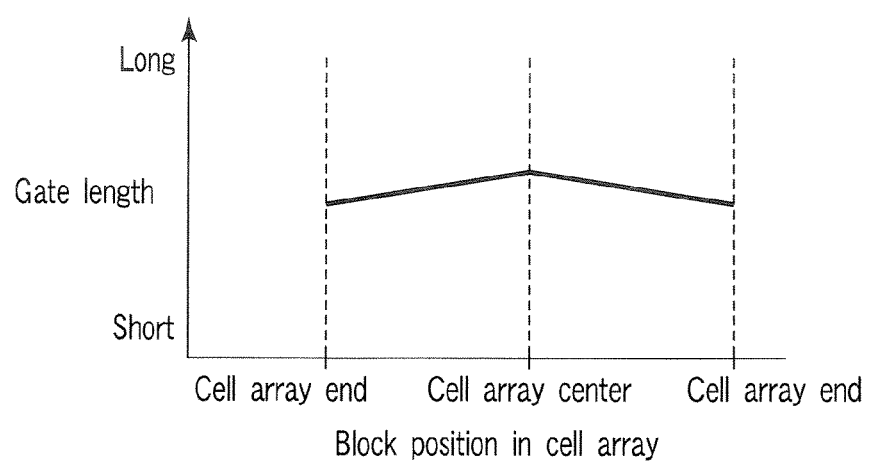
F I G. 35

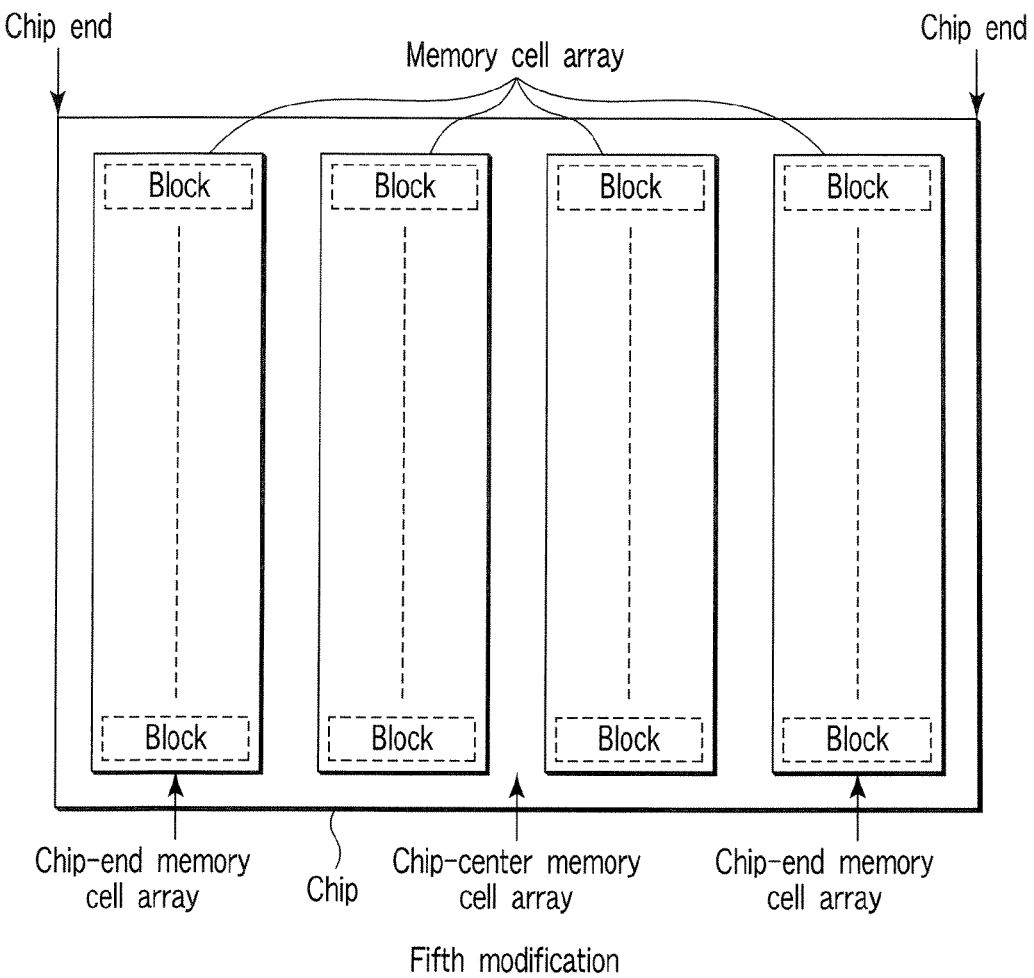
FIG. 36
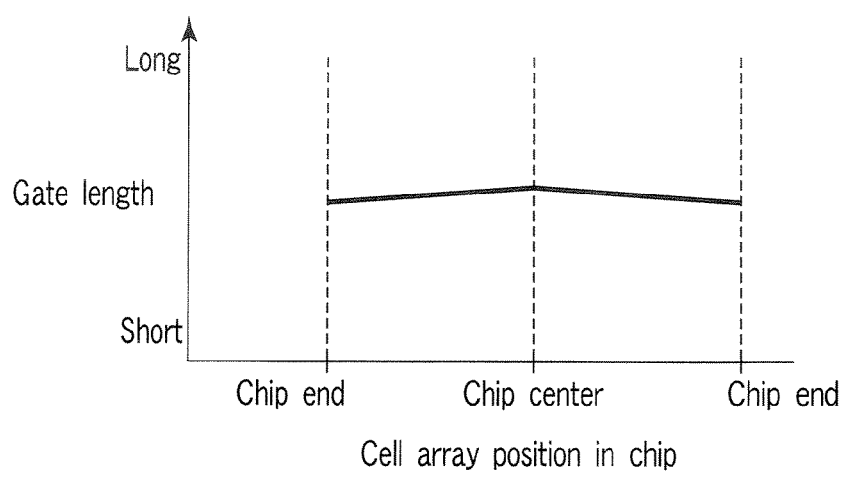
FIG. 37  Fifth modification

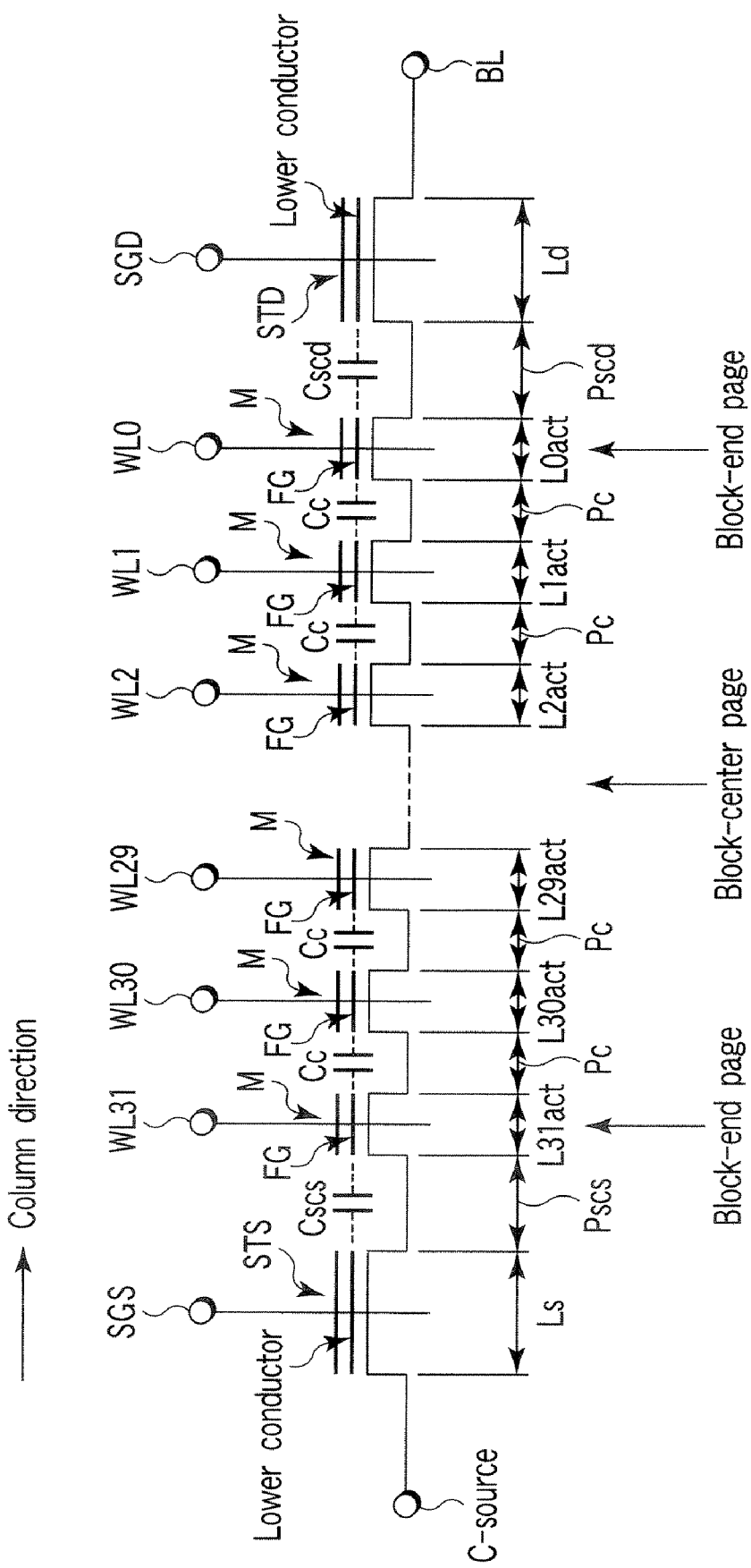
F I G. 38

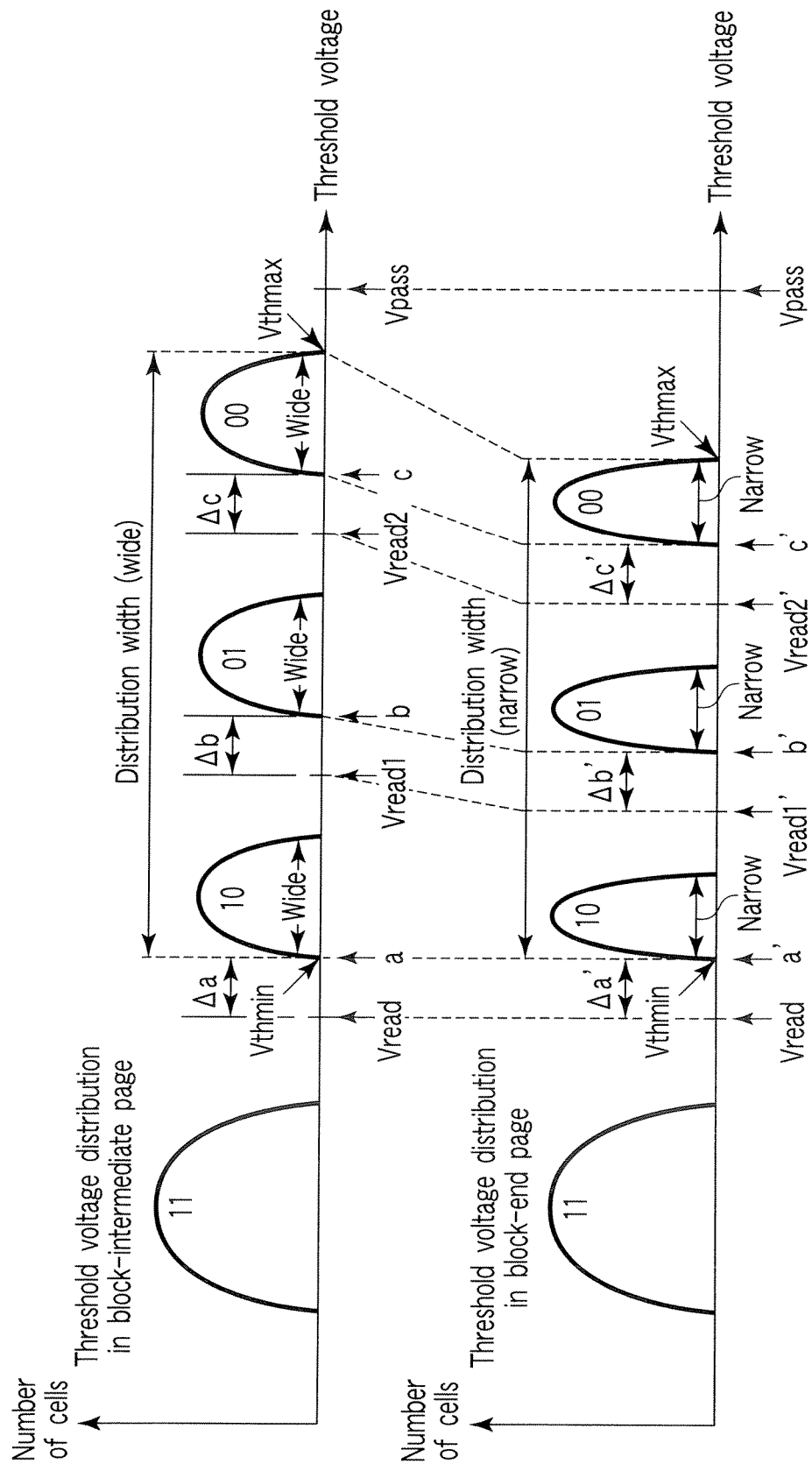
F I G. 43

SEMICONDUCTOR INTEGRATED CIRCUIT DEVICE

CROSS-REFERENCE TO RELATED APPLICATIONS

This application is based upon and claims the benefit of priority from prior Japanese Patent Application No. 2005-276570, filed Sep. 22, 2005, the entire contents of which are incorporated herein by reference.

BACKGROUND OF THE INVENTION

1. Field of the Invention

This invention relates to a semiconductor integrated circuit device and more particularly to a semiconductor integrated circuit device having an electrically rewritable nonvolatile semiconductor memory device.

2. Description of the Related Art

In an electrically rewritable nonvolatile semiconductor memory device, for example, in a multi-level flash memory, the distribution width (Vthmin–Vthmax) of a write threshold voltage is large. Therefore, there occurs a problem that the data holding characteristic is bad in the write threshold voltage in a state in which the highest threshold voltage is set.

Reference Document: U.S. Pat. No. 6,643,188

BRIEF SUMMARY OF THE INVENTION

According to one aspect of this invention, a semiconductor integrated circuit device comprises a semiconductor chip, a first memory cell group containing a plurality of rewritable nonvolatile memory cells arranged on the chip, and a second memory cell group containing a plurality of rewritable nonvolatile memory cells arranged on the chip, wherein setting of the write threshold voltage of the memory cells of the first memory cell group and setting of the write threshold voltage of the memory cells of the second memory cell group are made variable.

BRIEF DESCRIPTION OF THE SEVERAL VIEWS OF THE DRAWING

FIG. 21 is an equivalent circuit diagram showing one example of a NAND memory unit of the semiconductor integrated circuit device according to the first embodiment;

FIG. 24 is an equivalent circuit diagram showing one example of an actual equivalent circuit of the NAND memory unit;

FIG. 26 is a circuit diagram showing a first example of a voltage variable circuit;

FIG. 27 is a circuit diagram showing a second example of a voltage variable circuit;

FIG. 30 is a diagram showing a page in which setting of the threshold voltage of the semiconductor integrated circuit device according to the first embodiment is changed;

FIG. 34 is a plan view of a memory cell array;

FIG. 35 is a diagram showing the relation between the block position in the memory cell array and the gate length;

FIG. 36 is a plan view of a semiconductor integrated circuit chip;

FIG. 37 is a diagram showing the relation between the memory cell array position in the chip and the gate length;

FIG. 38 is an equivalent circuit diagram showing one example of the actual equivalent circuit of a NAND memory unit according to a second embodiment of this invention;

FIG. 43 is a diagram showing a setting example 2 of threshold voltage;

DETAILED DESCRIPTION OF THE INVENTION

Embodiments of this invention will now be described with reference to the accompanying drawings. In this explanation, common reference symbols are assigned to common portions throughout the drawings.

First Embodiment

In a semiconductor integrated circuit device according to a first embodiment, basically, the threshold voltages of memory cells can be adequately set in the unit of cell array, block or page.

For example, since the length of a word line lying closer to a selection gate line in the column direction becomes narrower, the reliability thereof is lower than that of a word line lying far apart from the selection gate line. Therefore, at least one of the verify voltage, the step-up voltage width at the write time and the write suppression voltage applied to the bit line when the voltage becomes closer to the set threshold voltage is changed in the unit of cell array, block or page. By using this method, setting of the threshold voltage is changed in the unit of cell array, block or page. For example, for the word line lying closer to the selection gate line, the distribution width (Vthmin−Vthmax) of the write threshold voltage is made smaller and the data holding characteristic is enhanced. For example, for other word lines, the distribution width (Vthmin−Vthmax) of the write threshold voltage is made larger than that of the word line closer to the selection gate line. Thus, enhancement of the data holding characteristic is attained while the operation speed is kept high.

There will now be described the first embodiment of this invention with reference to the accompanying drawings.

Figure 1:
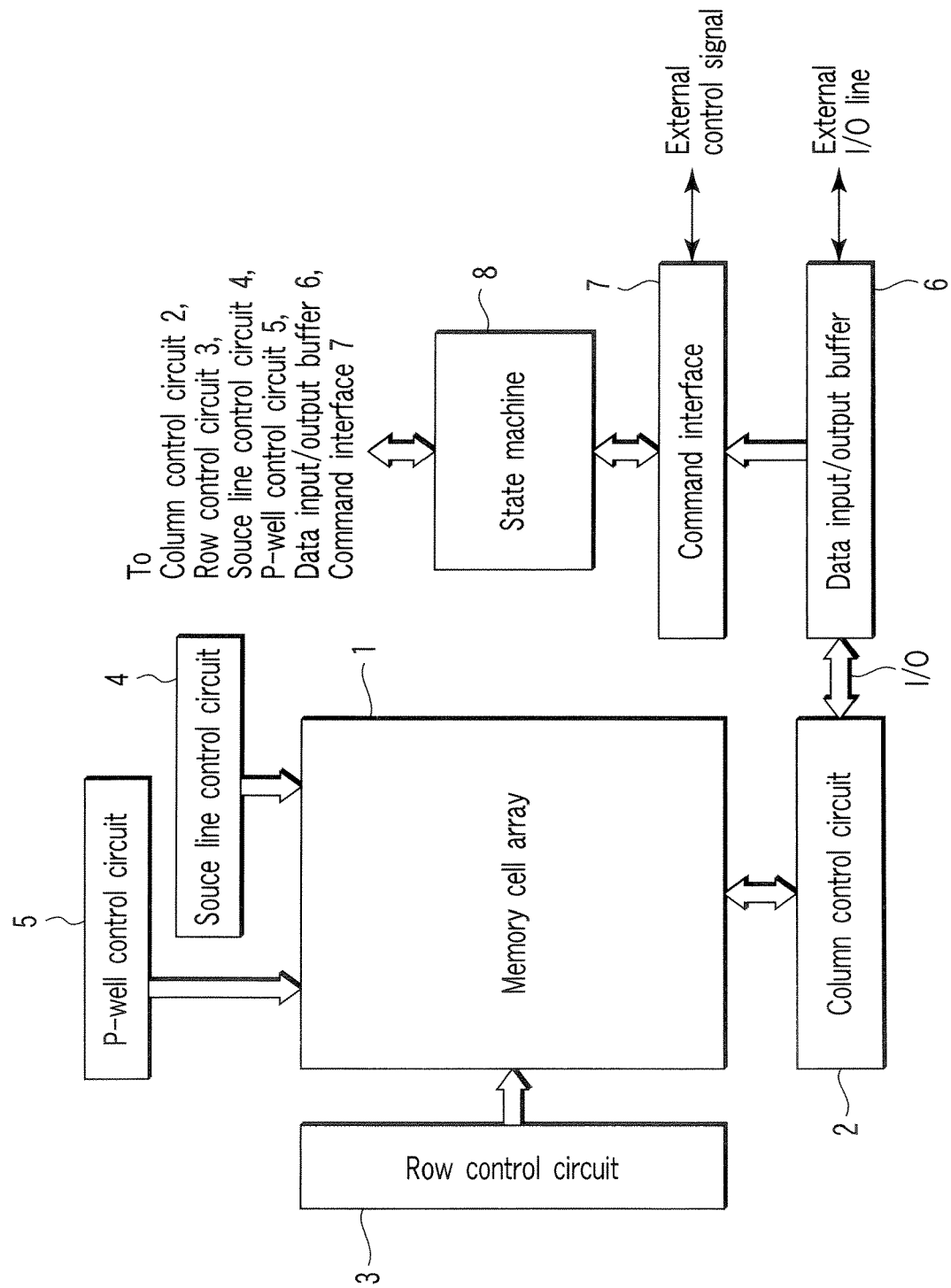
FIG. 1 is a block diagram showing one example of a semiconductor integrated circuit device according to a first embodiment of this invention.

FIG. 1 is a block diagram showing one example of a semiconductor integrated circuit device according to the first embodiment of this invention. As one example of the semiconductor integrated circuit device, the first embodiment shows a NAND flash memory, but this invention can be applied to a memory other than a NAND flash memory.

In a memory cell array 1, nonvolatile semiconductor memory cells are arranged in a matrix form. One example of the nonvolatile semiconductor memory cell is a flash memory cell.

A column control circuit 2 controls the bit lines of the memory cell array 1 and performs the operations of erasing data of the memory cell, writing data into the memory cell and reading data from the memory cell. The column control circuit 2 is arranged adjacent to the memory cell array 1.

A row control circuit 3 selects one of the word lines of the memory cell array 1 and applies a voltage necessary for erasing, writing or reading.

A source line control circuit (C-source control circuit) 4 controls the source lines of the memory cell array 1.

A P-type cell well control circuit (C-p-well control circuit) 5 controls the potential of a P-type well in which the memory cell array 1 is formed.

A data input/output buffer 6 is electrically connected to the column control circuit 2 via an I/O line and electrically connected to an external host (not shown) via an external I/O line. For example, in the data input/output buffer 6, an input/output buffer circuit is arranged. The data input/output buffer 6 receives write data, outputs read data and receives address data and command data. The data input/output buffer 6 supplies received write data to the column control circuit 2 via the I/O line and receives data read from the column control circuit 2 via the I/O line. Further, it supplies externally input address data to the column control circuit 2 and row control circuit 3 via a state machine 8 so as to select the address of the memory cell array 1. Also, it supplies command data from the external host to a command interface 7.

The command interface 7 receives a control signal from the external host via an external control signal line and determines whether data input to the data input/output buffer 6 is write data, command data or address data. Then, it transfers the data as reception command data to the state machine 8 if the data is command data.

The state machine 8 manages the whole portion of the flash memory. It receives command data from the external host and performs the read, write, erase and input/output management processes.

Figure 2:
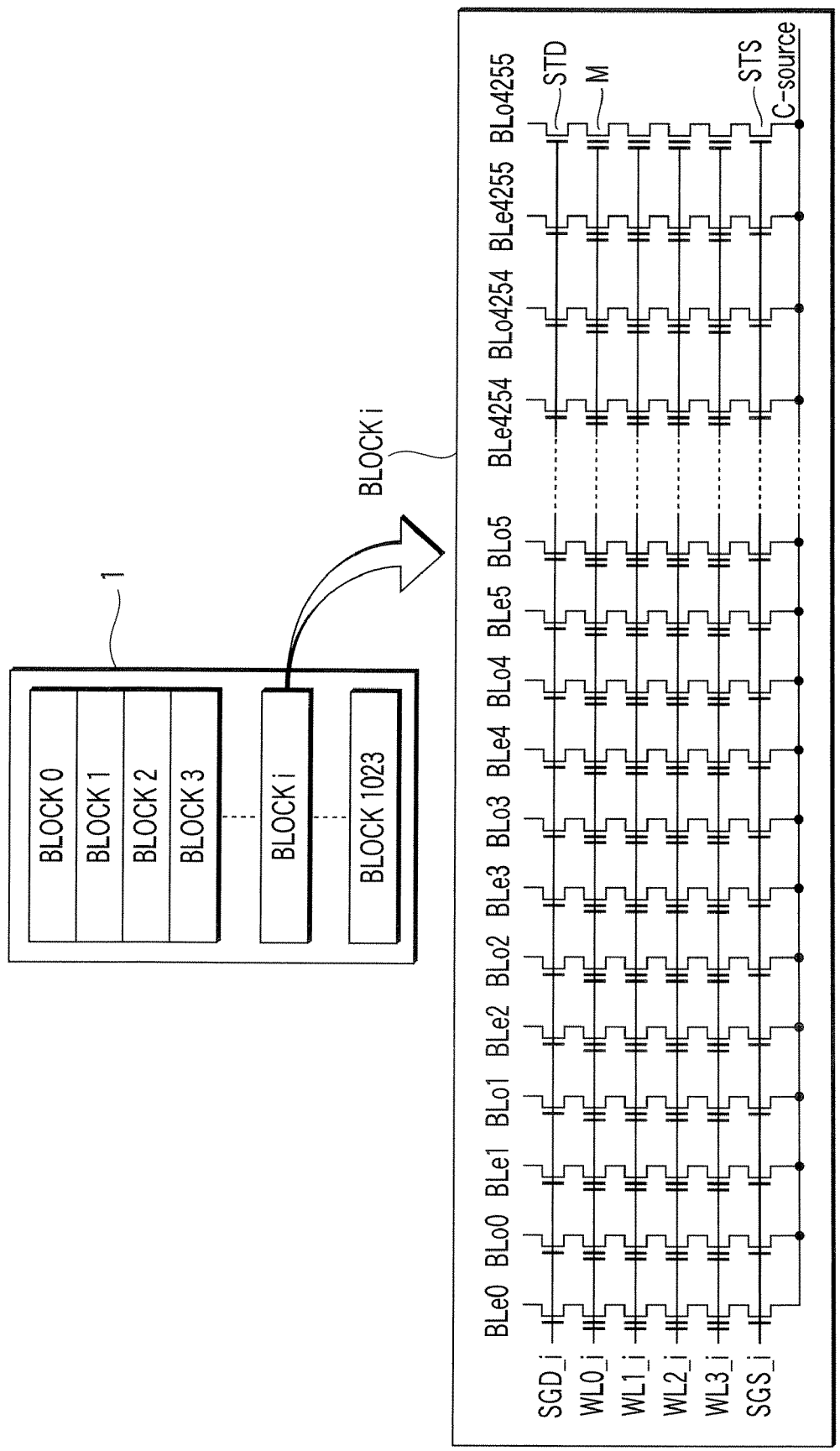
FIG. 2 is a diagram showing one example of a memory cell array shown in FIG. 1.

FIG. 2 is a diagram showing one example of the memory cell array 1 shown in FIG. 1.

The memory cell array 1 is divided into a plurality of blocks, for example, 1024 blocks BLOCK0 to BLOCK1023. For example, the block is a minimum unit for erase. Each block BLOCKi includes a plurality of NAND memory units, for example, 8512 NAND memory units. In this example, each NAND memory unit includes two selection transistors STD, STS and a plurality of memory cells M (in this example, four memory cells M) serially connected between the above two transistors. One end of the NAND memory unit is connected to a corresponding one of the bit lines BL via the selection transistor STD whose gate is connected to a selection gate line SGD and the other end thereof is connected to a common C-source line via the selection transistor STS whose gate is connected to a selection gate line SGS. The gate of each memory cell M is connected to a corresponding one of the word lines WL. The data write and read operations for even-numbered bit lines BLe and odd-numbered bit lines BLo counted from "0" are independently performed. The data write or read operations are simultaneously performed for, for example, 4256 memory cells connected to the bit lines BLe among the 8512 memory cells connected to one word line WL. One-bit data is stored in each memory cell M and data items of 4256 memory cells are collected together to configure a unit which is one page. For example, the page is a minimum unit read. When 2-bit data is stored in each memory cell M, the 4256 memory cells store data of two pages. Likewise, the 4256 memory cells connected to the bit lines BLo configure different two pages and the data write or read operations are simultaneously performed for the memory cells of each page.

Figure 3:
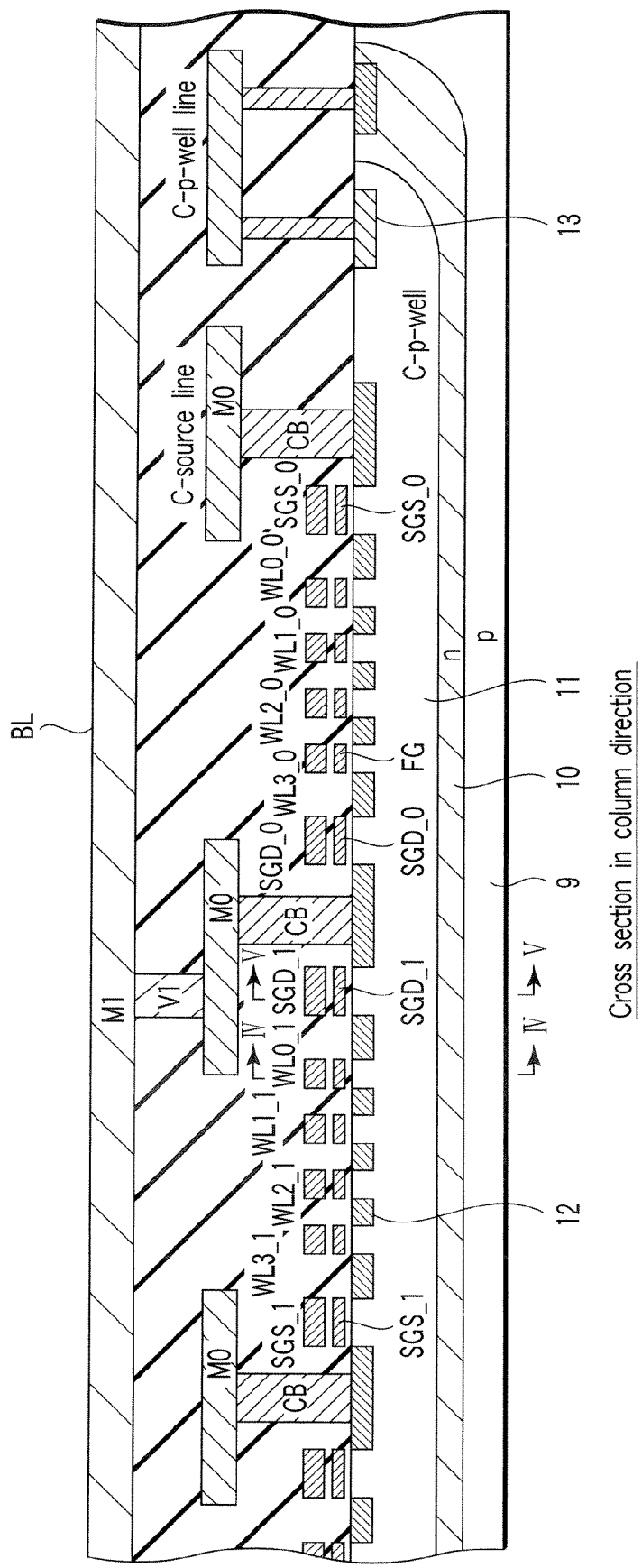
FIG. 3 is a cross-sectional view showing one example of the structure in the column direction of the memory cell array shown in FIG. 1.

FIG. 3 is a cross-sectional view showing one example of the structure in the column direction of the memory cell array 1 shown in FIG. 1.

An n-type cell well 10 is formed in a p-type semiconductor substrate 9. A p-type cell well 11 is formed in the n-type cell well 10. The memory cell M includes n-type diffusion layers 12 acting as source/drain regions, a floating gate FG, and a control gate acting as the word line WL. The selection gate S (SGS, SGD) includes n-type diffusion layers 12 acting as source/drain regions and a double-structured gate acting as the selection gate SG. The word line WL and selection gate line SG are connected to the row control circuit 3 and controlled by the row control circuit 3.

One end of the NAND memory cell unit is connected to a first metal interconnection layer M0 via a first contact CB and connected to a second metal interconnection layer M1 functioning as the bit line BL via a second contact V1. The bit line BL is connected to the column control circuit 2. The other end of the NAND memory unit is connected to the first metal interconnection layer M0 functioning as the common source line C-source via the first contact hole CB. The common source line C-source is connected to the source line control circuit 4.

The n-type cell well 10 and p-type cell well 11 are set at the same potential and connected to the P well control circuit 5 via the well line C-p-well.

Figure 4:
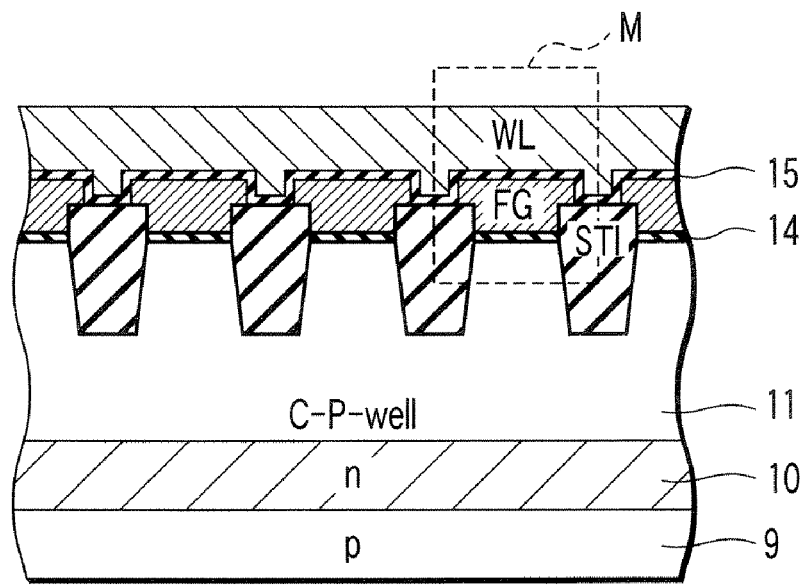
FIG. 4 is a cross-sectional view showing one example of the structure in the row direction of the memory cell array shown in FIG. 1.
Figure 5:
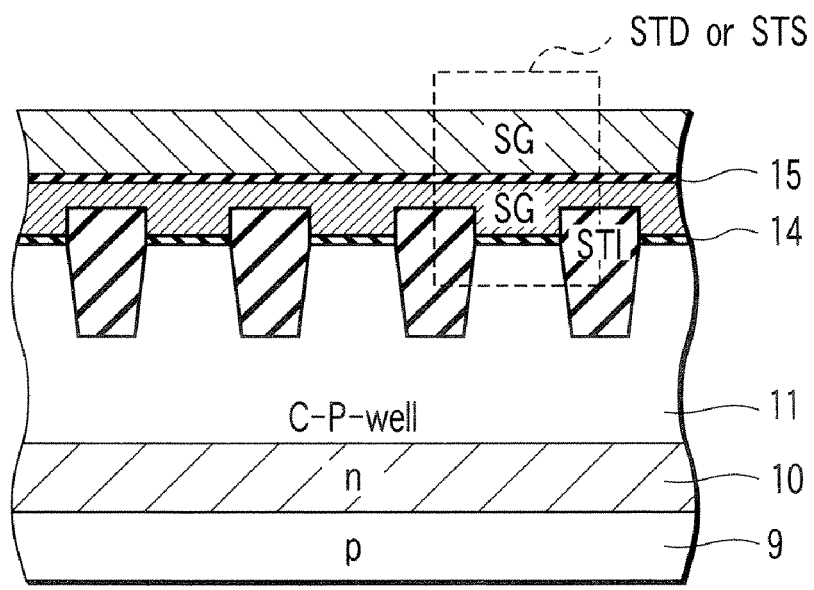
FIG. 5 is a cross-sectional view showing one example of the structure in the row direction of the memory cell array shown in FIG. 1.

FIGS. 4 and 5 are cross-sectional views showing one example of the structure in the row direction of the memory cell array 1 shown in FIG. 1.

As shown in FIG. 4, the memory cells M are isolated by use of element isolation regions STI. The floating gate FG is stacked on a channel region with a tunnel oxide film 14 disposed therebetween. The word line WL is stacked on the floating gate FG with an ONO film 15 disposed therebetween.

As shown in FIG. 5, the selection gate line SG has a double structure. Although not shown in the drawing, the upper and lower selection gate lines SG are connected to one end of the memory cell array 1 or to the bit lines for every preset number.

Figure 6:
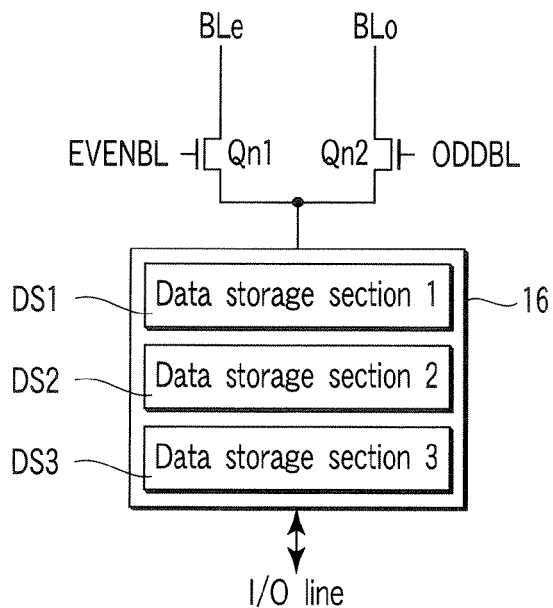
FIG. 6 is a block diagram showing one example of a column control circuit shown in FIG. 1.

FIG. 6 is a block diagram showing one example of the column control circuit 2 shown in FIG. 1.

Each data storage circuit 16 is provided for every two bit lines (for example, BLe5 and BLo5) of the even-numbered bit line BLe and odd-numbered bit line BLo having the same column number. One of the bit lines BLe and BLo is selected and connected to the data storage circuit 16. Then, the potential of the bit line BLe or BLo is controlled for data write or readout. When a signal EVENBL is made high ("H" level) and a signal ODDBL is made low ("L" level), the bit line BLe is selected. The bit line BLe is connected to the data storage circuit 16 via an n-channel MOS transistor Qn1. On the other hand, when the signal EVENBL is made low and the signal ODDBL is made high, the bit line BLo is selected. The bit line BLo is connected to the data storage circuit 16 via an n-channel MOS transistor Qn2. The signal EVENBL is common for all of the even-numbered bit lines BLe. Likewise, the signal ODDBL is common for all of the odd-numbered bit lines BLo. The non-selected bit lines are controlled by a circuit (not shown).

The data storage circuit 16 includes three binary data storage sections DS1, DS2, DS3. The data storage section DS1 is connected to the data input/output buffer 6 via the data input/output line (I/O line) and stores externally write data input or read data to be externally output. The data storage section DS2 stores a detection result at the time of recognition (write verify) of the threshold voltage of the memory cell M after writing. The data storage section DS3 temporarily stores data of the memory cell M at the write time and read time.

Figure 7:
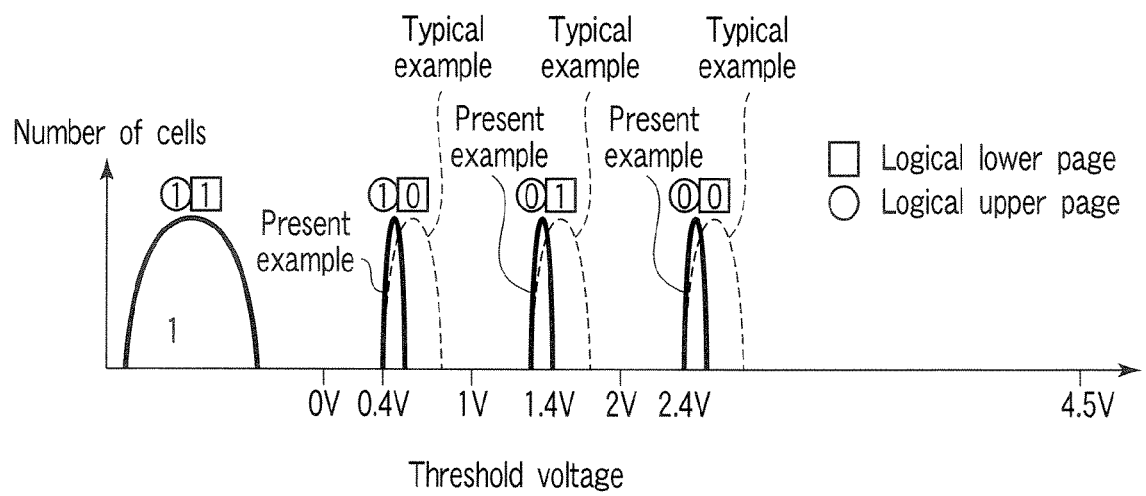
FIG. 7 is a diagram showing the relation between multi-level data and the threshold voltage of the memory cell.

FIG. 7 is a diagram showing the relation between multi-level data of a multi-level flash memory and the threshold voltage of the memory cell M.

In this example, 2-bit data is stored in one memory cell M. As the 2-bit data, "11", "10", "00", "01" are used. The two bits belong to different row addresses (different pages).

After erasing, data of the memory cell M is set to "11". If lower page data with respect to the memory cell M is "0", the state is changed from "11" to "10" by writing. When "1" data is written, the state "11" is kept unchanged.

Next, upper page data is written. If data is "1", the state of "11" or "10" is maintained. If data is "0", the state of "11" is changed to "01" and the state "10" is changed to "00".

If the threshold voltage is lower than 0V, for example, the state is regarded as "11", and if the threshold voltage is equal to or higher than 0V and lower than 1V, for example, the state is regarded as "10". Further, if the threshold voltage is equal to or higher than 1V and lower than 2V, for example, the state is regarded as "01" and if the threshold voltage is equal to or higher than 2V, for example, the state is regarded as "00".

Thus, four threshold voltages are used in order to store 2-bit data in one memory cell. In the actual device, since a variation occurs in the characteristics of the memory cells, the threshold voltages thereof also vary. If the variation is large, data cannot be distinguished and erroneous data may be read.

In the write method according to the present embodiment, first, variations in the typical threshold voltages as indicated by broken lines can be suppressed to narrow ranges as indicated by solid lines.

Tables 1 and 2 indicate voltages in the respective portions at the erase time, write time, read time and write verify time. In the tables 1 and 2, a case wherein the word line WL2 and the even-numbered bit line BLe are selected at the write time and read time is shown.

TABLE 1

| | Erase | First-step Write | Second-step Write | Write Inhibition | "10" Read | "01" Read | "00" Read |
|---|---|---|---|---|---|---|---|
| BLe | Floating | 0 V | 0.4 V | Vdd | H or L | H or L | H or L |
| BLo | Floating | Vdd | Vdd | Vdd | 0 V | 0 V | 0 V |
| SGD | Floating | Vdd | Vdd | Vdd | 4.5 V | 4.5 V | 4.5 V |
| WL3 | 0 V | 10 V | 10 V | 10 V | 4.5 V | 4.5 V | 4.5 V |
| WL2 | 0 V | Vpgm | Vpgm | Vpgm | 0 V | 1 V | 2 V |
| WL1 | 0 V | 0 V | 0 V | 0 V | 4.5 V | 4.5 V | 4.5 V |
| WL0 | 0 V | 10 V | 10 V | 10 V | 4.5 V | 4.5 V | 4.5 V |
| SGS | Floating | 0 V | 0 V | 0 V | 4.5 V | 4.5 V | 4.5 V |
| C-source | Floating | 0 V | 0 V | 0 V | 0 V | 0 V | 0 V |
| C-p-well | 20 V | 0 V | 0 V | 0 V | 0 V | 0 V | 0 V |

TABLE 2

| | "10" First-step Write Verify | "10" Second-step Write Verify | "01" First-step Write Verify | "01" Second-step Write Verify | "00" First-step Write Verify | "00" Second-step Write Verify |
|---|---|---|---|---|---|---|
| BLe | H or L | H or L | H or L | H or L | H or L | H or L |
| BLo | 0 V | 0 V | 0 V | 0 V | 0 V | 0 V |
| SGD | 4.5 V | 4.5 V | 4.5 V | 4.5 V | 4.5 V | 4.5 V |
| WL3 | 4.5 V | 4.5 V | 4.5 V | 4.5 V | 4.5 V | 4.5 V |
| WL2 | 0.2 V | 0.4 V | 1.2 V | 1.4 V | 2.2 V | 2.4 V |
| WL1 | 4.5 V | 4.5 V | 4.5 V | 4.5 V | 4.5 V | 4.5 V |
| WL0 | 4.5 V | 4.5 V | 4.5 V | 4.5 V | 4.5 V | 4.5 V |
| SGS | 4.5 V | 4.5 V | 4.5 V | 4.5 V | 4.5 V | 4.5 V |
| C-source | 0 V | 0 V | 0 V | 0 V | 0 V | 0 V |
| C-p-well | 0 V | 0 V | 0 V | 0 V | 0 V | 0 V |

(Erase)

At the erase time, the p-type cell well (C-p-well) 11 is set to 20V and all of the word lines WL0 to WL3 of a selected block are set to 0V. Electrons are discharged from the floating gate and the threshold voltage of the memory cell M is set to a negative voltage ("11" state). In this case, the word lines WL and bit lines BL of the non-selected block are set into an electrically floating state and set to approximately 20V due to the capacitive coupling with the p-type cell well 11.

(Write)

At the write time, the voltage Vpgm of 14V to 20V is applied to the selected word line WL2. In this state, if the selected bit line BLe is set to 0V, electrons are injected into the floating gate FG to rapidly raise the threshold voltage of the memory cell M (first-step write). In order to suppress the rising speed of the threshold voltage, the potential of the bit line BLe is raised t 0.4V (second-step write). In order to inhibit the rise in the threshold voltage, the potential of the bit line BLe is set to power supply voltage Vdd (about 3V) (write inhibition).

(Read)

At the read time, read voltage (0V, 1V, 2V) is applied to the selected word line WL2. If the threshold voltage of the memory cell M is lower than the read voltage, for example, the bit line BLe and common source line C-source are electrically connected to each other and the potential of the bit line BLe is set to the relatively low level "L". If the threshold voltage of the memory cell M is equal to or higher than the read voltage, for example, the bit line BLe and common source line C-source are isolated from each other and the potential of the bit line BLe maintains the relatively high level "H". In order to detect whether or not the threshold voltage of the memory cell M is set higher than the state "10", the read voltage is set to 0V ("10" read). In order to detect whether or not the threshold voltage of the memory cell M is set higher than the state "01", the read voltage is set to 1V ("01" read). In order to detect whether or not the threshold voltage of the memory cell M is set higher than the state "00", the read voltage is set to 2V ("00" read).

The threshold voltage in the "10" state is set equal to or higher than 0.4V so as to provide a read margin of 0.4V with respect to the read voltage 0V. For this purpose, in the case of writing "10", a write verify operation is performed and if it is detected that the threshold voltage of the memory cell M has reached 0.4V, a write inhibiting operation is performed to control the threshold voltage. Typically, in this case, only whether or not the threshold voltage has reached 0.4V is detected. Therefore, as shown in FIG. 7, a relatively wide threshold voltage distribution range is provided (typical example).

On the other hand, in this example, whether the threshold voltage which is slightly lower than a target threshold voltage is reached or not is detected and the rising speed of the threshold voltage is suppressed in the second-step write process to narrow the threshold voltage distribution width as shown in FIG. 7 (in this example). This applies to the other states "01" and "00".

The write verifying operation is performed by applying a verify voltage (0.2V, 0.4V, 1.2V, 1.4V, 2.2V, 2.4V) to the selected word line WL2. For example, if the threshold voltage of the memory cell M is lower than the verify voltage, the bit line BLe and common source line C-source are electrically connected to each other and the potential of the bit line BLe is set to the relatively low level "L". For example, if the threshold voltage of the memory cell M is equal to or higher than the verify voltage, the bit line BLe and common source line C-source are isolated from each other and the potential of the bit line BLe maintains the relatively high level "H". In order to detect whether or not the threshold voltage of the memory cell M is higher than 0.2V, the write verify process is performed with the verify voltage set at 0.2V ("10" first-step write verify). In order to detect whether or not the threshold voltage of the memory cell M is higher than 0.4V, the write verify process is performed with the verify voltage set at 0.4V ("10" second-step write verify). In order to detect whether or not the threshold voltage of the memory cell M is higher than 1.2V, the write verify process is performed with the verify voltage set at 1.2V ("01" first-step write verify). In order to detect whether or not the threshold voltage of the memory cell M is higher than 1.4V, the write verify process is performed with the verify voltage set at 1.4V ("01" second-step write verify). In order to detect whether or not the threshold voltage of the memory cell M is higher than 2.2V, the write verify process is performed with the verify voltage set at 2.2V ("00" first-step write verify). In order to detect whether or not the threshold voltage of the memory cell M is higher than 2.4V, the write verify process is performed with the verify voltage set at 2.4V ("00" second-step write verify).

Figure 8:
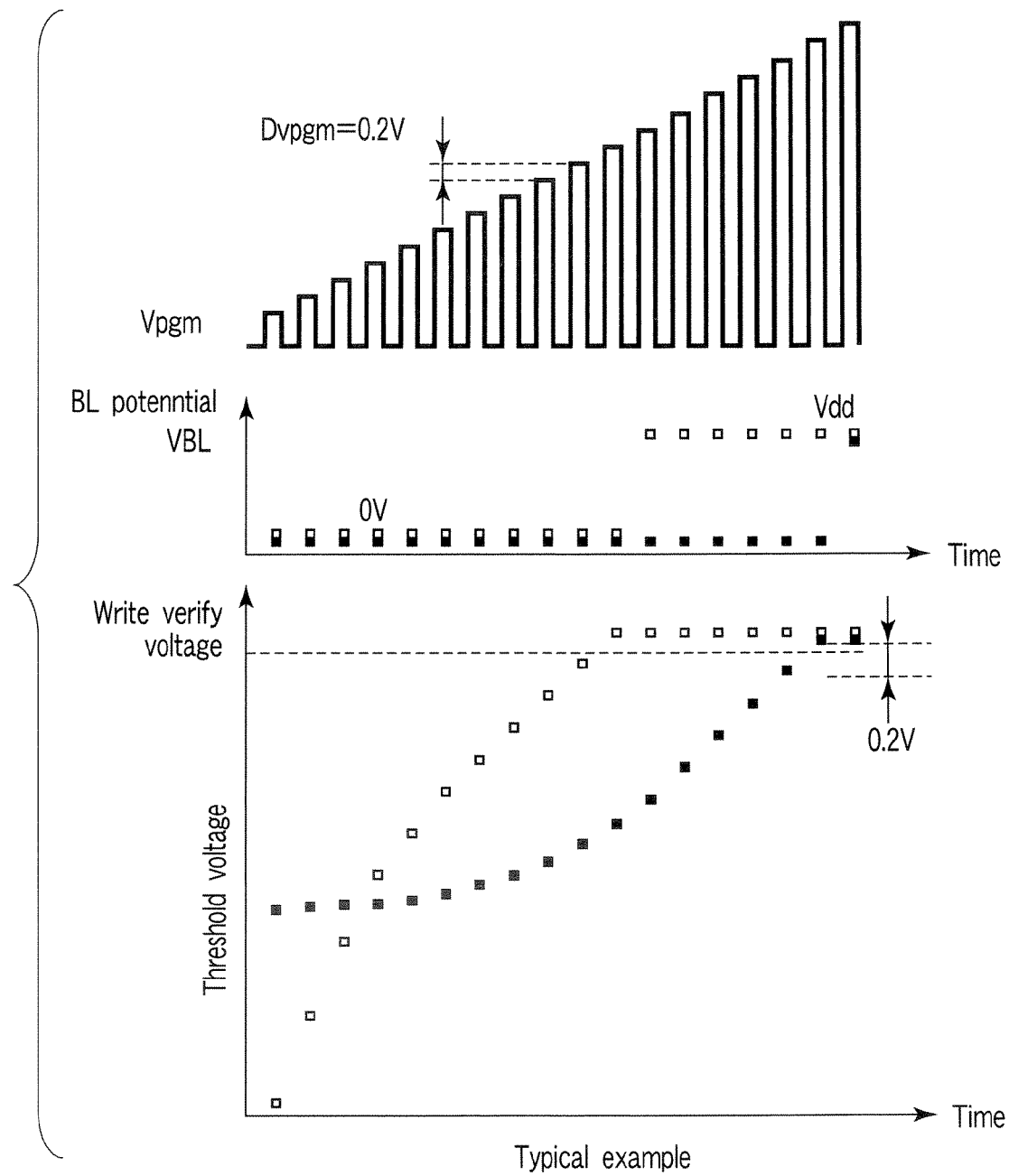
FIG. 8 is a diagram showing a typical write method and threshold voltage control operation.

FIG. 8 is a diagram showing a typical write method and threshold voltage control process.

In FIG. 8, each void square indicates the threshold voltage of a memory cell into which data can be easily written and each black square indicates the threshold voltage of a memory cell into which data is difficult to be written. The above two memory cells store data items of the same page. Each of them is initially set in the erase state and has a negative threshold voltage.

As shown in FIG. 8, the write voltage Vpgm is divided into a plurality of pulses and is raised by 0.2V for each pulse (Dvpgm=0.2V), for example. If the voltage of the bit line BL which is the write control voltage is set to 0V, the threshold voltage is raised at the same rate of 0.2V/pulse as the voltage rise rate of the write voltage Vpgm after several pulses. The write verify process is performed after application of each write pulse, the bit line voltage of a memory cell whose threshold voltage has reached the write verify voltage is set to Vdd, and the write process is inhibited for each memory cell. Thus, the threshold voltage has the distribution width of 0.2V.

Figure 9:
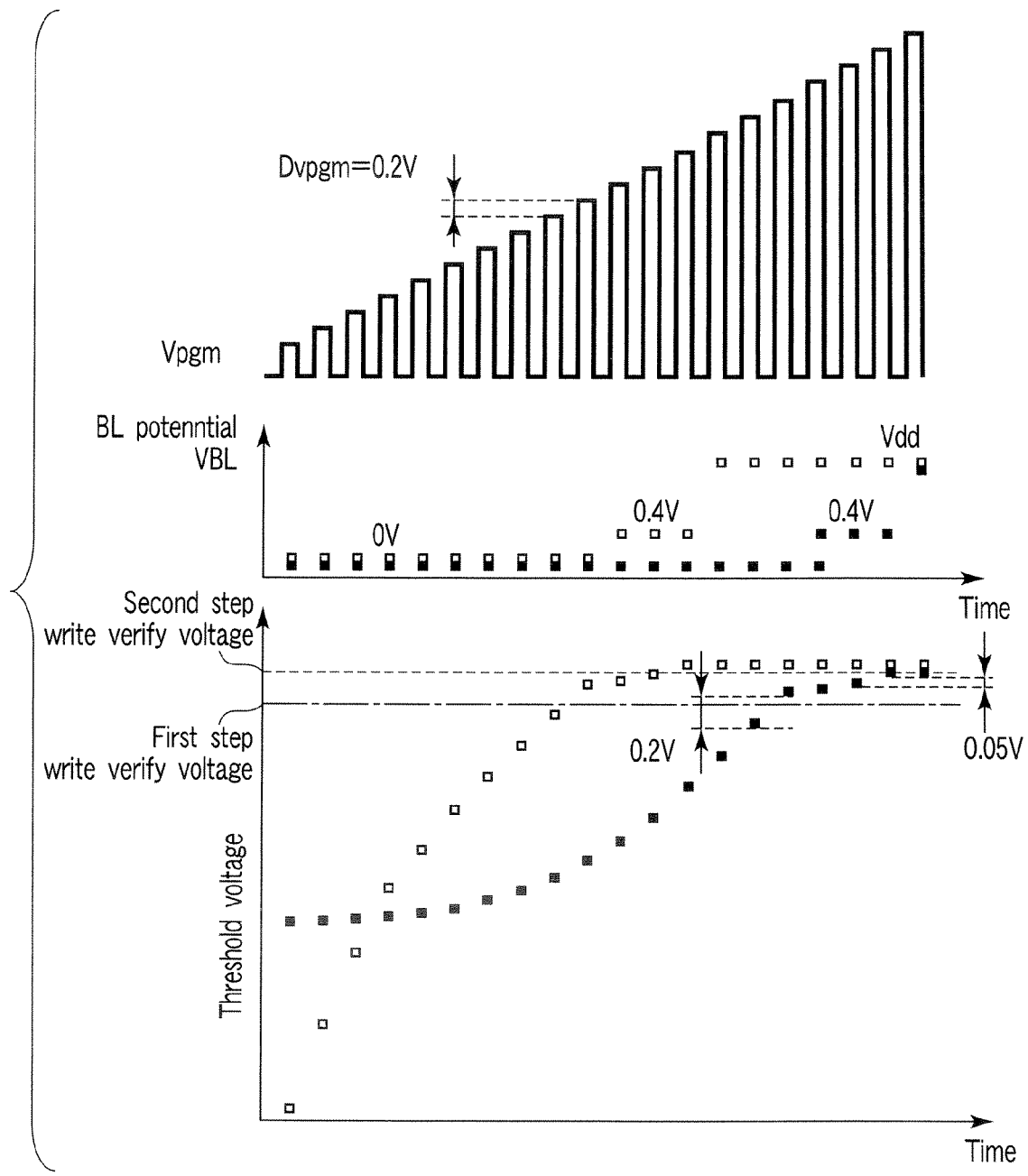
FIG. 9 is a diagram showing a write method and threshold voltage control operation of the semiconductor integrated circuit device according to the first embodiment.

FIG. 9 is a diagram showing the write method of this example and threshold control process.

In FIG. 9, each void square indicates the threshold voltage of a memory cell into which data can be easily written and each black square indicates the threshold voltage of a memory cell into which data is difficult to be written. The above two memory cells store data items of the same page. Each of them is initially set in the erase state and has a negative threshold voltage.

As shown in FIG. 9, the write voltage Vpgm is divided into a plurality of pulses and is raised by 0.2V for each pulse (Dvpgm=0.2V), for example. If the voltage of the bit line BL which is the write control voltage is set to 0V, the first-step write process is performed and the threshold voltage is raised at the same rate of 0.2V/pulse as the voltage rise rate of the write voltage Vpgm after several pulses. The first-step and second-step write verify processes are performed after application of each write pulse, the bit line voltage of a memory cell whose threshold voltage has reached the first-step write verify voltage is set to 0.4V, and the second-step write process is performed for each memory cell. Further, the bit line voltage of a memory cell whose threshold voltage has reached the second-step write verify voltage is set to Vdd and the write process is inhibited for each memory cell. Since the rise rate of the threshold voltage is suppressed to approximately 0V/pulse to 0.05V/pulse, for example, for several pulses after the second-step write process is started, the threshold voltage only has the distribution width of 0.05V. Thus, the threshold voltage distribution width can be narrowed.

If the write pulse width is set to 20 μsec and each write verify time is set to 5 μsec, the write time produced by the typical write method is expressed as follows.

(20 μsec+5 μsec)×18 pulses=450 μsec

However, since it is necessary to reduce the voltage rise rate of the write voltage Vpgm to 0.05V, that is, one-fourth in order to realize the threshold voltage distribution of 0.05V, the write time becomes as follows.

450 μsec×4=1800 μsec

According to this example, as shown in FIG. 9, the threshold voltage distribution width of 0.05V can be realized with the Vpgm rise rate of 0.2V/pulse and the write time becomes as follows.

(20 μsec+5 μsec+5 μsec)×20 pulses=600 μsec

That is, in this example, the write time required for realizing the threshold voltage distribution of 0.05V, which is the same as in the typical write method, can be reduced to one-third in comparison with the typical write method.

In this case, a "10" write process is performed by setting the first-step write verify voltage to the "10" first-step write verify voltage and setting the second-step write verify voltage to the "10" second-step write verify voltage.

Figure 10:
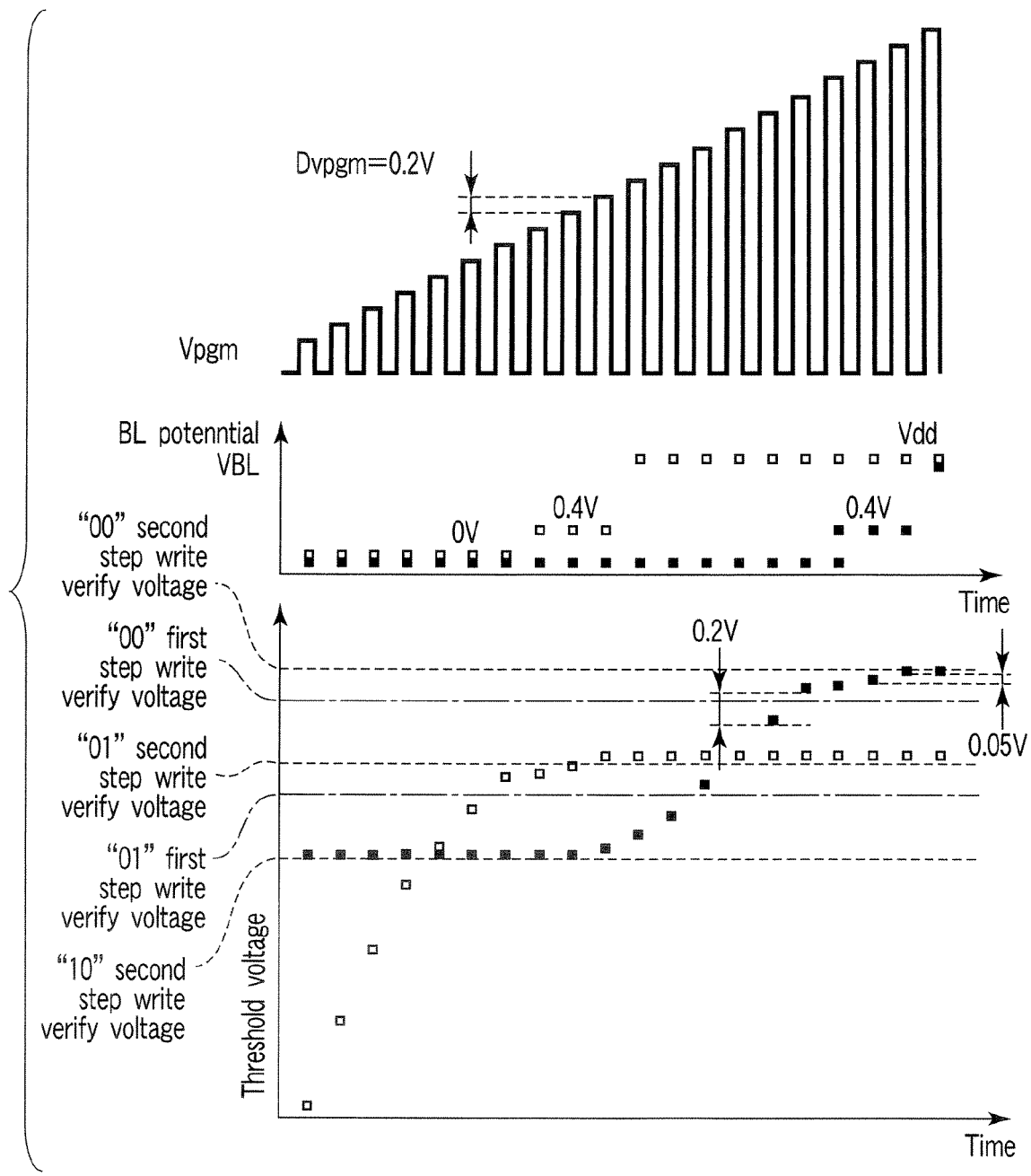
FIG. 10 is a diagram showing a write method of upper page data and a threshold voltage control operation of the semiconductor integrated circuit device according to the first embodiment.

FIG. 10 is a diagram showing a method of writing upper page data into the same memory cell M in this example and a threshold control operation.

In FIG. 10, each void square indicates the threshold voltage of a memory cell into which data can be easily written and each black square indicates the threshold voltage of a memory cell into which data is difficult to be written. The above two memory cells store data items of respective columns of the same page. The memory cell indicated by the void square is initially set in the erase state, has a negative threshold voltage and is written into a "01" state. The memory cell indicated by the black square is initially set in the "10" state and is written into a "00" state.

As shown in FIG. 10, the write voltage Vpgm is divided into a plurality of pulses and is raised by 0.2V for each pulse (Dvpgm=0.2V), for example. If the voltage of the bit line BL which is the write control voltage is set to 0V, the first-step write process is performed and the threshold voltage is raised at a rate of 0.2V/pulse which is the same as the voltage rise rate of the write voltage Vpgm after several pulses. The "01" first-step and "01" second-step write verify processes are performed after application of each write pulse and then the "00" first-step and "00" second-step write processes are performed.

When it is detected that the threshold voltage of the memory cell indicated by the void square has reached the "01" first-step write verify voltage, the bit line voltage is set to 0.4V and the second-step write state is set up. When it is detected that the threshold voltage of the memory cell indicated by the black square has reached the "00" first-step write verify voltage, the bit line voltage is set to 0.4V and the second-step write state is set up.

When it is detected that the threshold voltage of the memory cell indicated by the void square has reached the "01" second-step write verify voltage, the bit line voltage is set to Vdd and the write operation is inhibited. Further, when it is detected that the threshold voltage of the memory cell indicated by the black square has reached the "00" second-step write verify voltage, the bit line voltage is set to Vdd and the write operation is inhibited.

For both of "01" and "00", since the rise rate of the threshold voltage is suppressed to approximately 0V/pulse to 0.05V/pulse for a time period of several pulses after the second-step write state is set up, for example, the threshold voltage has only the distribution width of 0.05V.

Figure 11:
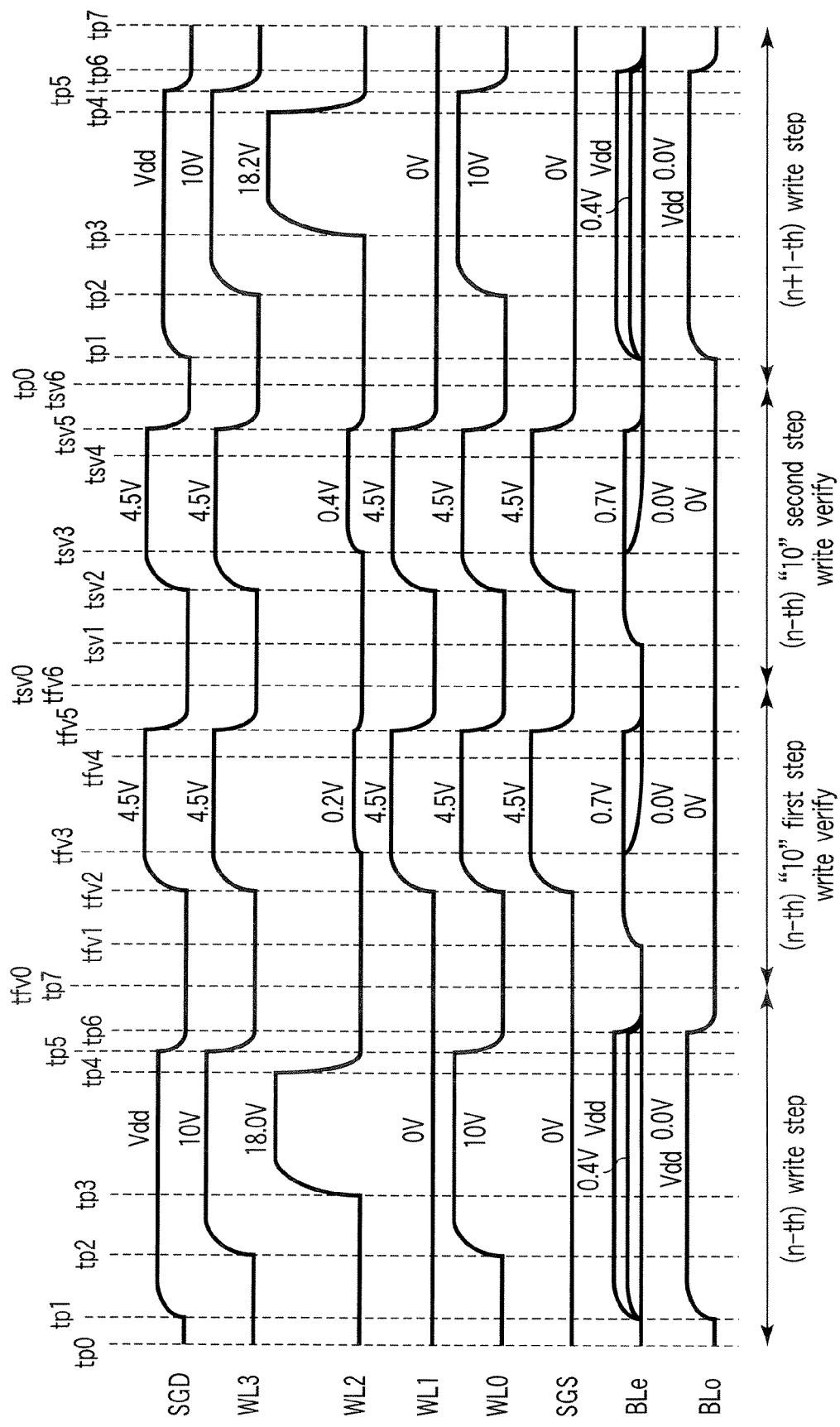
FIG. 11 is an operation waveform diagram showing waveforms at the write time of lower page data of the semiconductor integrated circuit device according to the first embodiment.

FIG. 11 is an operation waveform diagram showing waveforms at the write time of lower page data into the same memory cell M.

The write step is performed in a period from time tp0 to tp7 and a write pulse is applied. The "10" first-step write verify operation is performed in a period from time tfv0 to tfv6 and the "10" second-step write verify operation is performed in a period from time tsv0 to tsv6. In this example, a case wherein the word line WL and the even-numbered bit line BLe are selected is shown.

In the write step, the voltage of the bit line BLe which is the write control voltage is set to 0V in the first-step write state, 0.4V in the second-step write state and Vdd (for example, 2.5V) in the write inhibition state.

At each write verify time, first, the bit line BLe is charged to 0.7V. After this, when the voltage of the selected word line WL2 has reached the write verify voltage, the voltage of 0.7V is maintained if the threshold voltage of the memory cell M has reached the write verify voltage. In this case, the voltage is lowered towards 0V if the threshold voltage of the memory cell M does not reach the write verify voltage.

If the voltage of the bit line BLe is detected at the timing of time tfv4 or tsv4, whether or not the threshold voltage of the memory cell M has reached the write verify voltage can be detected. If the threshold voltage of the memory cell M has reached the write verify voltage, the detection result is "pass".

Figure 12:
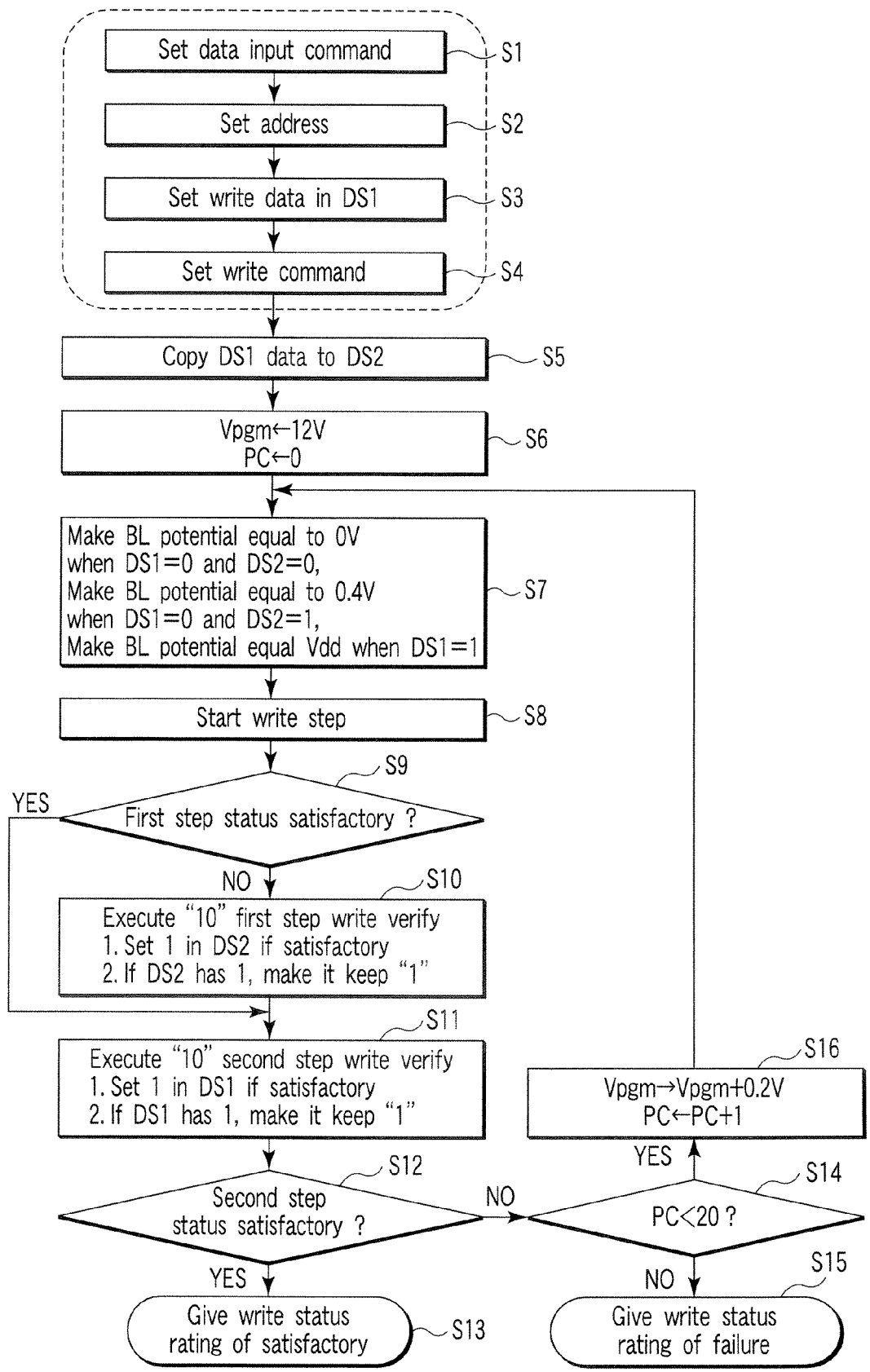
FIG. 12 is a flow chart showing a write algorithm of lower page data of the semiconductor integrated circuit device according to the first embodiment.

FIG. 12 is a flow chart showing an algorithm of writing lower page data into the same memory cell M.

First, for example, the command interface 7 receives a data input command from the host and sets the data input command in the state machine 8 (S1).

Next, for example, the command interface 7 receives address data from the host and sets an address to select a write page in the state machine 8 (S2).

Next, for example, the data input/output buffer 6 receives write data of one page and sets corresponding write data into the respective data storage sections DS1 (S3).

Next, for example, the command interface 7 receives a write command issued from the host and sets the write command in the state machine 8 (S4). After the write command is set, the steps S5 to S16 are automatically started in the internal portion by the state machine 8.

Next, data of each data storage section DS1 is copied into a corresponding one of the data storage sections DS2 (S5). After this, the initial value of the write voltage Vpgm is set to 12V and the write counter PC is set to "0" (S6).

If data of the data storage section DS1 is "0" and data of the data storage section DS2 is "0", it is determined that the first-step write state is set. Therefore, the voltage of the bit line which is the write control voltage is set at 0V.

If data of the data storage section DS1 is "0" and data of the data storage section DS2 is "1", it is determined that the second-step write state is set. Therefore, the voltage of the bit line which is the write control voltage is set at 0.4V.

If data of the data storage section DS1 is "1", it is determined that the write inhibition state is set. Therefore, the voltage of the bit line which is the write control voltage is set at Vdd (S7).

Next, write pulses are applied to the memory cells of one page by use of the set write voltage Vpgm and write control voltage. That is, the write step is performed (S8).

Whether or not data items of all of the data storage sections DS2 are "1" is detected and if all of the data items are "1", it is determined that the first-step status is "pass", and if not, it is determined that the above status is not "pass" (S9). As will be described later, if data items of all of the data storage sections DS2 are "1", it is determined that no memory cell is subjected to the first-step write operation in the preceding write step (S8).

If the first-step status is not "pass", the "10" first-step write verify operation is started (S10). Data of the data storage section DS2 corresponding to the memory cell in which the detection result is set to "pass" among the memory cells of one page is changed from "0" to "1". If data of the data storage section DS2 is "1", the "1" data is maintained.

If the first-step status is "pass" or when the "10" first-step write verify operation is terminated, the "10" second-step write verify operation is started (S11). Data of the data storage section DS1 corresponding to the memory cell in which the detection result is set to "pass" among the memory cells of one page is changed from "0" to "1". If data of the data storage section DS1 is "1", the "1" data is maintained.

After the "10" second-step write verify operation, whether or not data items of all of the data storage sections DS1 are "1" is detected and if all of the data items are "1", it is determined that the second-step status is "pass", and if not, it is determined that the above status is not "pass" (S12).

If the second-step status is "pass", it is determined that the write operation is correctly terminated, the write status is set to "pass" and the write operation is terminated (S13).

If the second-step status is not "pass", the write counter PC is checked (S14) and if the count thereof is equal to or larger than 20, it is determined that data could not be correctly written, the write status is set to "fail" and the write operation is terminated (S15).

If the count of the write counter PC is smaller than 20, the count of the write counter PC is incremented by one, the setting value of the write voltage Vpgm is increased by 0.2V (S16) and the process is returned to the write step S8 again after the step S7 is performed.

Table 3 shows the relation between data items before and after the "10" first-step write verify operation of the data storage sections DS1 and DS2 in the algorithm of writing lower page data into the same memory cell M shown in FIG. 12 and the threshold voltage of a corresponding memory cell.

TABLE 3

|  | | Threshold voltage Vt of memory cell | |
| --- | --- | --- | --- |
|  | | Lower than 0.2 V | Not lower than 0.2 V |
| Data DS1/DS2 before nth "10" first-step write verify | 0/0 0/1 1/1 | 0/0 0/1 1/1 | 0/0 0/1 1/1 |

Data DS1/DS2 after the nth "10" first-step write verify

As shown in table 3, a value which can be set in the data storage sections DS1 and DS2 before the nth "10" first-step write verify operation is 0/0, 0/1 or 1/1.

0/0 indicates that the threshold voltage of the memory cell does not reach the "10" first-step write verify voltage until the (n−1)th write step.

0/1 indicates that the threshold voltage of the memory cell has reached the "10" first-step write verify voltage, but does not reach the "10" second-step write verify voltage until the (n−1)th write step.

1/1 indicates that the threshold voltage of the memory cell has reached the "10" second-step write verify voltage until the (n−1)th write step.

Since there occurs no possibility that the threshold voltage of the memory cell has reached the "10" second-step write verify voltage, but does not reach the "10" first-step write verify voltage until the (n−1)th write step, the state of 1/0 is not provided in this example.

A value which can be set in the data storage sections DS1 and DS2 before the first "10" first-step write verify operation is 0/0 or 1/1.

Since the detection result in the "10" first-step write verify operation is not "pass" if the threshold voltage of the memory cell does not reach 0.2V which is the "10" first-step write verify voltage in the nth write step, data of the data storage section DS2 is kept unchanged. Since the detection result in the "10" first-step write verify operation is "pass" if the threshold voltage of the memory cell reaches 0.2V which is the "10" first-step write verify voltage in the nth write step, data of the data storage section DS2 is changed to "1". Data of the data storage section DS2 which is "1" is kept unchanged irrespective of the threshold voltage of the memory cell.

Table 4 shows the relation between data items before and after the "10" second-step write verify operation of the data storage sections DS1 and DS2 in the algorithm of writing lower page data into the same memory cell M shown in FIG. 12 and the threshold voltage of a corresponding memory cell.

TABLE 4

|  | | Threshold voltage Vt of memory cell | |
|---|---|---|---|
|  | | Lower than 0.4 V | Not lower than 0.4 V |
| Data DS1/DS2 before nth "10" second-step write verify | 0/0 | 0/0 | — |
|  | 0/1 | 0/1 | 1/1 |
|  | 1/1 | 1/1 | 1/1 |

Data DS1/DS2 after the nth "10" second-step write verify

As shown in table 4, a value which can be set in the data storage sections DS1 and DS2 before the nth "10" second-step write verify operation is 0/0, 0/1 or 1/1.

0/0 indicates that the threshold voltage of the memory cell does not reach the "10" first-step write verify voltage after the nth write step. 0/1 indicates that the threshold voltage of the memory cell has reached the "10" first-step write verify voltage until the nth write step, but the threshold voltage of the memory cell does not reach the "10" second-step write verify voltage until the (n−1)th write step. 1/1 indicates that the threshold voltage of the memory cell has reached the "10" second-step write verify voltage until the (n−1)th write step.

Since there occurs no possibility that the threshold voltage of the memory cell has reached the "10" second-step write verify voltage until the (n−1)th write step, but the threshold voltage of the memory cell does not reach the "10" first-step write verify voltage until the nth write step, the state of 1/0 is not provided in this example.

Since the detection result in the "10" second-step write verify operation is not "pass" if the threshold voltage of the memory cell does not reach 0.4V, which is the "10" second-step write verify voltage in the nth write step, data of the data storage section DS1 is kept unchanged. Since the detection result in the "10" second-step write verify operation is "pass" if the threshold voltage of the memory cell reaches 0.4V which is the "10" second-step write verify voltage in the nth write step, data of the data storage section DS1 is changed to "1". Data of the data storage section DS1 which is "1" is kept unchanged irrespective of the threshold voltage of the memory cell. 0/0 is not changed by the "10" second-step write verify operation.

Figure 13:
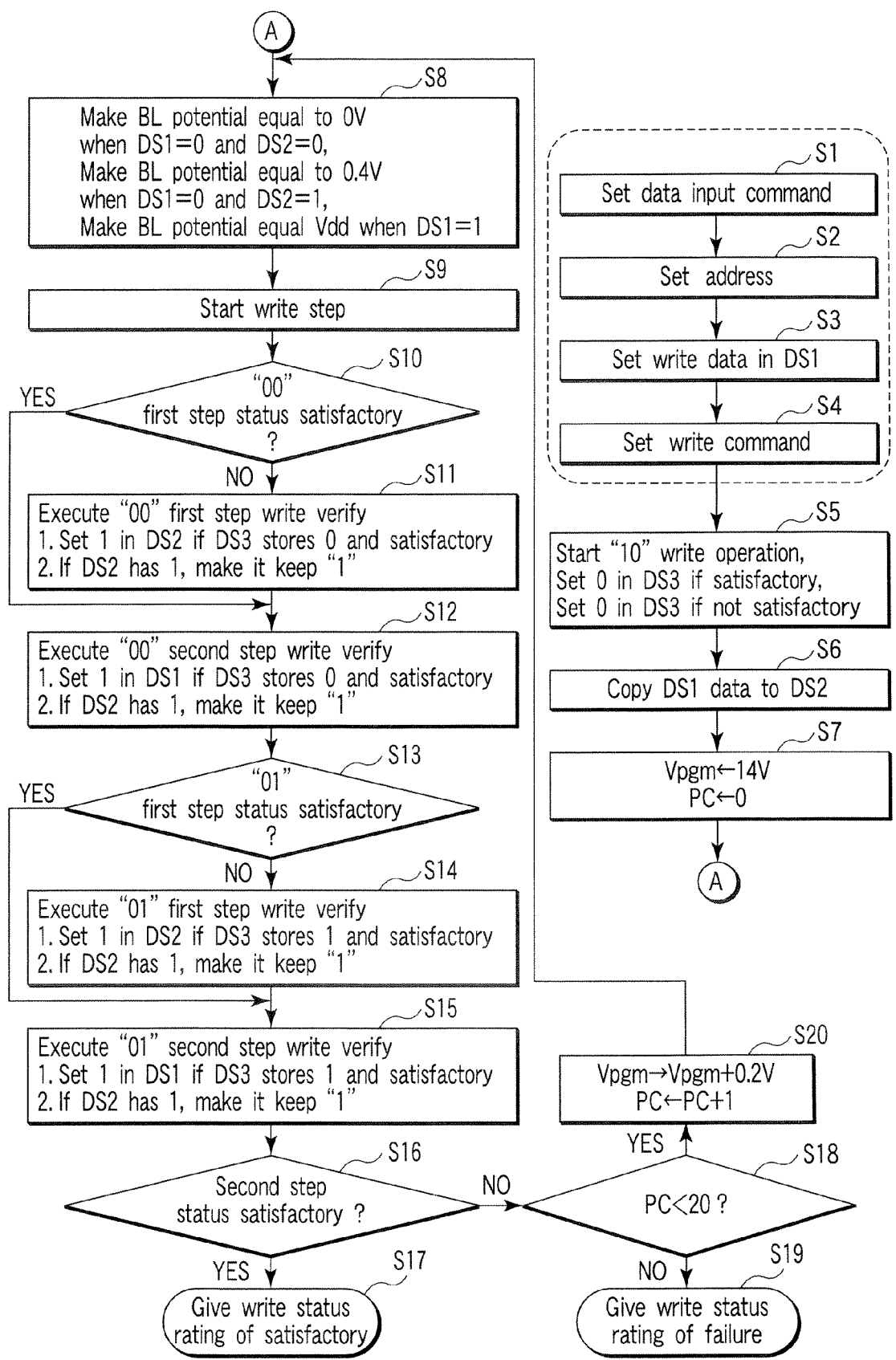
FIG. 13 is a flow chart showing a write algorithm of upper page data of the semiconductor integrated circuit device according to the first embodiment.

FIG. 13 is a diagram showing a write algorithm of upper page data to the same memory cell M.

First, for example, the command interface 7 receives a data input command from the host and sets the data input command in the state machine 8 (S1).

Next, for example, the command interface 7 receives address data from the host and sets an address to select a write page in the state machine 8 (S2).

Then, for example, the data input/output buffer 6 receives write data of one page and sets corresponding write data into the respective data storage sections DS1 (S3).

Next, for example, the command interface 7 receives a write command issued from the host and sets the write command in the state machine 8 (S4). After the write command is set, steps S5 to S20 are automatically started in the internal portion by the state machine 8.

First, the "10" read operation is started (S5). In the case of "pass" (when the memory cell is "10"), "0" is set into a corresponding one of the data storage sections DS3. If it is not "pass", "1" is set into a corresponding one of the data storage sections DS3.

Next, data of each data storage section DS1 is copied into a corresponding one of the data storage sections DS2 (S6). After this, the initial value of the write voltage Vpgm is set to 14V and the write counter PC is set to "0" (S7).

If data of the data storage section DS1 is "0" and data of the data storage section DS2 is "0", it is determined that the first-step write state is set. Therefore, the voltage of the bit line which is the write control voltage is set at 0V.

If data of the data storage section DS1 is "0" and data of the data storage section DS2 is "1", it is determined that the second-step write state is set. Therefore, the voltage of the bit line which is the write control voltage is set at 0.4V.

If data of the data storage section DS1 is "1", it is determined that the write inhibition state is set. Therefore, the voltage of the bit line which is the write control voltage is set at Vdd (S8).

Next, write pulses are applied to the memory cells of one page by use of the set write voltage Vpgm and write control voltage. That is, the write step is performed (S9).

Whether or not data items of all of the data storage sections DS2 in the data storage circuit 16 in which "0" is stored in the data storage section DS3 are "1" is detected. Then, if all of the data items are "1", it is determined that the "00" first-step status is "pass", and if not, it is determined that the above status is not "pass" (S10). As will be described later, if data items of all of the data storage sections DS2 are "1", there is no memory cell which is subjected to the "00" first-step write operation in the preceding write step (S9).

If the "00" first-step status is not "pass", the "00" first-step write verify operation is started (S11). Data of the data storage section DS2 corresponding to the memory cell in which the detection result is set to "pass" among the memory cells of one page and lying in the data storage circuit 16 in which data of the data storage section DS3 is "0" is changed from "0" to "1". If data of the data storage section DS2 is "1", the "1" data is maintained.

If the "00" first-step status is "pass" or when the "00" first-step write verify operation is terminated, the "00" second-step write verify operation is started (S12). Data of the data storage section DS1 corresponding to the memory cell in which the detection result is set to "pass" among the memory cells of one page and lying in the data storage circuit 16 in which data of the data storage section DS3 is "0" is changed from "0" to "1". If data of the data storage section DS1 is "1", the "1" data is maintained.

Next, whether data items of all of the data storage sections DS2 in the data storage circuit 16 in which data "1" is stored in the data storage section DS3 are "1" or not is detected. Then, if all of the data items are "1", it is determined that the "01" first-step status is "pass", and if not, it is determined that the above status is not "pass" (S13) As will be described later, if data items of all of the data storage sections DS2 are "1", there is no memory cell which is subjected to the "01" first-step write operation in the preceding write step (S9).

If the "01" first-step status is not "pass", the "01" first-step write verify operation is started (S14). Data of the data storage section DS2 corresponding to the memory cell in which the detection result is set to "pass" among the memory cells of one page and lying in the data storage circuit 16 in which data of the data storage section DS3 is "1" is changed from "0" to "1". If data of the data storage section DS2 is "1", the "1" data is maintained.

If the "01" first-step status is set to "pass" or the "01" write verify operation is terminated, the "01" second-step write verify operation is started (S15). Data of the data storage section DS1 corresponding to the memory cell in which the detection result is set to "pass" among the memory cells of one page and lying in the data storage circuit 16 in which data of the data storage section DS3 is "1" is changed from "0" to "1". If data of the data storage section DS1 is "1", the "1" data is maintained.

After the "01" second-step write verify operation, whether or not data items of all of the data storage sections DS1 are "1" is detected. Then, if all of the data items are "1", it is determined that the second-step status is "pass", and if not, it is determined that the above status is not "pass" (S16). If the second-step status is "pass", it is determined that the write operation is correctly performed, the write status is set to "pass" and the write operation is terminated (S17). If the second-step status is not "pass", the write counter PC is checked (S18). Then, if the count thereof is not smaller than 20, it is determined that the write operation could not be correctly performed, the write status is set to "fail" and the write operation is terminated (S19). If the count of the write counter PC is smaller than 20, the count of the write counter PC is incremented by one, the setting value of the write voltage Vpgm is increased by 0.2V (S20) and the process is returned to the write step S9 again after the step S8 is performed.

Table 5 shows the relation between data items before and after the "01" first-step write verify operation of the data storage sections DS1, DS2 and DS3 in the algorithm of writing upper page data to the same memory cell M shown in FIG. 12 and the threshold voltage of a corresponding memory cell.

TABLE 5

| | | Threshold voltage Vt of memory cell | |
|---|---|---|---|
| | | Lower than 1.2 V | Not lower than 1.2 V |
| Data DS1/DS2/DS3 before nth "01" first-step write verify | 0/0/1 | 0/0/1 | 0/1/1 |
| | 0/1/1 | 0/1/1 | 0/1/1 |
| | 1/1/1 | 1/1/1 | 1/1/1 |
| | 0/0/0 | 0/0/0 | 0/0/0 |
| | 0/1/0 | 0/1/0 | 0/1/0 |
| | 1/1/0 | 1/1/0 | 1/1/0 |

Data DS1/DS2/DS3 after the nth "01" first-step write verify

As shown in table 5, a value which can be set in the data storage sections DS1, DS2 and DS3 before the nth "01" first-step write verify operation is 0/0/1, 0/1/1, 1/1/1, 0/0/0, 0/1/0 or 1/1/0.

0/0/1 indicates that the threshold voltage of the memory cell does not reach the "01" first-step write verify voltage until the (n−1)th write step.

0/1/1 indicates that the threshold voltage of the memory cell has reached the "01" first-step write verify voltage, but does not reach the "01" second-step write verify voltage until the (n−1)th write step.

1/1/1 indicates that the threshold voltage of the memory cell has reached the "01" second-step write verify voltage until the (n−1)th write step.

Since there occurs no possibility that the threshold voltage of the memory cell has reached the "01" second-step write verify voltage, but does not reach the "01" first-step write verify voltage until the (n−1)th write step, the state of 1/0/1 is not provided in this example.

The detection result in the "01" first-step write verify operation is not "pass" if the threshold voltage of the memory cell does not reach 1.2V which is the "01" first-step write verify voltage in the nth write step. In this case, data of the data storage section DS2 is kept unchanged.

The detection result in the "01" first-step write verify operation is "pass" if the threshold voltage of the memory cell has reached 1.2V which is the "01" first-step write verify voltage in the nth write step. In this case, data of the data storage section DS2 is changed to "1". Data of the data storage section DS2 which is "1" is kept unchanged irrespective of the threshold voltage of the memory cell. Further, 0/0/0, 0/1/0, 1/1/0 are not objects to be subjected to the "01" first-step write verify operation, and therefore, they are kept unchanged.

Table 6 shows the relation between data items before and after the "01" second-step write verify operation of the data storage sections DS1, DS2 and DS3 in the algorithm of writing upper page data to the same memory cell M shown in FIG. 13 and the threshold voltage of a corresponding memory cell.

TABLE 6

| | | Threshold voltage Vt of memory cell | |
|---|---|---|---|
| | | Lower than 1.4 V | Not lower than 1.4 V |
| Data DS1/DS2/DS3 before nth "01" second-step write verify | 0/0/1 | 0/0/1 | — |
| | 0/1/1 | 0/1/1 | 1/1/1 |
| | 1/1/1 | 1/1/1 | 1/1/1 |
| | 0/0/0 | 0/0/0 | 0/0/0 |
| | 0/1/0 | 0/1/0 | 0/1/0 |
| | 1/1/0 | 1/1/0 | 1/1/0 |

Data DS1/DS2/DS3 after the nth "01" second-step write verify

As shown in table 6, a value which can be set in the data storage sections DS1, DS2 and DS3 before the nth "01" second-step write verify operation is 0/0/1, 0/1/1, 1/1/1, 0/0/0, 0/1/0 or 1/1/0.

0/0/1 indicates that the threshold voltage of the memory cell does not reach the "01" first-step write verify voltage after the nth write step.

0/1/1 indicates that the threshold voltage of the memory cell has reached the "01" first-step write verify voltage until the nth write step, but the threshold voltage of the memory cell does not reach the "01" second-step write verify voltage until the (n−1)th write step.

1/1/1 indicates that the threshold voltage of the memory cell has reached the "01" second-step write verify voltage until the (n−1)th write step.

The detection result in the "01" second-step write verify operation is not "pass" if the threshold voltage of the memory cell does not reach 1.4V which is the "01" second-step write verify voltage in the nth write step. In this case, data of the data storage section DS1 is kept unchanged.

The detection result in the "01" second-step write verify operation is "pass" if the threshold voltage of the memory cell has reached 1.4V which is the "01" second-step write verify voltage in the nth write step. In this case, data of the data storage section DS1 is changed to "1". Data of the data storage section DS1 which is "1" is kept unchanged irrespective of the threshold voltage of the memory cell. 0/0/1 is not changed by the "01" second-step write verify operation. Further, 0/0/0, 0/1/0, 1/1/0 are not objects to be subjected to the "01" second-step write verify operation, and therefore, they are kept unchanged.

Table 7 shows the relation between data items before and after the "00" first-step write verify operation of the data storage sections DS1, DS2 and DS3 in the algorithm of writing upper page data to the same memory cell M shown in FIG. 13 and the threshold voltage of a corresponding memory cell.

TABLE 7

|  | | Threshold voltage Vt of memory cell | |
|---|---|---|---|
|  | | Lower than 2.2 V | Not lower than 2.2 V |
| Data | 0/0/1 | 0/0/1 | — |
| DS1/DS2/DS3 | 0/1/1 | 0/1/1 | — |
| before nth "00" | 1/1/1 | 1/1/1 | — |
| first-step | 0/0/0 | 0/0/0 | 0/1/0 |
| write verify | 0/1/0 | 0/1/0 | 0/1/0 |
|  | 1/1/0 | 1/1/0 | 1/1/0 |

Data DS1/DS2/DS3 after the nth "00" first-step write verify

As shown in table 7, a value which can be set in the data storage sections DS1, DS2 and DS3 before the nth "00" first-step write verify operation is 0/0/1, 0/1/1, 1/1/1, 0/0/0, 0/1/0 or 1/1/0.

0/0/0 indicates that the threshold voltage of the memory cell does not reach the "00" first-step write verify voltage until the (n−1)th write step.

0/1/0 indicates that the threshold voltage of the memory cell has reached the "00" first-step write verify voltage until the (n−1)th write step, but does not reach the "00" second-step write verify voltage.

1/1/0 indicates that the threshold voltage of the memory cell has reached the "00" second-step write verify voltage until the (n−1)th write step.

Since there occurs no possibility that the threshold voltage of the memory cell has reached the "00" second-step write verify voltage until the (n−1)th write step, but does not reach the "00" first-step write verify voltage, the state of 1/0/0 is not provided in this example.

The detection result in the "00" first-step write verify operation is not "pass" if the threshold voltage of the memory cell does not reach 2.2V, which is the "00" first-step write verify voltage in the nth write step. In this case, data of the data storage section DS2 is kept unchanged.

Since the detection result in the "00" first-step write verify operation is "pass" if the threshold voltage of the memory cell has reached 2.2V, which is the "00" first-step write verify voltage in the nth write step, data of the data storage section DS2 is changed to "1". Data of the data storage section DS2 which is "1" is kept unchanged irrespective of the threshold voltage of the memory cell. Further, 0/0/1, 0/1/1, 1/1/1 are not objects to be subjected to the "01" first-step write verify operation and are kept unchanged.

Table 8 shows the relation between data items before and after the "00" second-step write verify operation of the data storage sections DS1, DS2 and DS3 in the write algorithm of upper page data to the same memory cell M shown in FIG. 12 and the threshold voltage of a corresponding memory cell.

TABLE 8

|  | | Threshold voltage Vt of memory cell | |
|---|---|---|---|
|  | | Lower than 2.4 V | Not lower than 2.4 V |
| Data | 0/0/1 | 0/0/1 | — |
| DS1/DS2/DS3 | 0/1/1 | 0/1/1 | — |
| before nth "00" | 1/1/1 | 1/1/1 | — |
| second-step | 0/0/0 | 0/0/0 | — |
| write verify | 0/1/0 | 0/1/0 | 1/1/0 |
|  | 1/1/0 | 1/1/0 | 1/1/0 |

Data DS1/DS2/DS3 after the nth "00" second-step write verify

As shown in table 8, a value which can be set in the data storage sections DS1, DS2 and DS3 before the nth "00" second-step write verify operation is 0/0/1, 0/1/1, 1/1/1, 0/0/0, 0/1/0 or 1/1/0.

0/0/0 indicates that the threshold voltage of the memory cell does not reach the "00" first-step write verify voltage after the nth write step.

0/1/0 indicates that the threshold voltage of the memory cell has reached the "00" first-step write verify voltage until the nth write step, but the threshold voltage of the memory cell does not reach the "00" second-step write verify voltage until the (n−1)th write step.

1/1/0 indicates that the threshold voltage of the memory cell has reached the "00" second-step write verify voltage until the (n−1)th write step.

Since there occurs no possibility that the threshold voltage of the memory cell has reached the "00" second-step write verify voltage until the (n−1)th write step, but the threshold voltage of the memory cell does not reach the "00" first-step write verify voltage until the nth write step, the state of 1/0/0 is not provided in this example.

The detection result in the "00" second-step write verify operation is not "pass" if the threshold voltage of the memory cell does not reach 2.4V which is the "00" second-step write verify voltage in the nth write step. In this case, data of the data storage section DS1 is kept unchanged.

The detection result in the "00" second-step write verify operation is "pass" if the threshold voltage of the memory cell has reached 2.4V which is the "00" second-step write verify voltage in the nth write step. In this case, data of the data storage section DS1 is changed to "1". Data of the data storage section DS1 which is "1" is kept unchanged irrespective of the threshold voltage of the memory cell. 0/0/0 is not changed by the "00" second-step write verify operation. Further, 0/0/1, 0/1/1, 1/1/1 are not objects to be subjected to the "00" second-step write verify operation, and therefore, they are kept unchanged.

Figure 14A:
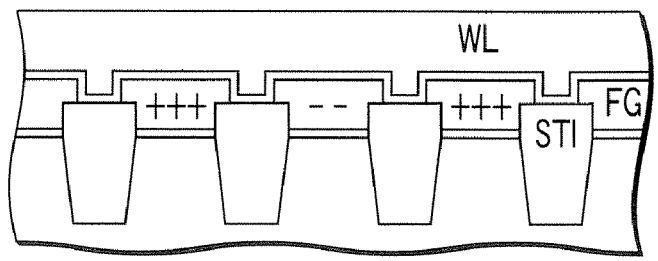
FIGS. 14A to 14C are views and a diagram showing situations caused by miniaturization of the processing dimensions.
Figure 14B:
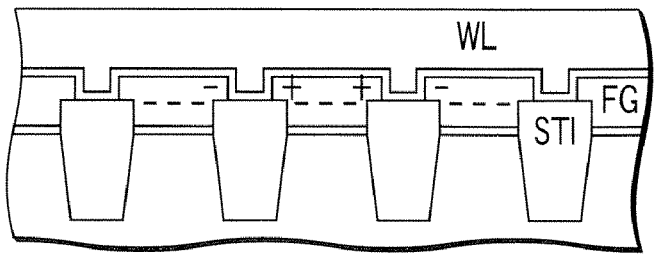
Figure 14C:
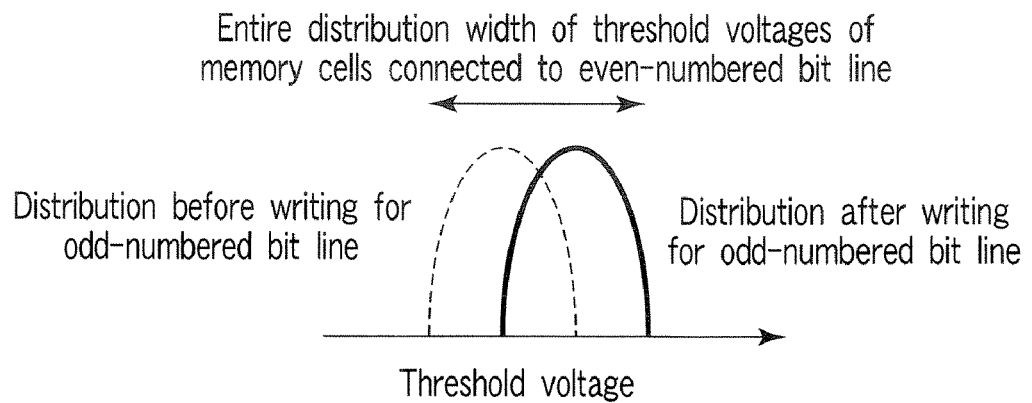

FIGS. 14A to 14C are views and a diagram showing states caused by miniaturization of the processing dimensions of a multi-level flash memory.

FIG. 14A shows a state of charges of the floating gate FG after the write operation is performed for the even-numbered bit line BLe after erasing.

Electrons (−) are charged in the floating gate FG of the memory cell M subjected to the write operation. After this, if the write operation is performed for the odd-numbered bit line BLo, a variation occurs in the state of the floating gate FG of the memory cell M connected to the even-numbered bit line BLe as shown in FIG. 14B. The potential of the even-numbered memory cell M is lowered by the electrostatic capacitive coupling between the adjacent floating gates FG and the threshold voltage is increased as shown in FIG. 14C.

In the above conditions, the technique for narrowing the threshold voltage distribution width becomes extremely important in the future.

Figure 15:
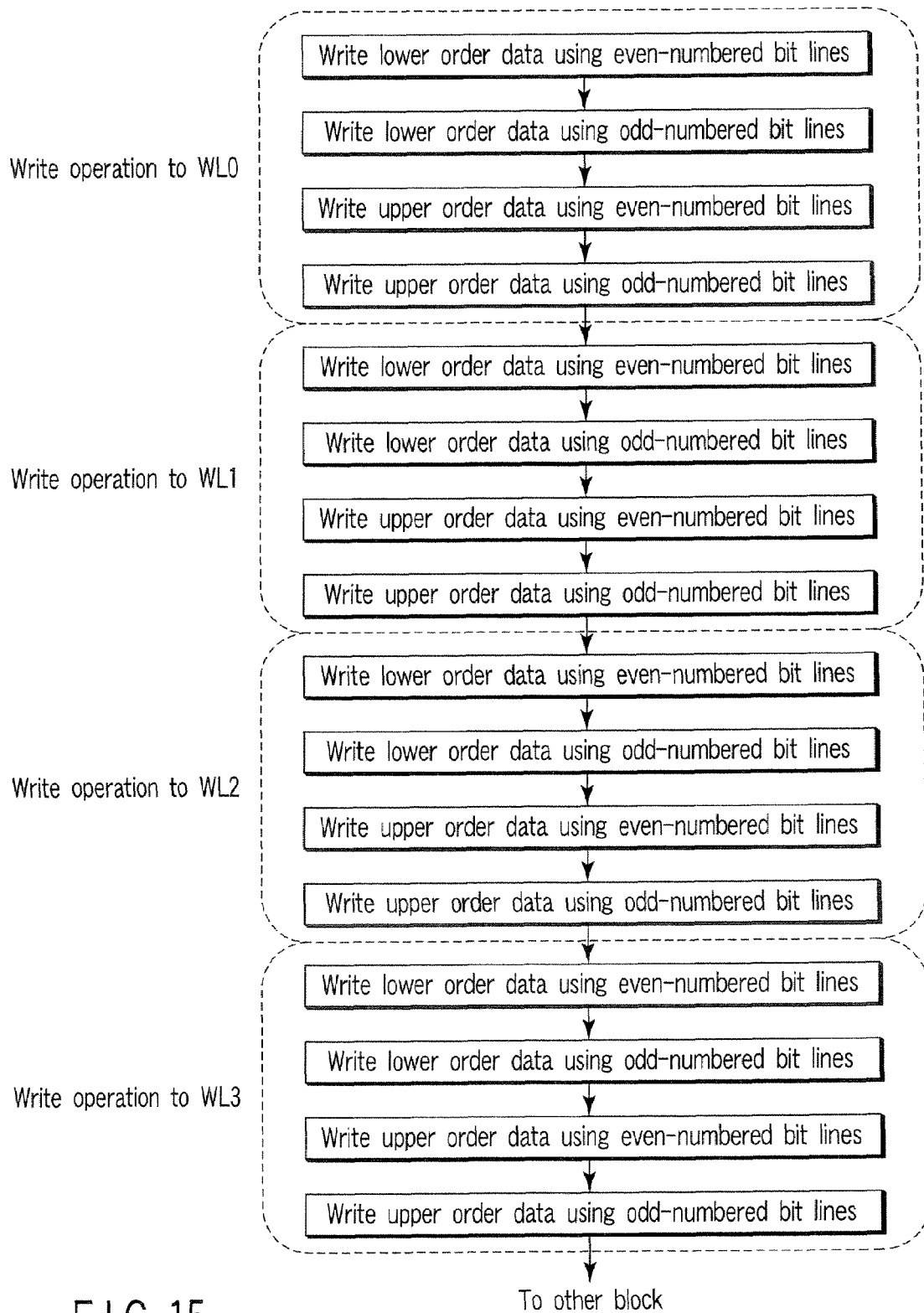
FIG. 15 is a diagram showing an order of write operations in the blocks.

FIG. 15 is a diagram showing a write order in the blocks.

First, a word line WL0 is selected and lower data is written into one page configured by the memory cells M connected to the even-numbered bit lines. Then, lower data is written to one page configured by the memory cells M connected to the odd-numbered bit lines. Thirdly, upper data is written to one page configured by the memory cells M connected to the even-numbered bit lines and, finally, upper data is written to one page configured by the memory cells M connected to the odd-numbered bit lines. After this, the word lines WL1, WL2, WL3 are selected and the write operation is performed in the same manner.

Thus, interference between the adjacent floating gates can be suppressed to minimum. That is, the state of the memory cell M to be subjected to the write operation later is not transited from "11" to "00" even if the state thereof is transited from "11" to "10", from "11" to "01" or from "10" to "00". Transition from "11" to "00" causes the threshold voltage of the adjacent memory cell to be most extremely raised.

Figure 16:
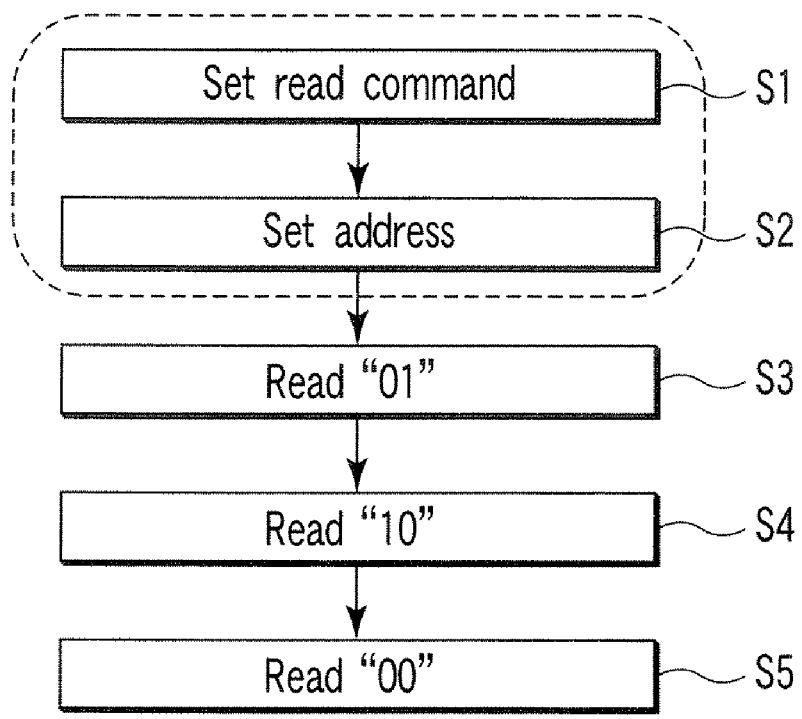
FIG. 16 is a diagram showing a read algorithm of lower page data of the semiconductor integrated circuit device according to the first embodiment.

FIG. 16 is a diagram showing a read algorithm of lower page data of the same memory cell M.

First, for example, the command interface 7 receives a read command from the host and sets the read command in the state machine 8 (S1). Next, the command interface 7 receives address data from the host and sets an address to select a read page in the state machine 8 (S2). Thus, the address is set and steps S3 to S5 are automatically started in the internal portion by the state machine 8.

First, the "01" read operation is started (S3). The result of reading is stored in a corresponding data storage section DS3. Next, the "10" read operation is started (S4) and the result of reading is stored in a corresponding data storage section DS2. Finally, the "00" read operation is started (S5) and lower page data is subjected to the logical operation based on data of the data storage sections DS2 and DS3 corresponding to the read result and stored in a corresponding data storage section DS1. The data of the data storage section DS1 is externally output.

Figure 17:
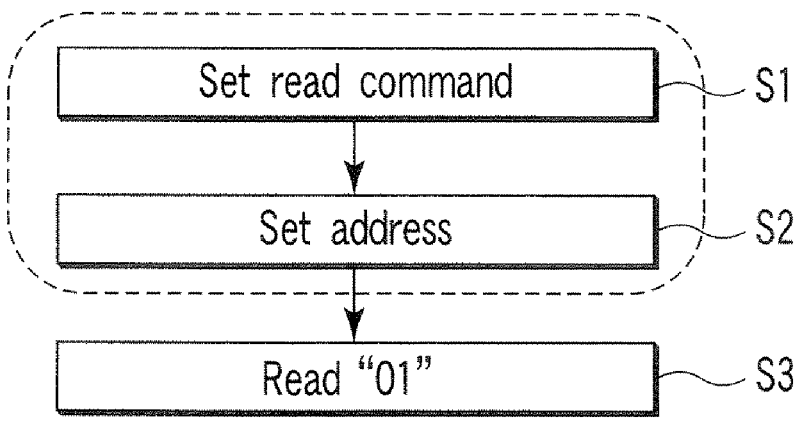
FIG. 17 is a diagram showing a read algorithm of upper page data of the semiconductor integrated circuit device according to the first embodiment.

FIG. 17 is a diagram showing a read algorithm of upper page data of the same memory cell M.

First, for example, the command interface 7 receives a read command from the host and sets the read command in the state machine 8 (S1). Next, the command interface 7 receives address data from the host and sets an address to select a read page in the state machine 8 (S2). Thus, the address is set and step S3 is automatically started in the internal portion by the state machine 8.

The "01" read operation is started (S3). The read result is upper page data and is stored in a corresponding data storage section DS1. The data of the data storage section DS1 is externally output.

Figure 18B:
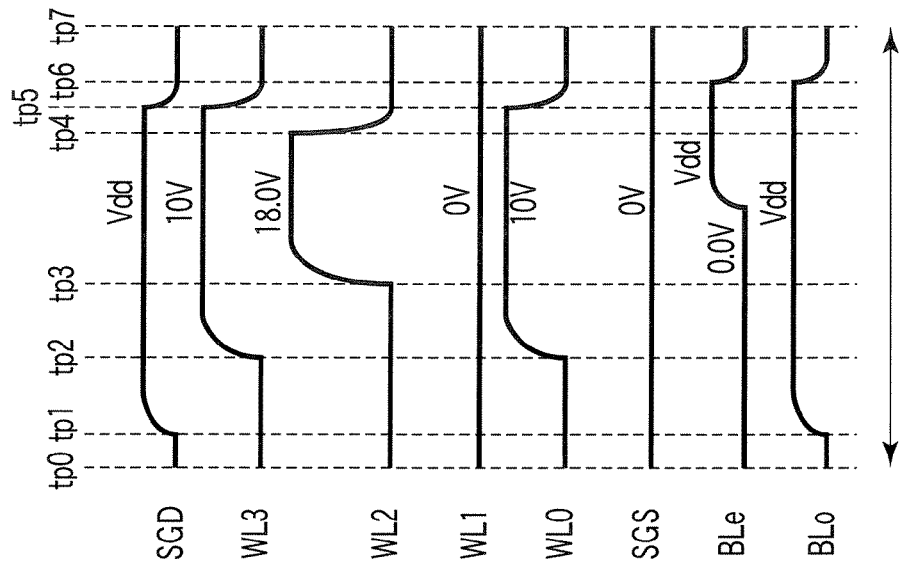
FIG. 18B is an operation waveform diagram showing a write step example 2.
Figure 18A:
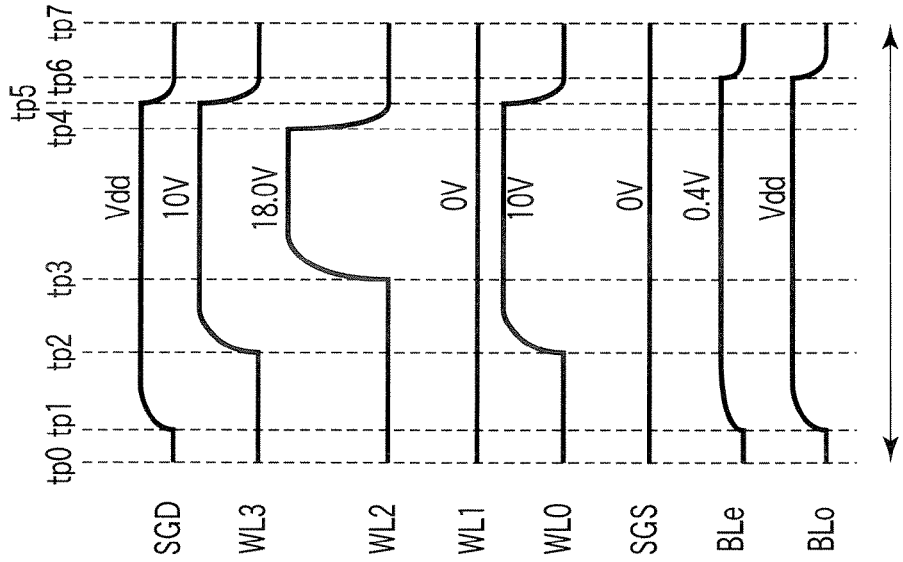
FIG. 18A is an operation waveform diagram showing a write step example 1.

FIG. 18A is an operation waveform diagram showing a write step example 1 shown in FIG. 11. FIG. 18B is an operation waveform diagram showing a write step example 2.

As shown in FIG. 18B, voltage VBL of the bit line BL which is the write control voltage is not set to 0.4V, but is set and kept at 0V for a preset period by applying the write voltage Vpgm to a selected word line WL and is then set at Vdd to inhibit the write operation. As a result, the effective write pulse width is reduced, a rise in the threshold voltage is suppressed and the same effect as that obtained when the voltage VBL of the bit line BL which is the write control voltage is set to 0.4V can be obtained.

Figure 19:
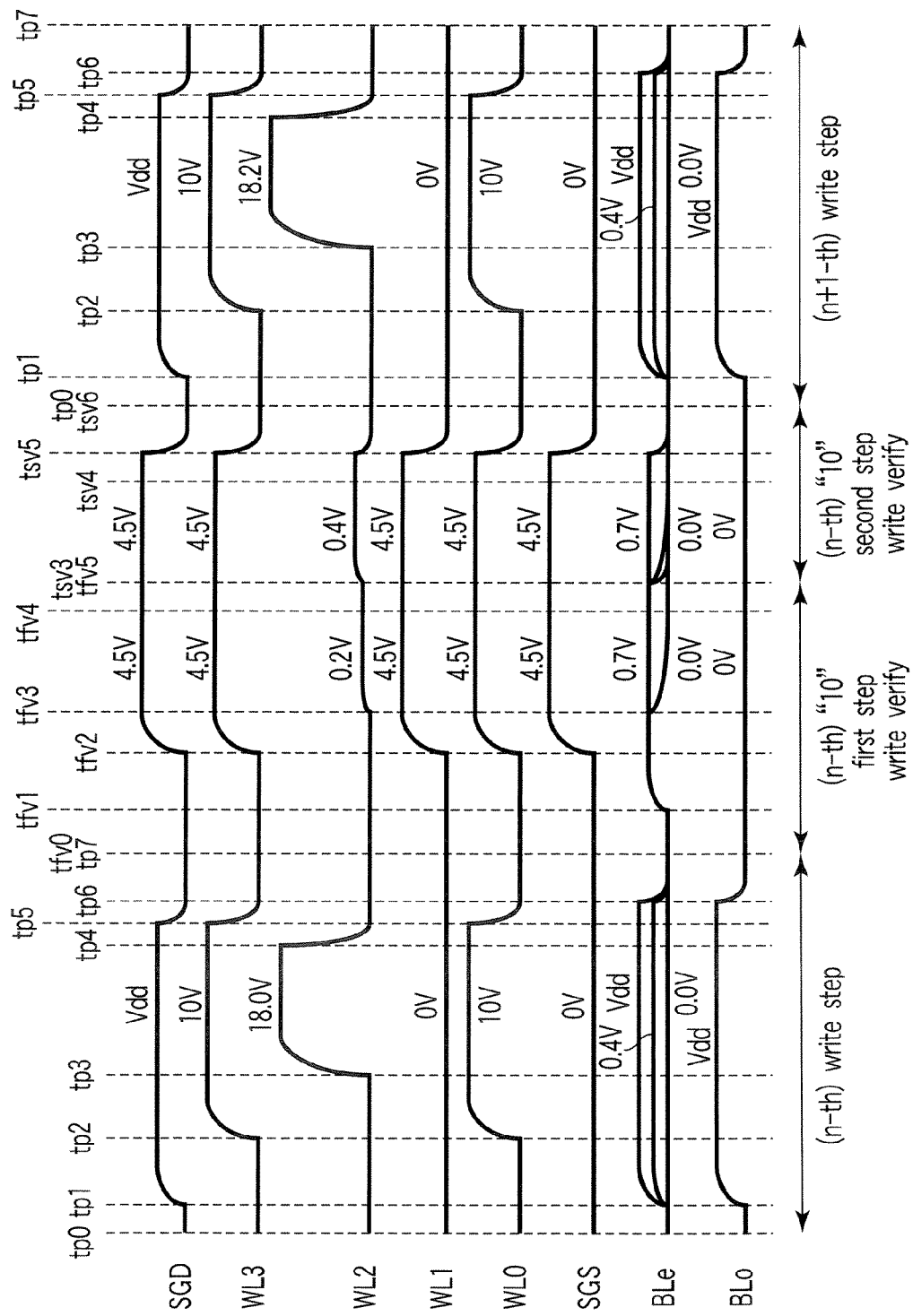
FIG. 19 is an operation waveform diagram showing a modification of write verify.

FIG. 19 is an operation waveform diagram showing a modification of the write verify operation shown in FIG. 11.

As shown in FIG. 19, at the time of first-step write verify, first, the bit line BLe is charged to 0.7V. After this, when the potential of the selected word line WL2 reaches the first-step write verify voltage or if the threshold voltage of the memory cell M reaches the first-step write verify voltage, 0.7V is maintained. Further, if the threshold voltage of the memory cell M does not reach the first-step write verify voltage, the voltage is lowered towards 0V. If the voltage of the bit line BLe is detected at the timing tfv4, whether or not the threshold voltage of the memory cell M reaches the first-step write verify voltage can be detected. If the threshold voltage of the memory cell M reaches the write verify voltage, the detection result is "pass".

After this, the voltage of the selected word line WL2 is switched from the first-step write verify voltage to the second-step write verify voltage at the timing tfv5 or at the same timing tsv3. If the threshold voltage of the memory cell M reaches the second-step write verify voltage, 0.7V is maintained. Further, if the threshold voltage of the memory cell M does not reach the second-step write verify voltage, the voltage is lowered towards 0V. If the voltage of the bit line BLe is detected at the timing tsv4, whether or not the threshold voltage of the memory cell M reaches the second-step write verify voltage can be detected. If the threshold voltage of the memory cell M reaches the write verify voltage, the detection result is "pass".

Thus, the charging time of the bit line at the time of second-step write verify can be omitted and the write operation can be more rapidly performed. The "01" or "00" first-step or second-step write verify operation can be performed in the same manner simply by changing the write verify voltage.

The semiconductor integrated circuit device according to this example further includes the following configuration.

Figure 20:
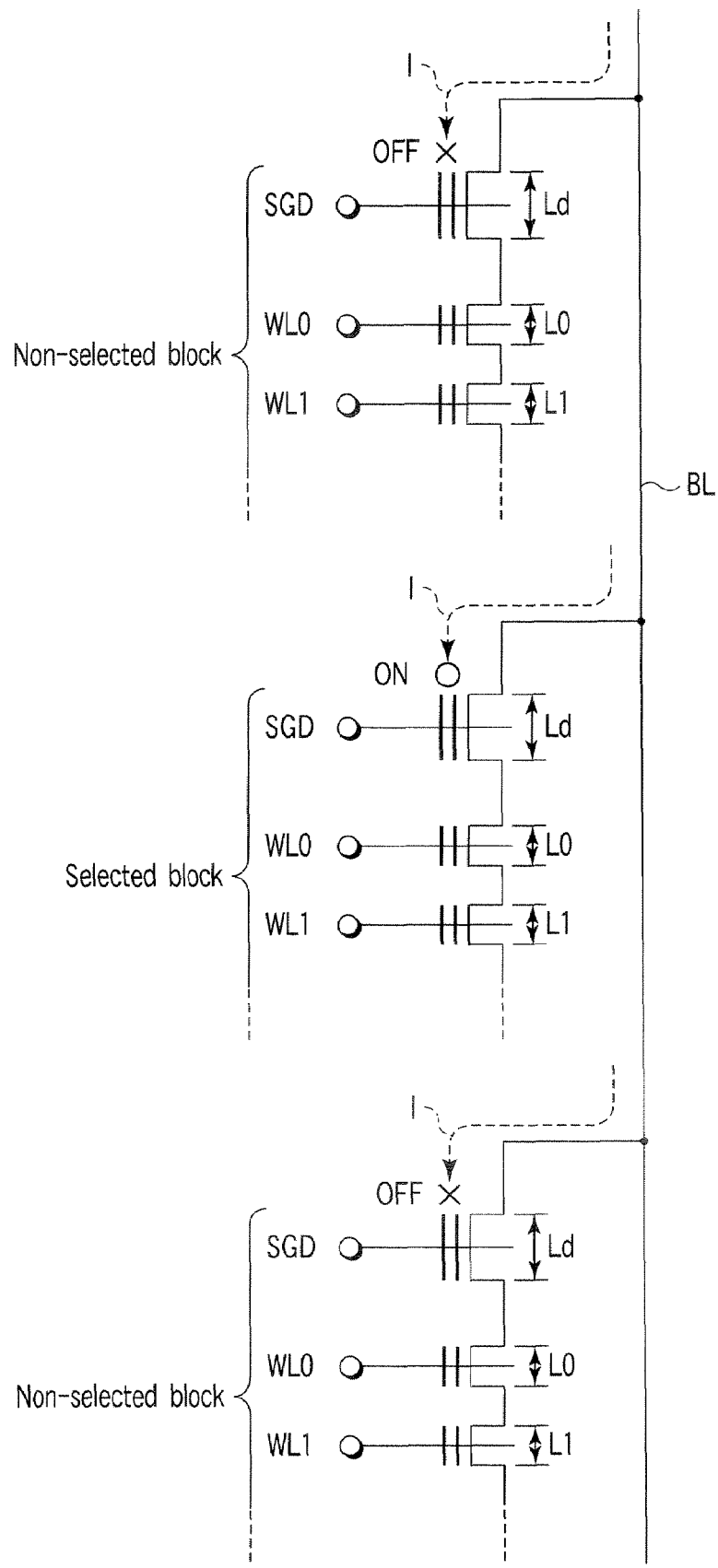
FIG. 20 is a diagram showing the state of the blocks at the write time or read time.

FIG. 20 is a diagram showing the state of the blocks at the write time or read time and FIG. 21 is an equivalent circuit diagram showing one example of a NAND memory unit of the present example.

The bit line BL is biased to certain potential at the write time or read time. In the selected block, the selection transistor STD is turned ON and, in the non-selected block, the selection transistor STD is turned OFF. At this time, the selection transistor STD of the non-selected block must be sufficiently turned OFF so as to prevent a current I from leaking from the bit line BL. If the current I leaks from the bit line BL via the non-selected block, the bias potential of the bit line BL is lowered. This may cause an erroneous writing or erroneous readout operation. In order to suppress the above problem, the gate length Ld of the selection transistor STD is set to such length as to sufficiently cut off the transistor. For example, the length is set to such length which does not cause a punch-through phenomenon or the like.

As shown in FIG. 21, the gate length L of the memory cell M can be set shorter than the gate length Ld of the selection transistor STD. According to this logic, the gate length Lx (in this example, x=0 to 31) of the memory cell M of this example is set shorter than the gate length Ld of the selection transistor STD. One example is a length set to the minimum value which can maintain the reliability in design terms. As a result, the integration density can be enhanced.

Thus, the following event frequently occurs in the NAND memory unit in which the relation of Lx≠Ld, for example, Lx<Ld is set.

Figure 22:
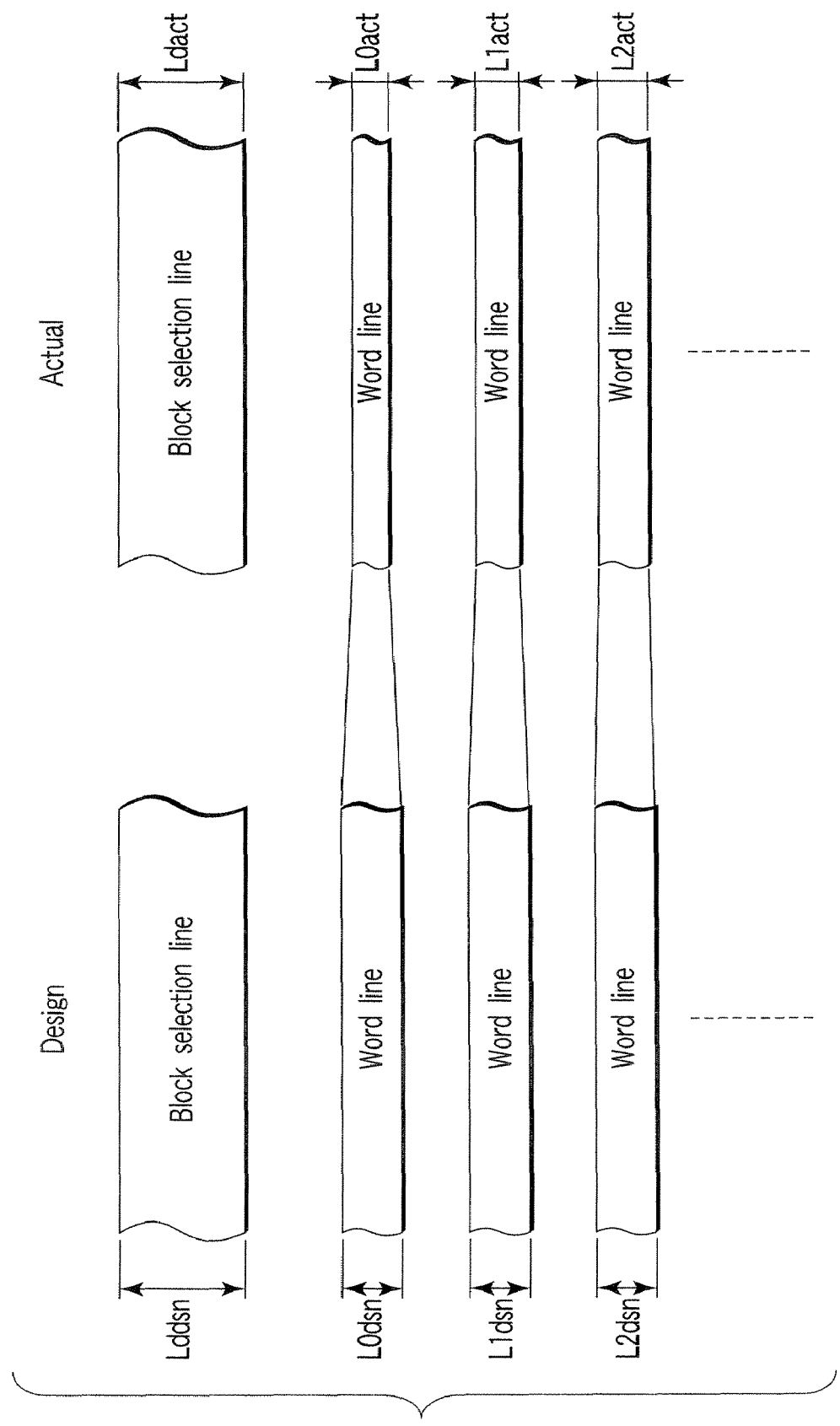
FIG. 22 is a diagram showing the relation between the gate length of the memory cell in design terms and the actual gate length of the memory cell.
Figure 23:
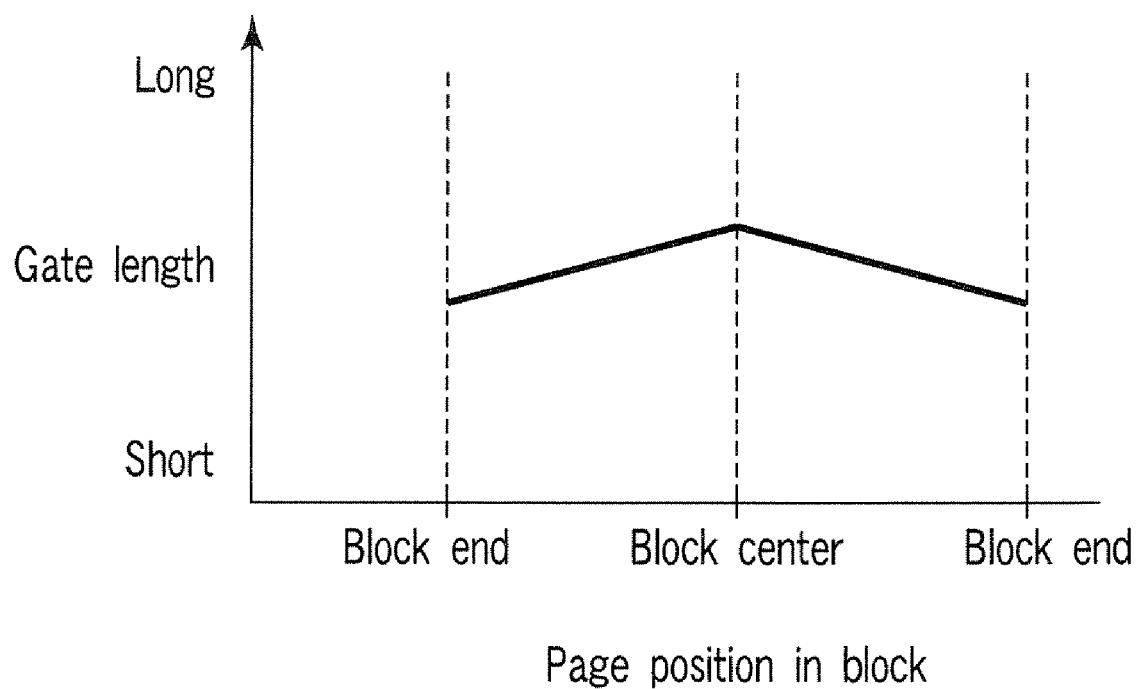
FIG. 23 is a diagram showing the relation between the page position in the block and the gate length.

FIG. 22 is a diagram showing the relation between the gate length (the width of the block selection line) of the selection transistor STD in design terms and the gate length (the width of the word line) of the memory cell M, and the actual gate length of the selection transistor STD and the actual gate length of the memory cell M. FIG. 23 is a diagram showing the relation between the page position in the block and the gate length and FIG. 24 is an equivalent circuit diagram showing one example of an actual equivalent circuit of the NAND memory unit.

As shown in FIG. 22, for the gate lengths Lxdsn of the memory cells M in design terms, the relation of L0dsn=L1dsn=L2dsn . . . is set. However, when memory cells are actually formed on the semiconductor chip, the relation of L0act≠L1act≠L2act . . . is attained for the gate lengths Lnact of the memory cells M. For example, in a NAND memory unit in which the gate lengths are set to have the relation of Lxdsn<Lddsn, the gate lengths of the memory cells M are set to satisfy the relation of L0act<L1act<L2act For example, as shown in FIG. 23, the gate length of the memory cell M (block-end page) lying nearest to the selection transistor STD is the smallest and the gate lengths become gradually larger towards the center of the block. As shown in the present example, in the case of the gate length Ld=Ls, the gate length of the memory cell M (block-center page) lying near the center of the block is the largest and the gate lengths become gradually smaller towards the selection transistor STS. Like the memory cell lying nearest to the selection transistor STD, the gate length of the memory cell M (the other block-end page) nearest to the selection transistor STS becomes the smallest, for example. As a result, a circuit shown in FIG. 24 can be obtained as the actual equivalent circuit of the NAND memory unit.

The variation in the gate length has a relation to lithography, and one of the reasons lies in that the word line pattern is influenced by a block selection line pattern which is wider than the word line pattern. The influence given to the NAND memory unit by the variation in the gate length L causes the data holding characteristics to differ between the block-end page and block-center page. For example, the data holding characteristic of the block-end page is degraded in comparison with that of the block-center page.

In the first embodiment, the threshold voltage of the memory cell can be variably set. As one setting example, in the present example, the threshold voltage is variably set depending on whether the selected address corresponds to the block-end page or the other page (which is called a block-intermediate page in this specification).

The setting example is to set the level of the highest write threshold voltage in the block-end page lower than that in the block-intermediate page. The holding characteristic of data corresponding to the highest write threshold voltage is not as good as that of data corresponding to the low write threshold voltage. Therefore, the level of the highest write threshold voltage is lowered. Thus, the holding characteristic in the block-end page can be suppressed from being further degraded. One example of the method is to set the verify voltage in the block-end page lower than the verify voltage in the block-intermediate page at the write time. The level of the highest write threshold voltage can be lowered by lowering the verify voltage.

Further, in this example, the distribution width (Vthmin−Vthmax) of the write threshold voltage of the block-end page is made narrower than the distribution width (Vthmin−Vthmax) of the write threshold voltage of the block-intermediate page. One example of the method is to make the step-up width in the block-end page smaller than the step-up width in the block-intermediate page at the write time. The distribution widths of the threshold voltages corresponding to respective data items can be narrowed by reducing the step-up width. Further, the distribution width (Vthmin−Vthmax) of the write threshold voltage is narrowed by lowering the verify voltage as described above. As the distribution width of the write threshold voltage becomes narrower, the level of the highest write threshold voltage is further lowered. Then, the data holding characteristic is further improved. One example of the threshold distribution of the memory cell indicating the above state is shown in FIG. 25.

Figure 25:
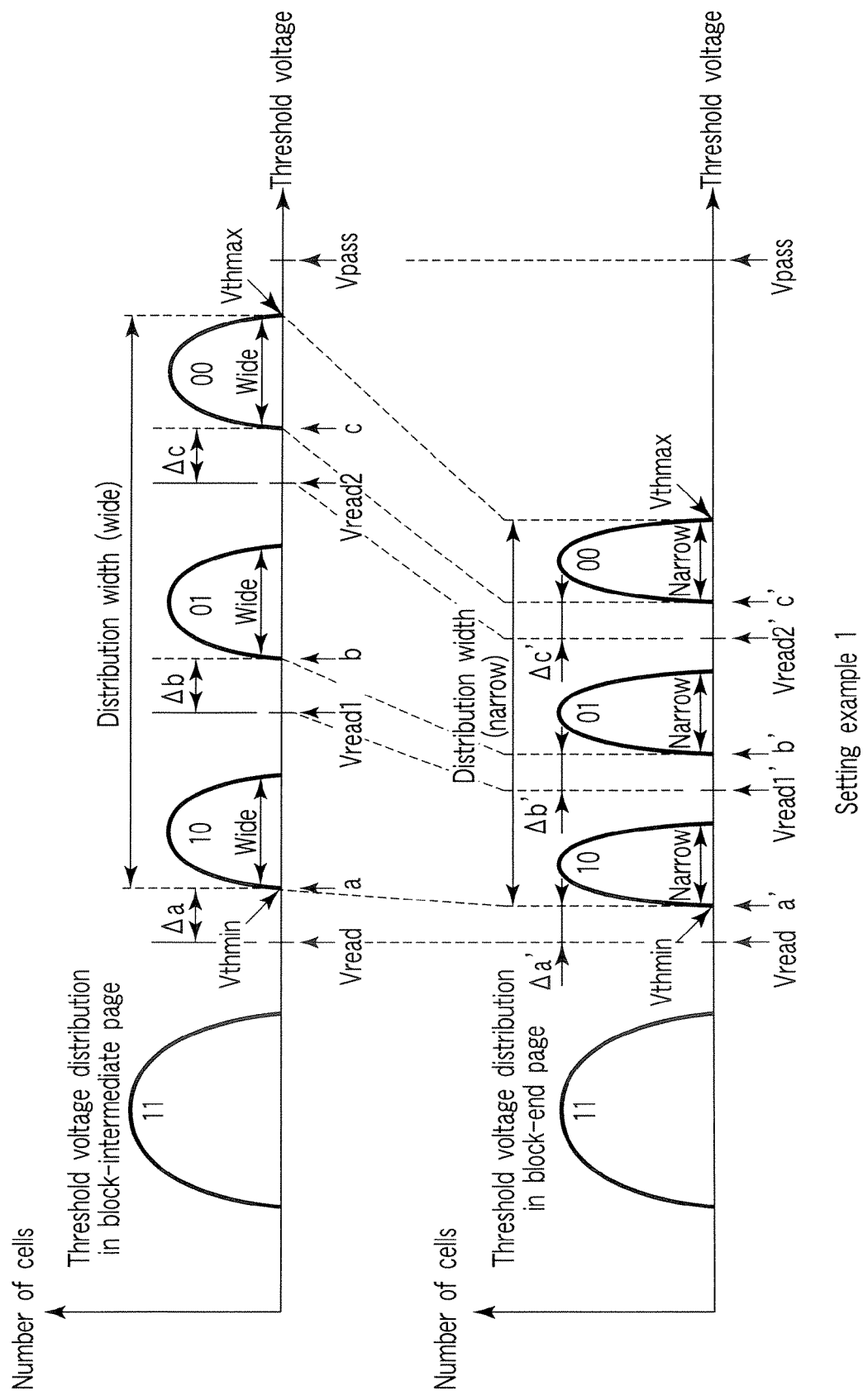
FIG. 25 is a diagram showing a setting example 1 of the threshold voltage.

FIG. 25 is a diagram showing a setting example 1 of the threshold voltage.

As shown in FIG. 25, the verify voltages in the block-intermediate page are set to "a", "b", "c". On the other hand, the verify voltages in the block-end page are set to "a'", "b'", "c'". The relation is set to a'<a, b'<b, c'<c. As a result, the level of the highest write threshold voltage is lowered as is seen in data "00". Further, since the step-up width is made narrower, the threshold voltage distribution width corresponding to each data is narrowed.

Thus, in this example, settings of the threshold voltage in the block-end page and the threshold voltage in the block-intermediate page are changed.

Further, if the threshold voltage is set as shown in FIG. 25, the read voltage used for readout of data in the block-intermediate page cannot be used for readout of data in the block-end page in some cases. In the example shown in FIG. 25, for example, the read voltage Vread1 lies between data "10" and data "01", but in the block-end page, it lies in data "01". This state causes erroneous readout. In order to suppress occurrence of the above state, the read voltage for the block-end page and the read voltage for the block-intermediate page can be changed. In the example shown in FIG. 25, the read voltages for the block-intermediate page are set to Vread1, Vread2. Further, the read voltages for the block-end page are set to Vread1', Vread2'. The relation is set to Vread1'<Vread1 and Vread2'<Vread2. By thus setting the relation, occurrence of erroneous readout can be suppressed.

Further, by variably setting the threshold voltage, the following advantages can be attained.

For example, even if a variation occurs in the gate length L (word line width) shown in FIG. 22, the write operation for the block-end page shown in FIG. 25 may be performed for all of the pages. The write operation is a method to reduce the step-up width, for example. To reduce the step-up width is to carefully write data bit by bit. That is, it takes a long time for writing.

On the other hand, the data holding characteristic for the block-intermediate page is better than that for the block-end page. Therefore, data can be roughly written in the block-intermediate page in comparison with the block-end page. For example, the step-up width can be increased. If the step-up width is increased, the time required for writing can be reduced in comparison with a case wherein the step-up width is small. Since the data holding characteristic for the block-intermediate page is better than that of the block-end page, the write threshold voltage distribution width (Vthmin–Vthmax) may be kept large. Therefore, the step-up width can be enlarged.

In this example, the step-up width can be changed according to the characteristic for each word line, for example, for each page. As in the present example, the advantage that both of the requirement for enhancing the data holding characteristic and the requirement for enhancing the operation speed can be satisfied can be attained by making setting of the threshold voltage variable.

To change the verify voltage, change the step-up width and change the read voltage is to change voltage applied to the word line WL, for example. Examples of a voltage variable circuit which can change voltage applied to the word line WL are shown in FIGS. 26, 27.

FIG. 26 is a circuit diagram showing a first example of a voltage variable circuit.

As shown in FIG. 26, a booster circuit 21 generates a boosted potential. The boosted potential is supplied to the word line WL, for example. Variable resistors 25, 27 are serially connected between a boosted voltage generating end 23 and an in-circuit ground potential Vss. The potential of a connection node 29 of the variable resistors 25 and 27 is input to the minus input terminal of a differential amplifier 31, for example. Reference potential Vref is input to the plus input terminal of the differential amplifier 31, for example. For example, the reference potential Vref is generated by a band-gap reference circuit. One example of the potential is 1V.

The resistance division ratio of the connection node 29 is changed by use of the variable resistors 25, 27. Then, the input potential of the minus input terminal of the differential amplifier 31 is changed. The differential amplifier 31 compares the input potential with the reference potential Vref and changes the output level according to the difference therebetween. An output of the differential amplifier 31 is utilized for operation control of the booster circuit 21 and is used to control the ON/OFF state of the booster circuit 21 or adjust and control the boosting ability of the booster circuit, for example. The booster circuit 21 is ON/OFF-controlled or the boosting ability thereof is adjusted according to the output of the differential amplifier 31 and it can change the level of the boosted potential generated.

FIG. 27 is a circuit diagram showing a second example of the voltage variable circuit.

The circuit shown in FIG. 27 is a circuit which outputs boosted potential via the source of a P-channel MOSFET 33 and uses the output potential as a potential for the word line, for example. Variable resistors 37, 39 are serially connected between an output node 35 and an in-circuit ground potential Vss. The potential of a connection node 41 of the variable resistors 37 and 39 is input to the minus input terminal of a differential amplifier 43, for example. Reference potential Vref is input to the plus input terminal of the differential amplifier 43, for example. Like the first circuit example, the resistance division ratio of the connection node 41 is changed by use of the variable resistors 37, 39 so as to change the output level of the differential amplifier 43. The output of the differential amplifier 31 is supplied to the gate of the P-channel MOSFET 33. Thus, the potential of the output node 35 can be changed according to the output level of the differential amplifier 43.

The setting contents of the threshold voltage, for example, the setting contents of the word line voltage can be stored in nonvolatile memory cells, for example. As the nonvolatile memory cells used in this case, memory cells which are provided separately from the memory cell array and provided in a fuse cell circuit which stores redundancy information or the like may be used or memory cells provided in the memory cell array can be sued. The nonvolatile memory cell may be a semiconductor element in which data can be electrically rewritten or a fuse element in which data can be mechanically programmed.

Further, the setting contents of the threshold voltage, for example, the setting contents of the word line voltage can be made by reading out the setting contents before the write operation, read operation or erase operation and variably changing the word line voltage at the time of write verify readout, the word line voltage at the time of erase verify readout or the word line voltage at the read time according to the result of readout.

Next, one example of the basic operation sequence according to the present example is explained.

Figure 28:
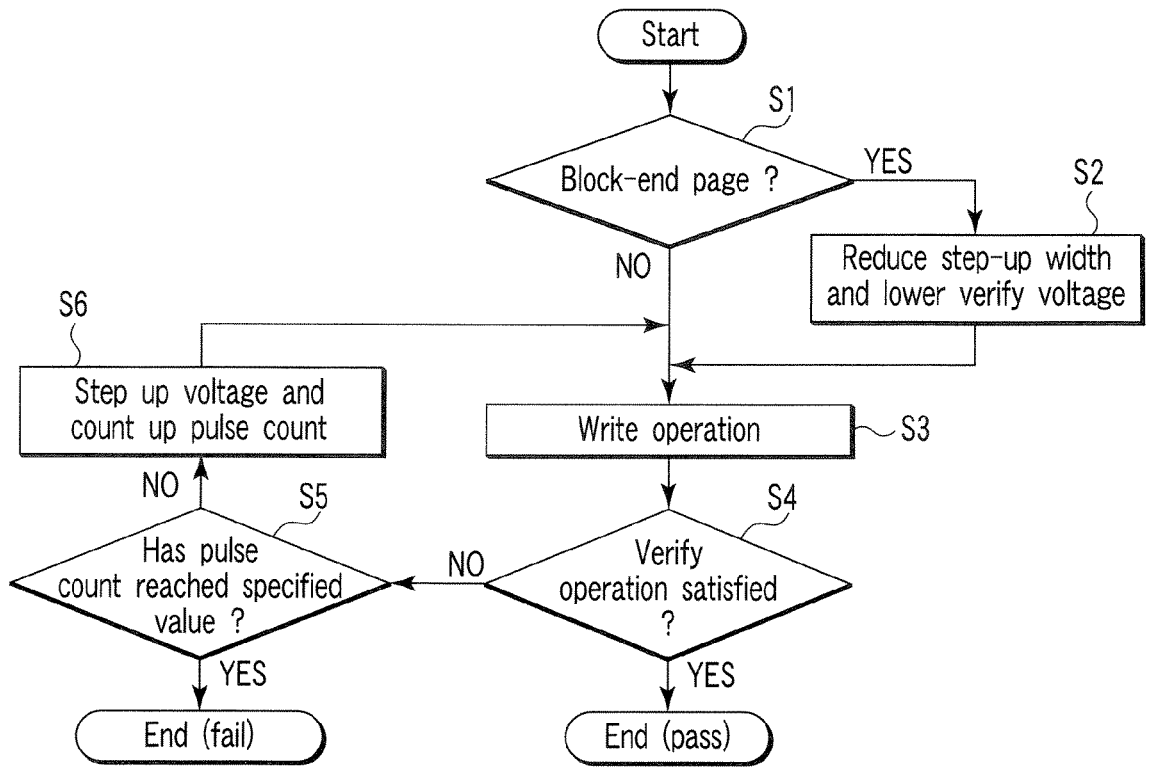
FIG. 28 is a flow chart showing one example of a write sequence of the semiconductor integrated circuit device according to the first embodiment.

FIG. 28 is a flow chart showing one example of the write sequence according to the present example.

The write sequence shown in FIG. 28 is a basic sequence and shows only the minimum steps. When the write sequence is applied to an actual device, adequate required steps may be added to the basic sequence. For example, the concrete write sequence is shown in FIGS. 12 and 13 and the basic sequence shown in FIG. 28 may be combined with the above write sequence.

As shown in FIG. 28, whether the selected page is a block-end page or not is determined (S1). When it is the block-end page, the step-up width is reduced and the verify voltage is lowered (S2). After this, data is written into the selected page (S3). If it is not the block-end page, data is written into the selected page without changing the step-up width and verify voltage (S3).

When the write operation is terminated, whether the threshold voltage has reached a desired level or not is verified (S4). When it has reached the desired level, the write status is set to "pass" and the write sequence is terminated. If it does not reach the desired level, whether a write pulse count has reached a specified value or not is determined (S5). If it has reached the specified value, the write status is set to "fail" and the write sequence is terminated. If it does not reach the specified value, the write pulse count is counted up and the word line voltage is stepped up (S6). After this, the steps of S3 to S6 are repeatedly performed until the write sequence is ended.

Figure 29:
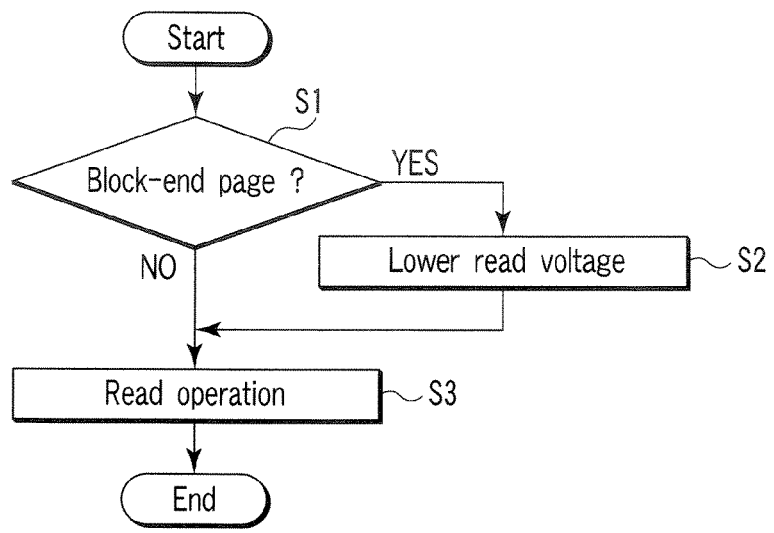
FIG. 29 is a flow chart showing one example of a read sequence of the semiconductor integrated circuit device according to the first embodiment.

FIG. 29 is a flow chart showing one example of a read sequence according to the present example.

Like the write sequence shown in FIG. 28, the read sequence shown in FIG. 29 is a basic sequence. Therefore, only the minimum necessary steps are shown. When it is used in the actual device, adequate necessary steps are added to the basic sequence.

As shown in FIG. 29, whether the selected page is a block-end page or not is determined (S1). If it is the block-end page, the read voltage is lowered (S2). Then, data is read out from the selected page (S3). If it is not the block-end page, data is read out from the selected page without changing the read voltage (S3).

Next, a modification of the present embodiment is explained.

(Modification Relating to Setting of Threshold Voltage)

FIG. 30 is a diagram showing a page in which setting of the threshold voltage of the semiconductor integrated circuit device according to the first embodiment is changed.

As shown in FIG. 30, in the first embodiment, a page 51 (which is hereinafter referred to as a setting-change page) in which setting of threshold voltage is changed is set as a page nearest to the selection transistor. In this example, the page corresponds to the word lines WL0, WL31. However, the page in which setting of the threshold voltage is changed is not limited to the page nearest to the selection transistor.

(First Modification)

Figure 31:
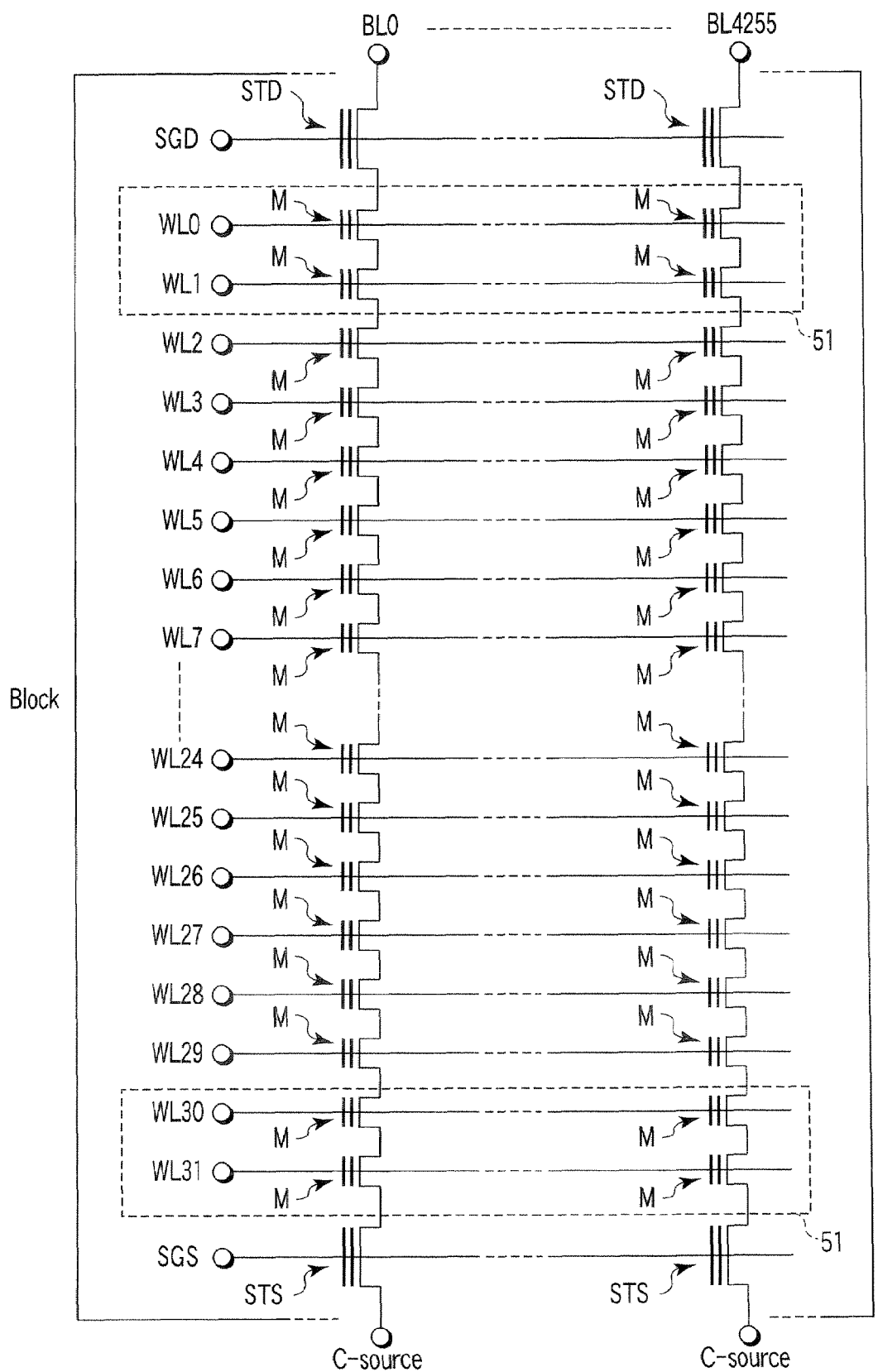
FIG. 31 is a diagram showing a first modification of the page in which setting of the threshold voltage is changed.

FIG. 31 is a diagram showing a first modification of the page in which setting of the threshold voltage is changed.

As shown in FIG. 31, the setting-change page 51 may be set not only as the page nearest to the selection transistor STD or STS, but also as some pages counted from the nearest page. For example, setting of the threshold voltage may be changed for a plurality of pages including the nearest pages. In this example, the setting-change page 51 contains two word lines WL0, WL1 or WL30, WL31, for example.

(Second Modification)

Figure 32:
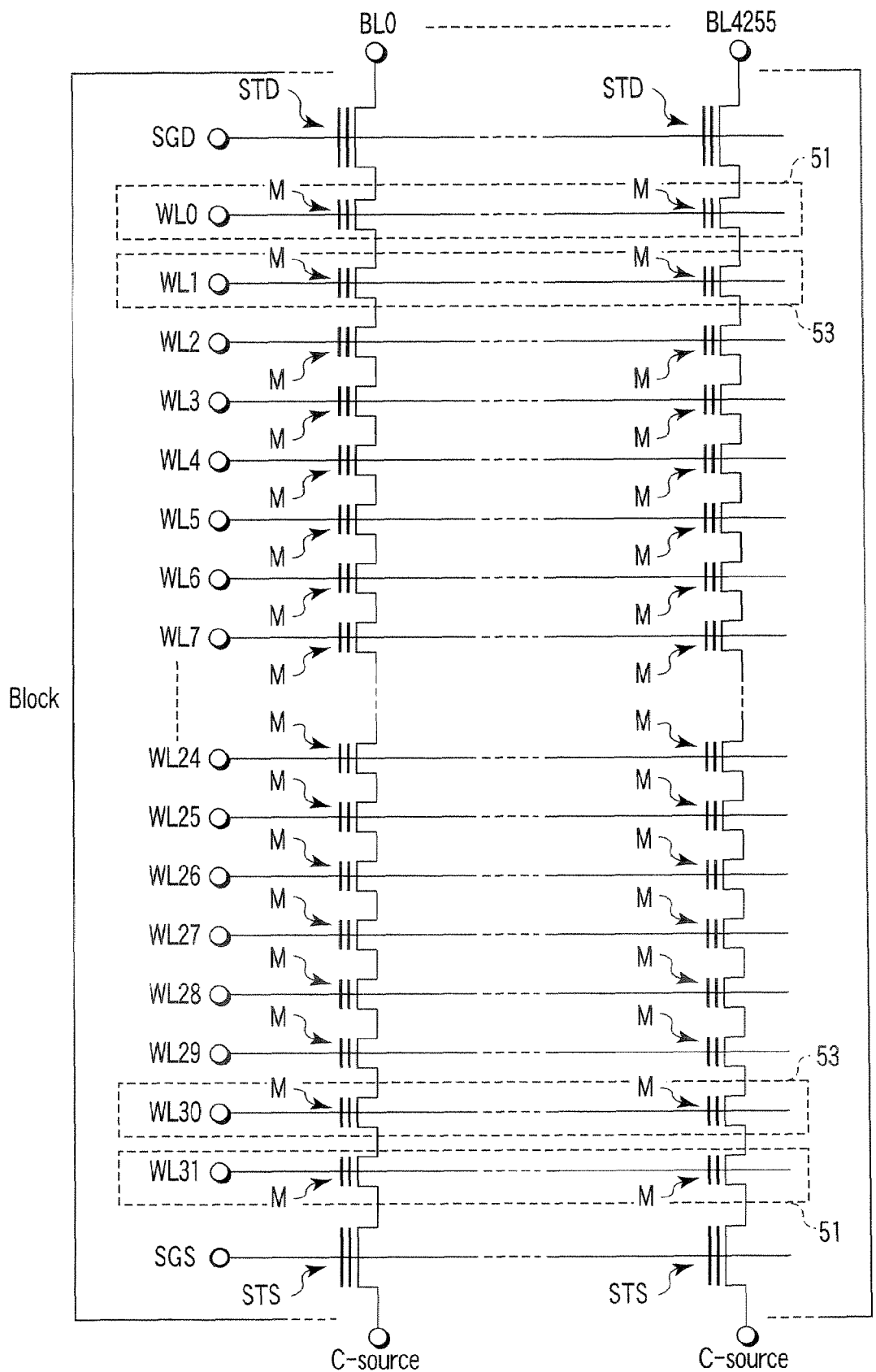
FIG. 32 is a diagram showing a second modification of the page in which setting of the threshold voltage is changed.

FIG. 32 is a diagram showing a second modification of the pages in which setting of the threshold voltage is changed.

As is explained with reference to FIGS. 30, 31 for setting of the threshold voltage, setting of the threshold voltage to be changed is not limited to one type. A plurality of settings of the threshold voltage to be changed may be provided.

As shown in FIG. 32, in the second modification, a first setting-change page 51 and second setting-change page 53 are provided. Setting of the threshold voltage is different for the first setting-change page 51 and second setting-change page 53. If it is supposed that the distribution width (Vthmin–Vthmax) of the threshold voltage is used for setting of the threshold voltage as one example, the threshold voltage distribution width of the first setting-change page 51 (WL0 and WL31) is the narrowest. The threshold voltage distribution width of the second setting-change page 53 (WL0 and WL30) is larger than that of the first setting-change page 51. The threshold voltage distribution width of the remaining pages (WL2 to WL29) is larger than the threshold voltage distribution width of the second setting-change page 53.

In the second modification, two types of pages in which setting of the threshold voltage is changed are provided and three types of settings of the threshold voltage by taking the pages in which setting is not changed into consideration are provided in total. Of course, three or more types of pages in which setting of the threshold voltage is changed can be provided and four or more types of settings of the threshold voltage by taking the pages in which setting is not changed into consideration can be provided in total.

Further, in the second modification, the distribution width (Vthmin–Vthmax) of the threshold voltage is used for setting of the threshold voltage. However, in order to change the distribution width of the threshold voltage, a method for mutually changing word line step-up voltages for the setting-change page 51 and setting-change page 53 at the write time may be utilized. Further, a method for changing the bit line voltage used for the second-step write operation, a method for changing the verify voltage or a combination thereof can be used.

Further, at the read time, the read voltage may be changed for the first setting-change page 51 and second setting-change page 53.

(Third Modification)

Figure 33:
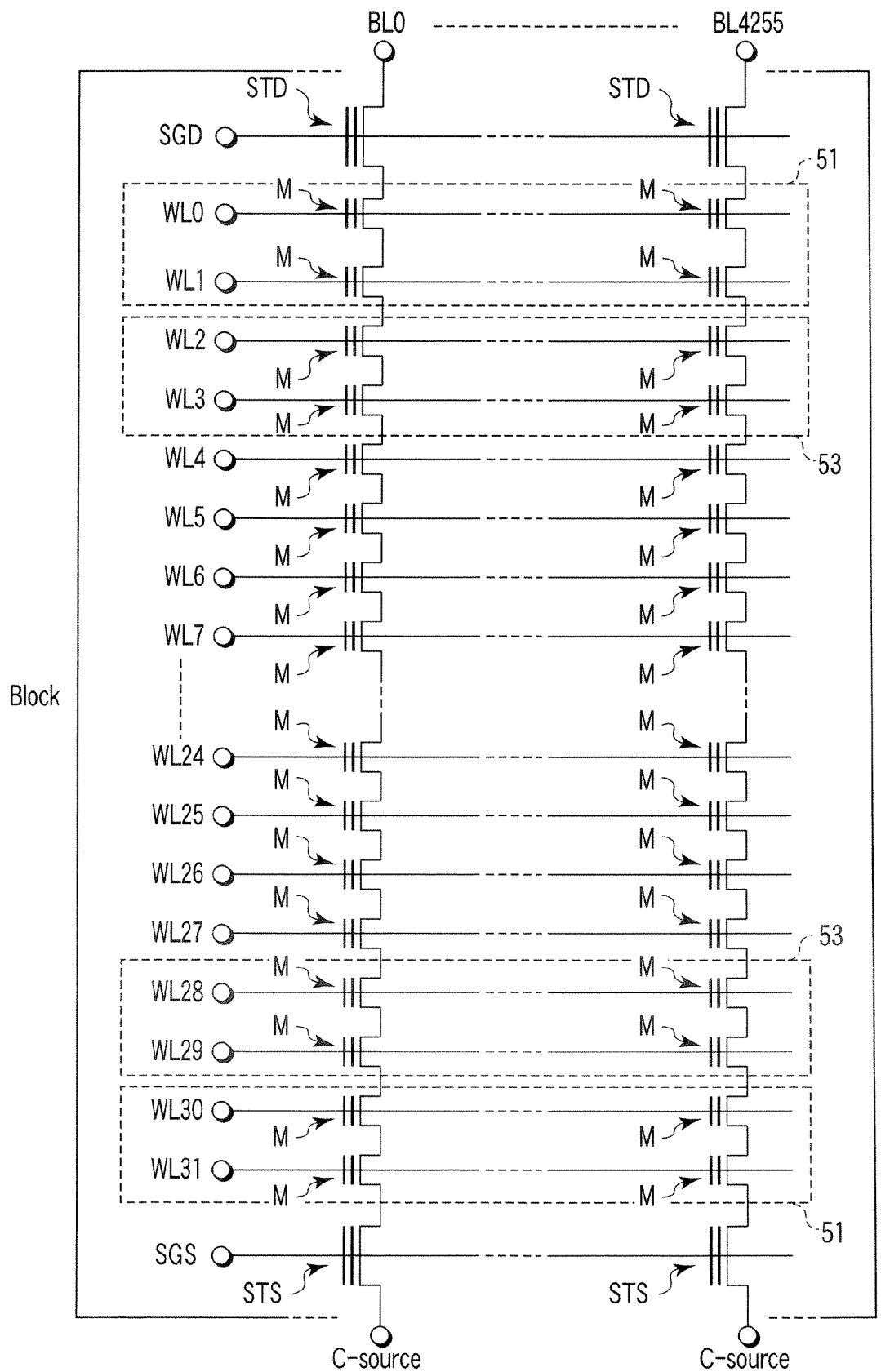
FIG. 33 is a diagram showing a third modification of the page in which setting of the threshold voltage is changed.

FIG. 33 is a diagram showing a third modification of the page in which setting of the threshold voltage is changed.

As shown in FIG. 33, the setting-change pages 51 and 53 in the second modification may contain a plurality of pages, as in the first modification. In this example, the setting-change page 51 contains two word lines WL0, WL1 or WL30, WL31 and the setting-change page 53 contains two word lines WL2, WL3 or WL28, WL29.

(Fourth Modification)

In the first embodiment, setting of the threshold voltage is changed in the unit in which the page of the block or the word line is changed. However, the unit in which setting of the threshold voltage is changed is not limited to the above case.

FIG. 34 is a plan view of a memory cell array and FIG. 35 is a diagram showing the relation between the block position in the memory cell array and the gate length.

As shown in FIG. 34, the memory cell array includes a plurality of blocks. Further, as shown in FIG. 35, the gate length is changed according to the position of the block in the memory cell array. For example, the gate length tends to become smaller in the block which is set closer to the cell array end. This phenomenon also relates to lithography and, for example, the block at the cell array end is influenced by a pattern outside the cell array. Outside the cell array, a word line pattern or block selection line pattern is not provided. Therefore, the continuity of the pattern cannot be maintained. This influences the block at the cell array end.

Therefore, setting of the threshold voltage may be changed depending on whether a selected address indicates a block at the cell array end or another block. The method of application thereof may be the same as in the above embodiment and modifications.

(Fifth Modification)

FIG. 36 is a plan view of a semiconductor integrated circuit chip and FIG. 37 is a diagram showing the relation between the memory cell array position in the chip and the gate length.

When the semiconductor chip contains a plurality of memory cell arrays as shown in FIG. 36, the gate length varies according to the position of the memory cell array in the chip as shown in FIG. 37. For example, the gate length tends to become smaller in the memory cell array which is disposed closer to the chip end. Also, this phenomenon relates to lithography as in the above embodiment and fourth modification.

Therefore, setting of the threshold voltage may be changed according to whether a selected address indicates a chip end block or another block. The method of application thereof may be the same as in the above embodiment and modifications.

Second Embodiment

In the first embodiment, for example, the example in which the memory cells M having different gate lengths L are provided in the block and, for example, as shown in FIG. 24, the NAND flash memory in which the relation of L0act≠L1act≠L2act . . . is set for the actual gate length Lnact is shown.

However, this invention can be applied to a NAND flash memory in which the relation of L0act=L1act=L2act . . . is set for the actual gate length Lnact.

FIG. 38 is an equivalent circuit diagram showing one example of the actual equivalent circuit of a NAND memory unit according to a second embodiment of this invention.

As shown in FIG. 38, in this example, the gate length Lnact is set to L0act=L1act=L2act Further, the relation between the cell-cell pitch Pc and the selection transistor-cell pitch Pscd or Pscs is set to Pc≠Pscd and Pc≠Pscs. Specifically, in this example, the relation of Pc<Pscd and Pc<Pscs is set.

In a device in which the relation of Pc<Pscd and Pc<Pscs is set, the cell-cell parasitic capacitance Cc is different from the selection transistor-cell parasitic capacitance Cscd or Cscs. The cell-cell parasitic capacitor Cc is a capacitor parasitic on the floating gate FG along the column direction. Likewise, the selection transistor-cell parasitic capacitors Cscd and Cscs are capacitors parasitic on the floating gate FG along the column direction.

That is, the parasitic capacitors parasitic on and around the floating gate FG are different in the block-end page and in the block-intermediate page. The difference between the parasitic capacitances indicates that the data holding characteristic of the block-end page is different from the data holding characteristic of the block-intermediate page.

Therefore, in a device in which the actual gate length Lnact is set to L0act=L1act=L2act . . . , as explained in the first embodiment, for example, setting of the threshold voltage in the block-end page and setting of the threshold voltage in the block-intermediate page may be changed.

Third Embodiment

In the second embodiment, the memory in which the gate length Lnact is set to L0act=L1act=L2act . . . and the pitch P is set to the relation of Pc≠Pscd and Pc≠Pscs is used. However, the pitch P can be set to the relation of Pc=Pscd and Pc=Pscs.

Figure 39:
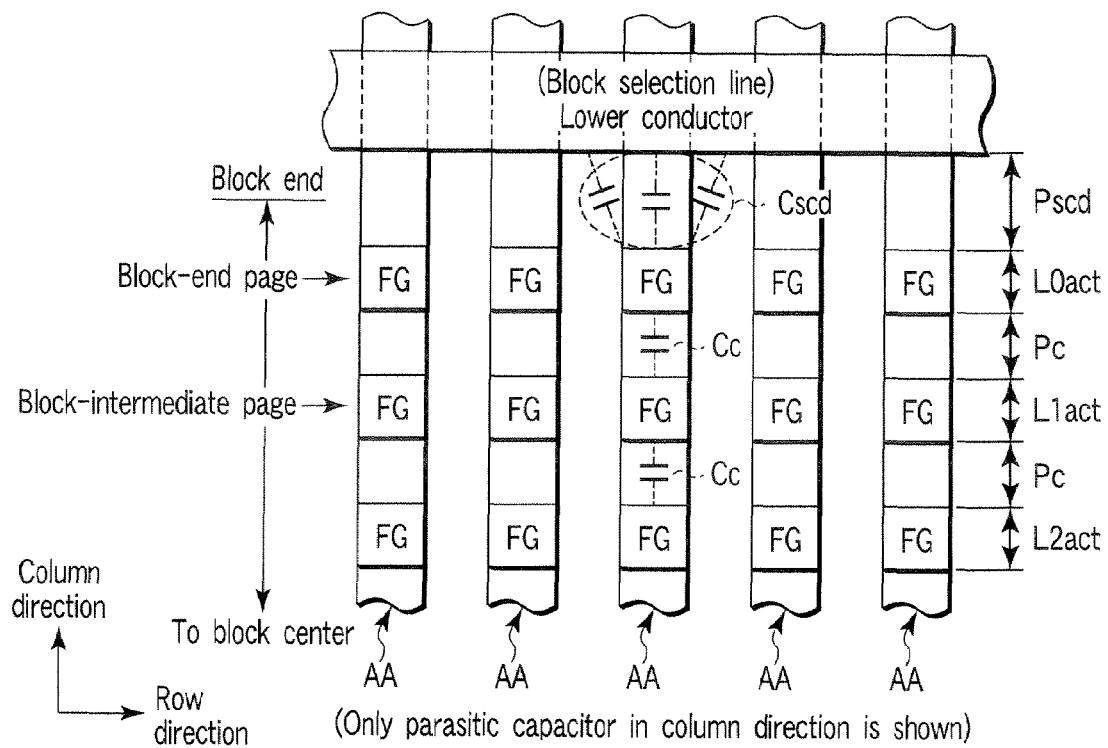
FIG. 39 is a plan view showing one example of a floating gate pattern and lower conductor (block selection line) pattern of the NAND memory unit according to the second embodiment.
Figure 40:
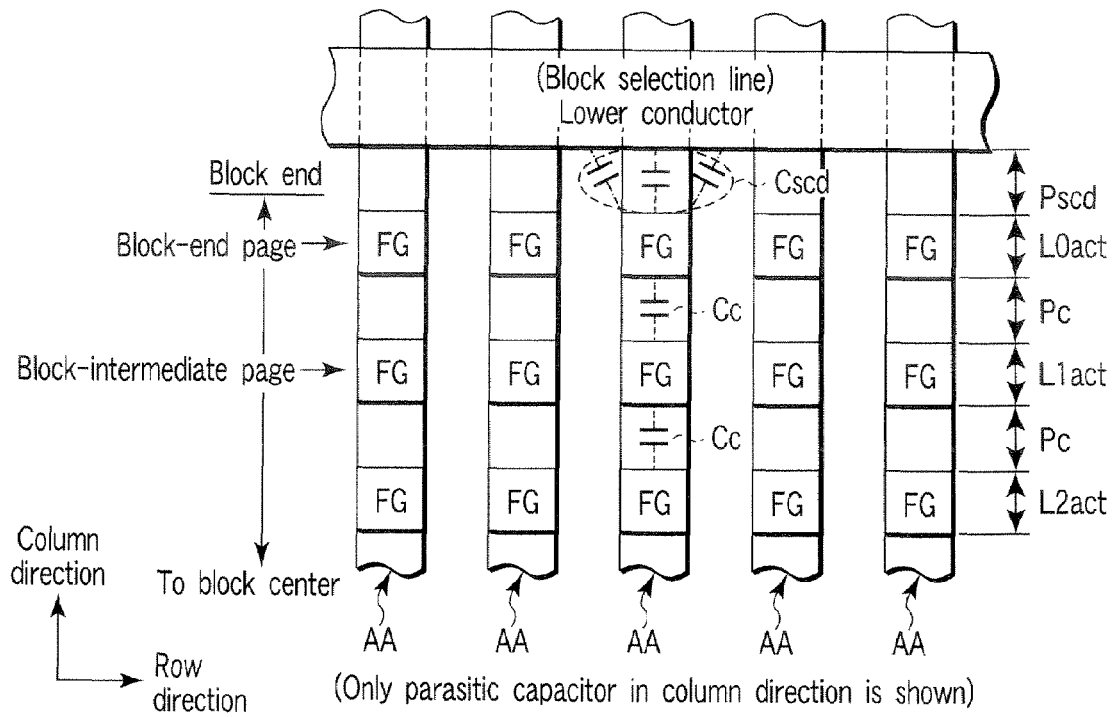
FIG. 40 is a plan view showing one example of a floating gate pattern and lower conductor (block selection line) pattern of the NAND memory unit according to the second embodiment.

FIGS. 39 and 40 are plan views showing one example of a floating gate pattern and lower conductor (block selection line) pattern. FIG. 39 shows the memory according to the second embodiment and FIG. 40 shows a memory according to a third embodiment.

As shown in FIGS. 39 and 40, a plurality of floating gates FG are arranged on the memory cell array in an island form. Further, the lower conductor of the block selection line is linearly arranged on the memory cell array.

Two parasitic capacitors Cc are parasitic on the floating gate FG of the block-intermediate page in the column direction and parasitic capacitors Cscd or Cscs and Cc are parasitic on the floating gate FG of the block-end page. The parasitic capacitance Cscd or Cscs is different from the capacitance Cc. This is because the area of the capacitor is different from that of the floating gate formed in an island form since the lower conductor of the block selection line is formed in a linear form. Even in the case of Pc=Pscd and Pc=Pscs, the relation of Cc≠Cscd and Cc≠Cscs is attained like the case of the second embodiment because the areas of the capacitors are different.

Therefore, in a device in which the actual gate length Lnact is set to L0act=L1act=L2act . . . and the relation of Pc=Pscd and Pc=Pscs is set, as explained in the first embodiment, for example, setting of the threshold voltage in the block-end page and setting of the threshold voltage in the block-intermediate page may be changed.

Next, one example of the manufacturing method of the device of the second and third embodiments in which the actual gate length Lnact is set to L0act=L1act=L2act . . . is explained.

Figure 41:
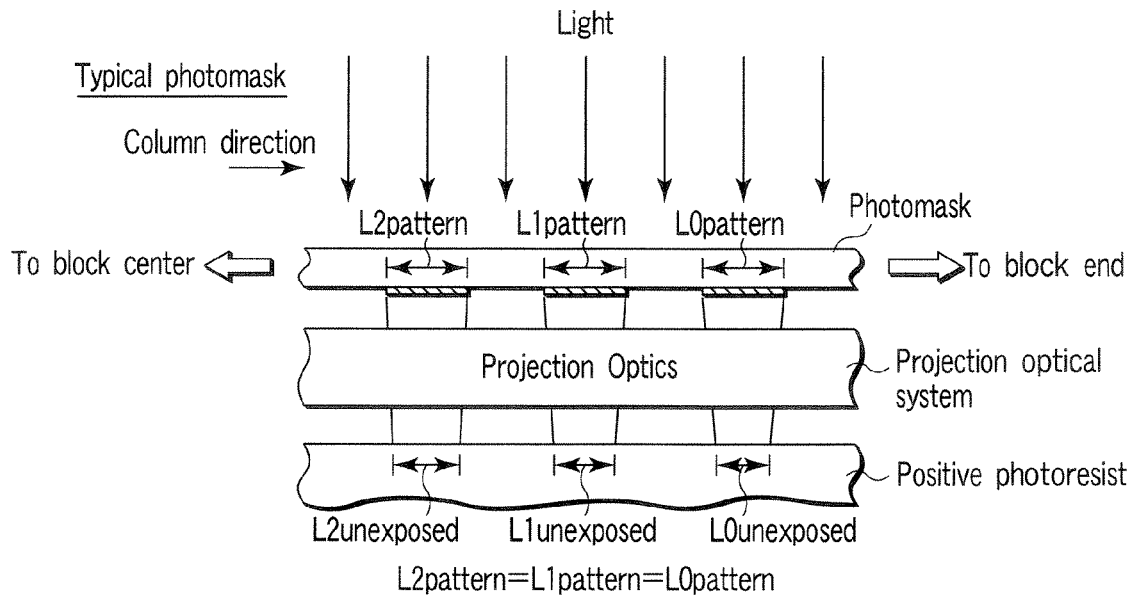
FIG. 41 is a view showing a typical photomask and exposure state.
Figure 42:
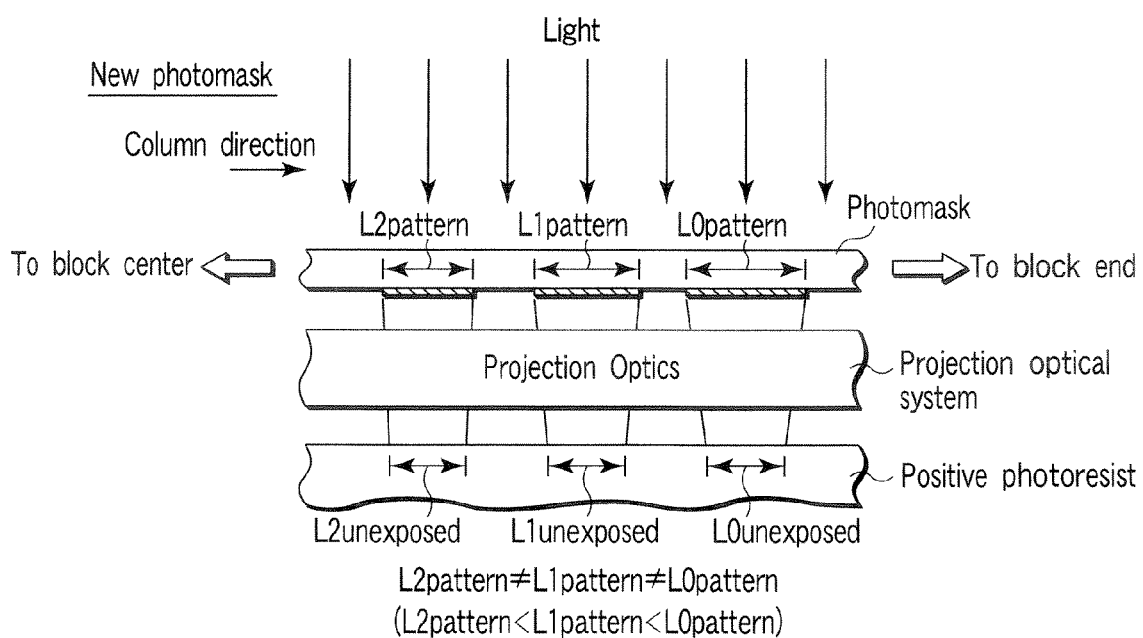
FIG. 42 is a view showing one example of a new photomask and exposure state used in the second or third embodiment.

FIG. 41 is a view showing a typical photomask and exposure state and FIG. 42 is a view showing one example of a new photomask and exposure state used in the second or third embodiment.

As shown in FIG. 41, in the typical photomask, the width (the width in the column direction) Lnpattern (L0pattern, L1pattern, L2pattern, . . . ) of a light shielding pattern corresponding to the word line pattern is kept constant from one block end towards the block-intermediate portion, that is, the other block end. As a result, as shown in the drawing, the width (a portion remaining as the word line pattern) Lnunexposed (L0unexposed, L1unexposed, L2unexposed, . . . ) of an unexposed portion of the positive photoresist may be different in the block-end portion and in the block-intermediate portion in some cases. This is one of the reasons why the actual gate length Lnact is set to the relation of L0act≠L1act≠L2act . . . .

On the other hand, in a new photomask shown in FIG. 42, for example, the widths L0mask, L1mask, L2mask, . . . of the light shielding pattern are set to the relation of L0pattern≠L1pattern≠L2pattern, so that the widths L0unexposed, L1unexposed, L2unexposed, . . . of the unexposed portions may be kept constant from one block end to the other block end. Specifically, the relation of L0pattern>L1pattern>L2pattern is set in this example.

By using the new photomask, a device in which the actual gate length Lnact is set to L0act=L1act=L2act . . . can be formed.

Fourth Embodiment

Next, a setting example of the threshold voltage is explained as a fourth embodiment of this invention.

Setting Example 1

The setting example 1 is as shown in FIG. 25. The relation between data, verify voltage, read voltage and margin is shown in table 9.

TABLE 9

| Data | 10 | 01 | 00 |
|---|---|---|---|
| Verify voltage | a' < a | b' < b | c' < c |
| Read voltage | Vread | Vread1' < Vread1 | Vread2' < Vread2 |
| Margin (\|verify voltage-read voltage\|) | Δa' < Δa | Δb' < Δb | Δc' < Δc |

Setting Example 1

Setting Example 2

FIG. 43 is a diagram showing a setting example 2 of the threshold voltage.

The relation between data, verify voltage, read voltage and margin is shown in table 10.

TABLE 10

| Data | 10 | 01 | 00 |
|---|---|---|---|
| Verify voltage | a' = a | b' < b | c' < c |
| Read voltage | Vread | Vread1' < Vread1 | Vread2' < Vread2 |
| Margin (\|verify voltage-read voltage\|) | Δa' = Δa | Δb' = Δb | Δc' = Δc |

Setting Example 2

As shown in the table 9, in the setting example 1, the margin (|verify voltage-read voltage|) is set to "Δa'<Δa", "Δb'<Δb" and "Δc'<Δc".

On the other hand, as shown in FIG. 43 and table 10, in the setting example 2, the margin is set to "Δa'=Δa", "Δb'=Δb" and "Δc'=Δc". As one example of a method for setting the above relation, for example, the verify voltages "a'" and "a" for data "10" is set to "a'=a". Further, the verify voltages b' and c' are set to set the relation of "Δb'=Δb" and "Δc'=Δc".

In the setting example 2, an advantage that the margin relating to setting of the threshold voltage in the block-end page can be enlarged in comparison with the case of the setting example 1 can be attained.

Setting Example 3

Figure 44:
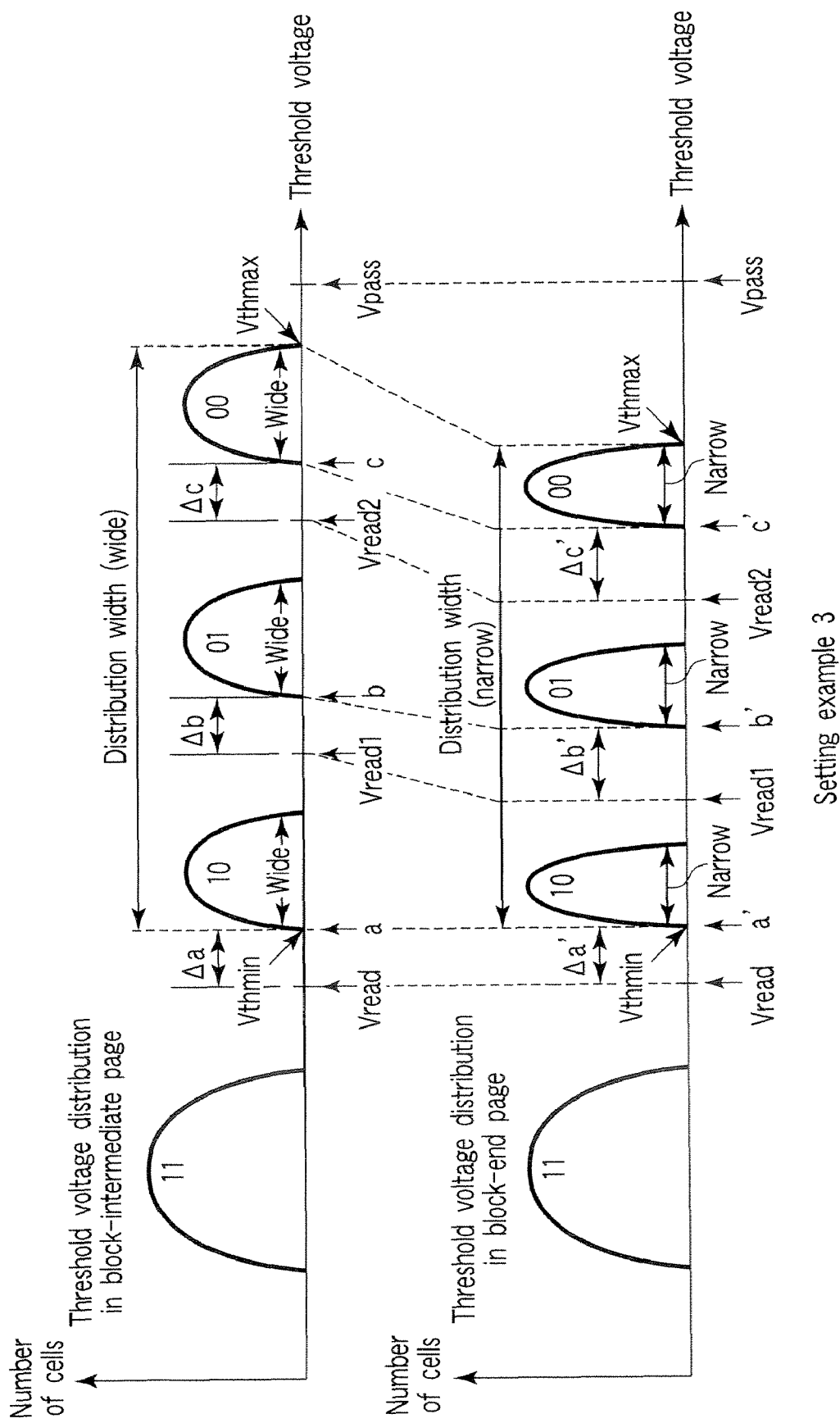
FIG. 44 is a diagram showing a setting example 3 of threshold voltage.

FIG. 44 is a diagram showing a setting example 3 of the threshold voltage. The relation between data, verify voltage, read voltage and margin is shown in table 11.

TABLE 11

| Data | 10 | 01 | 00 |
|---|---|---|---|
| Verify voltage | a' = a | b' < b | c' < c |
| Read voltage | Vread | Vread1' < Vread1 | Vread2' < Vread2 |
| Margin (\|verify voltage-read voltage\|) | Δa' = Δa | Δb' > Δb | Δc' > Δc |

Setting Example 3

As shown in table 10, in the setting example 2, the margin is set to "Δa'=Δa", "Δb'=Δb" and "Δc'=Δc".

On the other hand, as shown in FIG. 44 and table 11, in the setting example 3, the margin is set to "Δa'=Δa", "Δb'>Δb" and "Δc'>Δc". As one example of a method for setting the above relation, for example, the verify voltages "a'" and "a" for data "10" is set to "a'=a". Further, the verify voltages b' and c' may be set to set the relation of "Δb'>Δb" and "Δc'>Δc".

According to the setting example 3, an advantage that the margin relating to setting of the threshold voltage in the block-end page, particularly, the margin for data having the high threshold voltage can be made large in comparison with the case of the setting example 2 can be attained.

Further, an advantage that the margin in the block-end page can be made larger than the margin in the block-intermediate page can be attained.

Setting Example 4

Figure 45:
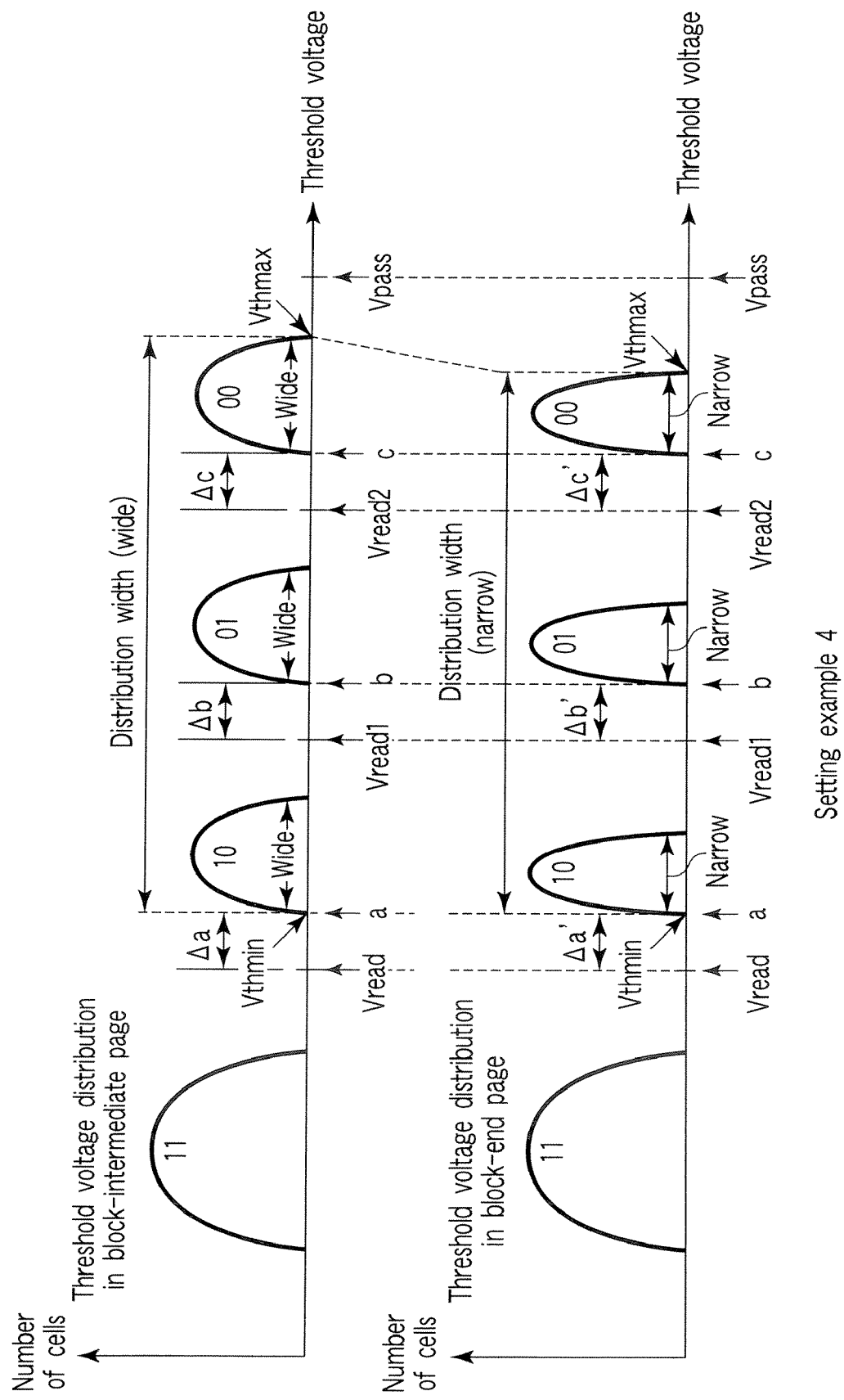
FIG. 45 is a diagram showing a setting example 4 of threshold voltage.

FIG. 45 is a diagram showing a setting example 4 of the threshold voltage. The relation between data, verify voltage, read voltage and margin is shown in table 12.

TABLE 12

| Data | 10 | 01 | 00 |
|---|---|---|---|
| Verify voltage | a' = a | b' = b | c' = c |
| Read voltage | Vread | Vread1' = Vread1 | Vread2' = Vread2 |
| Margin (\|verify voltage-read voltage\|) | Δa' = Δa | Δb' = Δb | Δc' = Δc |

Setting Example 4

In the setting examples 1 to 3, setting of the threshold voltage distribution is changed by changing the verify voltage in the block-end page and in the block-intermediate page.

However, as shown in FIG. 45 and table 12, setting of the threshold voltage distribution can be changed without changing the verify voltage. In this case, for example, a method for changing the word line step-up voltage in the block-end page and block-intermediate page, a method for changing the bit line voltage used for the second-step write operation or a combination of the above methods may be used.

Further, in the setting examples 1 to 3, the example in which the read voltage is changed at the read time is shown, but as shown in FIG. 45 and table 12, the read voltage may be kept unchanged.

Setting Example 5

Figure 46:
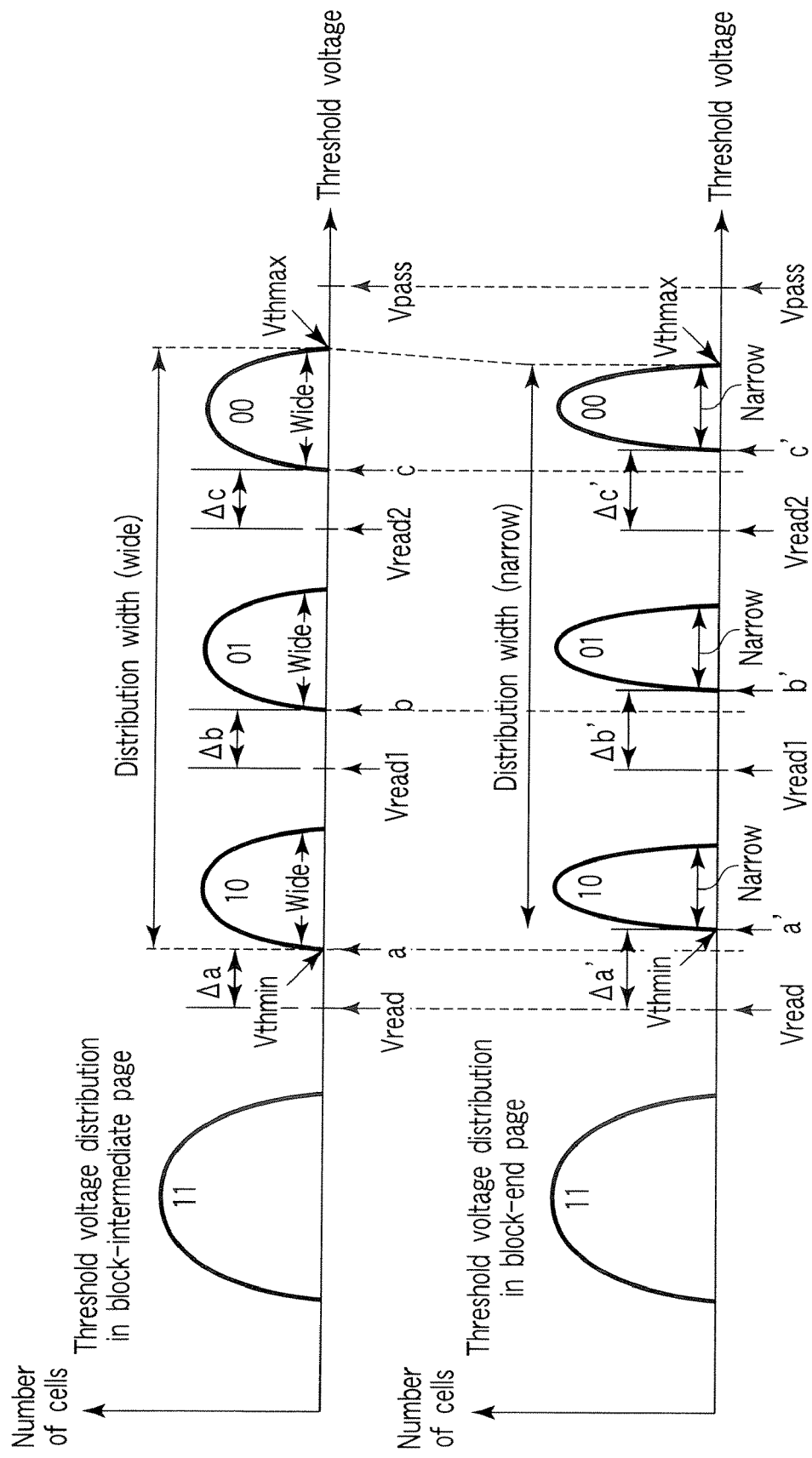
FIG. 46 is a diagram showing a setting example 5 of threshold voltage.

FIG. 46 is a diagram showing a setting example 5 of the threshold voltage. The relation between data, verify voltage, read voltage and margin is shown in table 13.

TABLE 13

| | Data | | |
|---|---|---|---|
| | 10 | 01 | 00 |
| Verify voltage | a' > a | b' > b | c' > c |
| Read voltage | Vread | Vread1' = Vread1 | Vread2' = Vread2 |
| Margin (\|verify voltage-read voltage\|) | Δa' > Δa | Δb' > Δb | Δc' > Δc |

Setting Example 5

In the setting example 4, as shown in FIG. 45 and table 12, the margin is set to the relation of "Δa'=Δa", "Δb'=Δb" and "Δc'=Δc".

On the other hand, in the setting example 5, the margin is set to "Δa'>Δa", "Δb'>Δb" and "Δc'>Δc". In this case, for example, like the setting example 4, a method for changing the word line step-up voltage in the block-end page and block-intermediate page, a method for changing the bit line voltage used for the second-step write operation or a combination of the above methods is used. Further, the verify voltage may be set to the relation of "a'>a", "b'>b" and "c'>c" so that the margin may be set to the relation of "Δa'=Δa", "Δb'=Δb" and "Δc'=Δc".

According to the setting example 5, an advantage that the margin relating to setting of the threshold voltage in the block-end page, particularly, the margin for data having the high threshold voltage can be made large in comparison with the case of the setting example 4 can be attained.

Fifth Embodiment

A fifth embodiment of this invention relates to the technique for enhancing the integration density of a memory cell array.

In a typical NAND flash memory, the gate length Ld of a selection transistor STD is the same as the gate length Ls of a selection transistor STS.

The drain of the selection transistor STD is connected to a bit line. Therefore, it is necessary for the selection transistor STD to be sufficiently cut off in order to suppress leakage of a current from the bit line at the data write time or read time, for example. Further, the gate length Ld is set to such length as to sufficiently cut off the transistor. This has been explained with reference to FIG. 20.

The source of the selection transistor STS is connected to a source line C-source. The source line C-source is not applied with such high potential as that of the bit line BL. It is only required to sufficiently cut off the selection transistor STD at the data write time or read time. That is, the gate length Ls of the selection transistor STS can be made shorter than the gate length Ld.

Figure 47:
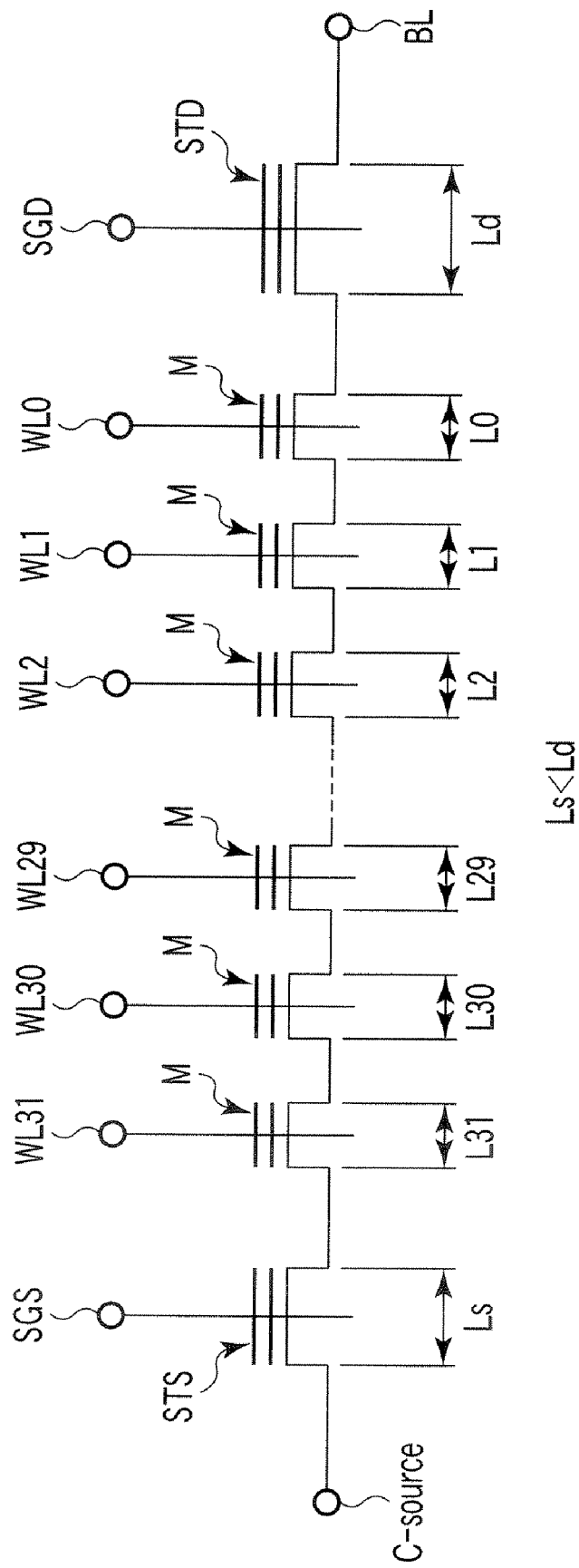
FIG. 47 is a block diagram showing one example of a semiconductor integrated circuit device according to a fifth embodiment of this invention.

FIG. 47 is a circuit diagram showing one example of a semiconductor integrated circuit device according to a fifth embodiment of this invention. In this example, a NAND flash memory is shown as an example, but the fifth embodiment can also be applied to a memory other than the NAND flash memory.

As shown in FIG. 47, in the NAND flash memory according to the fifth embodiment, the gate length Ls of the drain-side selection transistor STD is shorter than the gate length Ld of the source-side selection transistor STS. Therefore, the integration density of the memory cell array can be enhanced in comparison with the memory having the relation of Ls=Ld.

Figure 48:
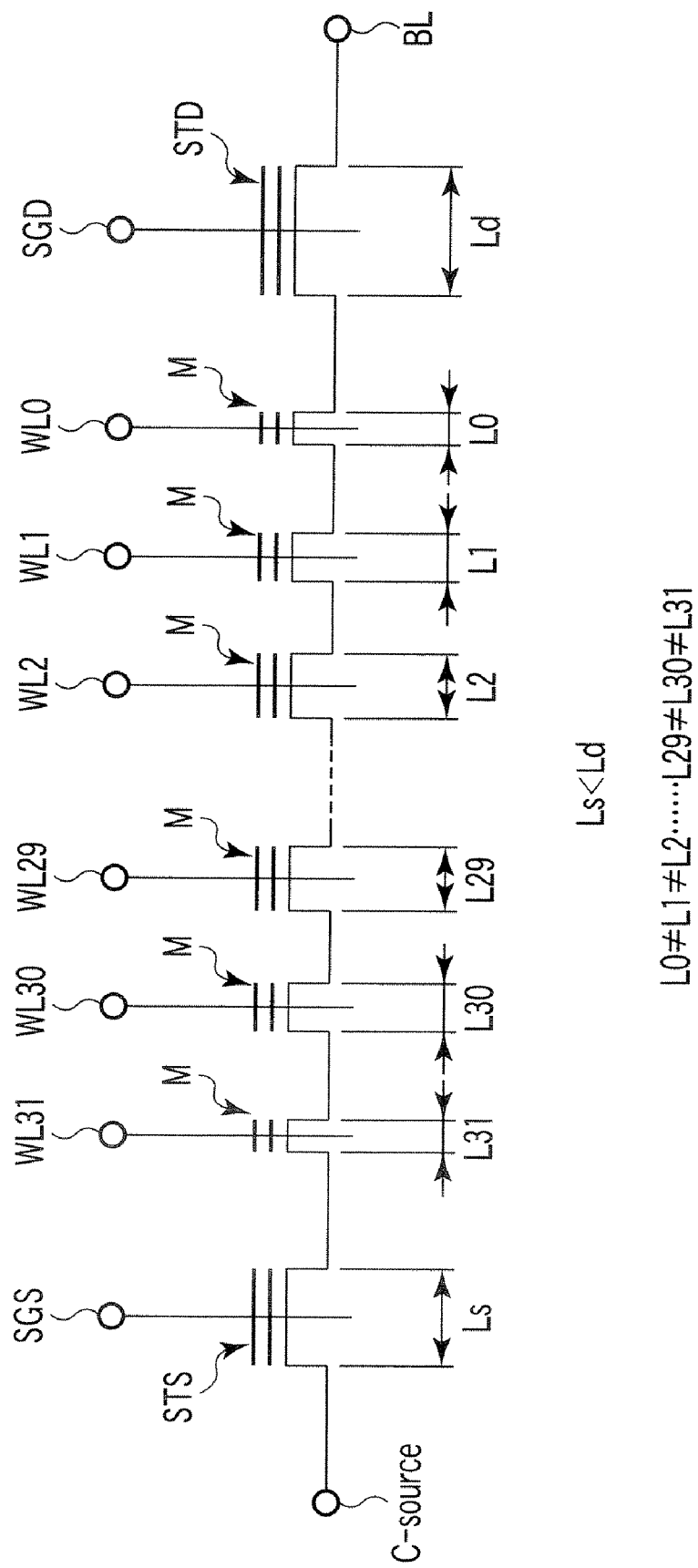
FIG. 48 is a block diagram showing one example of a semiconductor integrated circuit device according to a modification of the fifth embodiment.

Further, as shown in FIG. 48, the fifth embodiment can also be applied to a device in which the gate length Ln of the memory cell M is set to the relation of L0≠L1≠L2 . . . L29≠L30≠L31, for example.

Further, the fifth embodiment can be performed in combination with the first to fourth embodiments.

In the first to fifth embodiments, the threshold voltage is set to an optimum value in the cell array, block or page unit. This is an operation mode (which is called a highly reliable operation mode) which has the high reliability and is excellent in the data holding characteristic. In the first to fifth embodiments, it is possible to select the highly reliable operation mode. When the highly reliable operation mode is not selected, for example, the threshold voltage is set constant irrespective of the block-end page and block-intermediate page, the cell array-end block and cell array-center block, or the chip-end memory cell array and chip-center memory cell array like the typical NAND flash memory, for example. Setting of all of the threshold voltages is set to the same setting of the threshold voltages of the block-center page, cell array-center block and chip-center memory cell array, for example. This is an operation mode (high-speed operation mode) in which the high-speed operation is performed. If a mode switching circuit which switches the highly reliable operation mode and high-speed operation mode is provided in the chip, one of the modes can be selectively set and used. The mode switching can be made according to a switching command input from the exterior of the chip. In addition to this, mode switching information can be stored in a memory in the system. Further, mode switching information can be stored in a memory in the chip, for example, in a nonvolatile memory such as an electrically data rewritable semiconductor element or mechanically data programmable fuse element. Further, the mode switching can be made according to the potential applied to a chip pad connected to the mode switching circuit. For example, the mode can be switched by connecting the chip pad to power supply potential Vdd or ground potential Vcc. Thus, the threshold voltage in the block-end page, cell array-end block and chip-end memory cell array can be variably set. Of course, the mode is not limited to the two stages of the highly reliable operation mode and high-speed operation mode and it can be set to three or more stages.

Further, the above embodiments contain the following items.

(1) A semiconductor integrated circuit device includes a semiconductor chip, a first memory cell group containing a plurality of rewritable nonvolatile memory cells arranged on the chip, and a second memory cell group containing a plurality of rewritable nonvolatile memory cells arranged on the chip, wherein setting of write threshold voltages of the memory cells of the first memory cell group and setting of write threshold voltages of the memory cells of the first memory cell group are made variable.

(2) In the device described in item (1), the write threshold voltage is made variable by making variable the step-up voltage width of the word line at the write time.

(3) In the device described in one of items (1) or (2), the write threshold voltage is made variable by making variable the write suppression voltage applied to the bit line when it becomes closer to the set threshold voltage.

(4) In the device described in one of items (1) to (3), the write threshold voltage is made variable by making variable the word line voltage at the verify read time.

(5) In the device described in one of items (1) to (4), the word line voltage at the read time of the first memory cell group and the word line voltage at the read time of the second memory cell group are made variable.

(6) In the device described in one of items (1) to (5), the distribution width of the write threshold voltage of the first memory cell group is smaller than the distribution width of the write threshold voltage of the second memory cell group.

(7) In the device described in one of items (1) to (6), the maximum write threshold voltage of the first memory cell group is lower than the maximum write threshold voltage of the second memory cell group.

(8) In the device described in one of items (1) to (7), the first and second memory cell groups configure a page.

(9) In the device described in one of items (1) to (8), the first and second memory cell groups configure a block.

(10) In the device described in one of items (1) to (9), the first and second memory cell groups configure a memory cell array.

(11) In the device described in one of items (1) to (10), the first and second memory cell groups are divided in the unit of one word line or a plurality of word lines.

(12) In the device described in one of items (1) to (11), the gate length of the nonvolatile memory cell contained in the first memory cell group is different from the gate length of the nonvolatile memory cell contained in the second memory cell group.

(13) In the device described in one of items (1) to (11), the first memory cell group is arranged adjacent to the selection gate line and the gate length of the nonvolatile memory cell contained in the first memory cell group is different from the gate length of the nonvolatile memory cell contained in the second memory cell group.

(14) In the device described in one of items (1) to (11), the first memory cell group is arranged adjacent to the selection gate line and the gate length of the nonvolatile memory cell contained in the first memory cell group is the same as the gate length of the nonvolatile memory cell contained in the second memory cell group.

(15) In the device described in one of items (1) to (14), the setting contents of the threshold voltage are stored in the nonvolatile memory cell.

(16) In the device described in item (15), the setting contents of the threshold voltage are read out before the write operation, read operation or erase operation and the word line voltage at the write verify read time, the word line voltage at the erase verify read time or the word line voltage at the read time is made variable according to the readout result.

(17) In the device described in one of items (1) to (16), a mode switching circuit which switches two modes containing at least a highly reliable mode and a high-speed operation mode is provided.

(18) In the device described in item (17), the mode switching operation is attained by inputting a command, storing switching information into the memory in the system, storing switching information into the nonvolatile memory in the chip or applying potential to a pad connected to the mode switching circuit.

According to the semiconductor integrated circuit device according to the embodiments of this invention, a semiconductor integrated circuit device having an electrically rewritable nonvolatile semiconductor storage device in which the operation speed can be kept high and the data holding characteristic can be enhanced can be provided.

As described above, this invention has been explained by use of several embodiments, but this invention is not limited to the above embodiments and can be variously modified without departing from the technical scope thereof at the time of embodying the same.

For example, in the above embodiments, a case wherein the verify voltage is changed at the write verify read time is explained, but the verify voltage can be changed at the erase verify read time. In this case, setting of the threshold voltage can be changed.

Further, each embodiment can be independently performed, but they can be adequately combined and performed.

The above embodiments contain inventions at various stages and the inventions at various stages can be extracted by adequately combining a plurality of constituents disclosed in the above embodiments.

Further, the above embodiments are explained based on the example in which this invention is applied to a NAND flash memory, but this invention is not limited to a NAND flash memory and can be applied to a flash memory such as an AND or NOR flash memory other than a NAND flash memory. In addition, a semiconductor integrated circuit device containing the above flash memory, for example, a processor, system LSI or the like is contained in the scope of this invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising:
a semiconductor chip,
a first memory cell group containing a plurality of rewritable nonvolatile memory cells arranged on the chip, and
a second memory cell group containing a plurality of rewritable nonvolatile memory cells arranged on the chip,
wherein a verify voltage for verifying a lower side of a threshold voltage is made variable when a specific data is programmed into each of the memory cells.

2. The device according to claim 1, wherein the write threshold voltage is made variable by making a variable a step-up voltage width of a word line at write time.

3. The device according to claim 1, wherein the write threshold voltage is made variable by making a variable a write suppression voltage applied to a bit line.

4. The device according to claim 1, wherein the write threshold voltage is made variable by making a variable word line voltage at verify read time.

5. The device according to claim 1, wherein word line voltage at read time of the first memory cell group and word line voltage at read time of the second memory cell group are made variable.

6. The device according to claim 1, wherein a distribution width of the write threshold voltage of the first memory cell group is smaller than a distribution width of the write threshold voltage of the second memory cell group.

7. The device according to claim 1, wherein the maximum write threshold voltage of the first memory cell group is lower than the maximum write threshold voltage of the second memory cell group.

8. The device according to claim 1, wherein each of the first and second memory cell groups configure a page.

9. The device according to claim 1, wherein the first and second memory cell groups configure a block.

10. The device according to claim 1, wherein the first and second memory cell groups configure a memory cell array.

11. The device according to claim 1, wherein the first and second memory cell groups are each divided into the units which comprise one or a plurality of word lines.

12. The device according to claim 1, wherein gate length of the nonvolatile memory cell contained in the first memory cell group is different from gate length of the nonvolatile memory cell contained in the second memory cell group.

13. The device according to claim 1, wherein the first memory cell group is arranged adjacent to the selection gate line and gate length of the nonvolatile memory cell contained in the first memory cell group is different from gate length of the nonvolatile memory cell contained in the second memory cell group.

14. The device according to claim 1, wherein the first memory cell group is arranged adjacent to the selection gate line and gate length of the nonvolatile memory cell contained in the first memory cell group is the same as gate length of the nonvolatile memory cell contained in the second memory cell group.

15. The device according to claim 1, wherein setting value of the threshold voltage is stored in the nonvolatile memory cell.

16. The device according to claim 1, wherein setting value of the threshold voltage are read out before one of the write operation, read operation and erase operation and one of the word line voltage at write verify read time, the word line voltage at erase verify read time and the word line voltage at read time is made variable according to the readout result.

17. The device according to claim 1, wherein the plurality of rewritable nonvolatile memory cells are NAND nonvolatile memory cells.

18. A semiconductor integrated circuit device comprising:
a semiconductor chip,
a first memory cell group containing a plurality of rewritable nonvolatile memory cells arranged on the chip, and
a second memory cell group containing a plurality of rewritable nonvolatile memory cells arranged on the chip,
wherein setting of write threshold voltages of the memory cells of the first memory cell group and setting of write threshold voltages of the memory cells of the second memory cell group are made variable, and
wherein the write threshold voltage is made variable by making variable word line voltage at verify read time.

19. The device according to claim 18, wherein each of the first and second memory cell groups configures a page.

20. The device according to claim 19, wherein setting value of the threshold voltage are stored in the nonvolatile memory cell.

21. The device according to claim 18, wherein the first and second memory cell groups are each divided into the units which comprise one or a plurality of word lines.

22. The device according to claim 21, wherein setting value of the threshold voltage is stored in the nonvolatile memory cell.

23. A semiconductor integrated circuit device comprising:
a semiconductor chip,
a first memory cell group containing a plurality of rewritable nonvolatile memory cells arranged on the chip, and
a second memory cell group containing a plurality of rewritable nonvolatile memory cells arranged on the chip,
wherein setting of write threshold voltages of the memory cells of the first memory cell group and setting of write threshold voltages of the memory cells of the second memory cell group are made variable, and
wherein word line voltage at read time of the first memory cell group and word line voltage at read time of the second memory cell group are made variable.

24. The device according to claim 23, wherein each of the first and second memory cell groups configures a page.

25. The device according to claim 24, wherein setting value of the threshold voltage is stored in the nonvolatile memory cell.

26. The device according to claim 23, wherein the first and second memory cell groups are each divided into the units which comprise one or a plurality of word lines.

27. The device according to claim 26, wherein setting value of the threshold voltage is stored in the nonvolatile memory cell.

* * * * *